United States Patent
Pan et al.

(10) Patent No.: US 10,826,738 B2
(45) Date of Patent: Nov. 3, 2020

(54) SYSTEMS AND METHODS FOR MAXIMIZING POWER EFFICIENCY OF A DIGITAL POWER AMPLIFIER IN A POLAR TRANSMITTER

(71) Applicant: Innophase Inc., San Diego, CA (US)

(72) Inventors: Jun Pan, San Diego, CA (US); Yang Xu, San Diego, CA (US)

(73) Assignee: INNOPHASE INC., San Diego, CA (US)

( * ) Notice: Subject to any disclaimer, the term of this patent is extended or adjusted under 35 U.S.C. 154(b) by 6 days.

(21) Appl. No.: 16/241,842

(22) Filed: Jan. 7, 2019

(65) Prior Publication Data
US 2020/0220756 A1    Jul. 9, 2020

(51) Int. Cl.
| | |
|---|---|
| H04L 27/26 | (2006.01) |
| H04L 27/34 | (2006.01) |
| H04L 27/20 | (2006.01) |
| H03F 3/21 | (2006.01) |
| H03B 5/12 | (2006.01) |

(52) U.S. Cl.
CPC ....... *H04L 27/2614* (2013.01); *H03B 5/1206* (2013.01); *H03F 3/21* (2013.01); *H04L 27/2017* (2013.01); *H04L 27/3405* (2013.01)

(58) Field of Classification Search
CPC ............. H04L 27/2614; H04L 27/2017; H04L 27/3405; H03B 5/1206; H03F 3/21
USPC ......................................................... 375/260
See application file for complete search history.

(56) References Cited

U.S. PATENT DOCUMENTS

| | | |
|---|---|---|
| 3,813,610 A | 5/1974 | Kimura |
| 6,075,410 A | 6/2000 | Wildhagen |
| 6,466,630 B1 | 10/2002 | Jensen |
| 6,731,209 B2 | 5/2004 | Wadlow |
| 7,062,236 B2 | 6/2006 | Midtgaard |
| 7,123,665 B2 | 10/2006 | Brown |
| 7,123,666 B2 | 10/2006 | Brown |
| 7,127,020 B2 | 10/2006 | Brown |
| 7,356,091 B2 | 4/2008 | Liu |
| 7,672,648 B1 | 3/2010 | Groe et al. |

(Continued)

OTHER PUBLICATIONS

Yoo et al., A Switched-Capacitor RF Power Amplifier, Dec. 2012, IEEE (Year: 2011).*

(Continued)

*Primary Examiner* — Wednel Cadeau
(74) *Attorney, Agent, or Firm* — Invention Mine LLC

(57) ABSTRACT

A polar transmitter including a digital power amplifier cell that includes a first circuit and an amplifier circuit. The first circuit is configured to receive a phase modulated carrier signal and to generate a PMOS control signal and an NMOS control signal such that the PMOS control signal and the NMOS control signal have different duty cycles. The amplifier circuit is configured to receive the PMOS control signal at a PMOS transistor and the NMOS control signal at an NMOS transistor. The first circuit is configured to align the PMOS control signal and the NMOS control signal with respect to one another such that a time that the NMOS transistor and the PMOS transistor of the amplifier circuit are simultaneously conducting is minimized. The amplifier circuit is configured to generate an amplified modulated carrier signal in response to the PMOS and NMOS control signals.

17 Claims, 13 Drawing Sheets

(56) References Cited

U.S. PATENT DOCUMENTS

| | | | |
|---|---|---|---|
| 7,710,180 | B1 | 5/2010 | Lai et al. |
| 7,860,466 | B2 | 12/2010 | Woo |
| 7,869,543 | B2 | 1/2011 | Reddy |
| 8,351,876 | B2 | 1/2013 | McCallister |
| 8,666,325 | B2 | 3/2014 | Shute |
| 8,682,315 | B2 | 3/2014 | Mehta |
| 8,803,627 | B1 | 8/2014 | Xu |
| 8,994,423 | B2 | 3/2015 | Jenkins |
| 9,118,288 | B2 | 8/2015 | Lai et al. |
| 9,172,570 | B1 | 10/2015 | Li Puma |
| 9,391,625 | B1 | 7/2016 | Xu |
| 9,608,648 | B2 | 3/2017 | Xu et al. |
| 9,641,141 | B1 | 5/2017 | Zheng et al. |
| 9,641,165 | B1 | 5/2017 | Mooraka et al. |
| 9,673,829 | B1 | 6/2017 | Xu |
| 9,800,452 | B2 | 10/2017 | Lehtinen |
| 9,985,638 | B2 | 5/2018 | Xu et al. |
| 10,148,230 | B2 | 12/2018 | Xu |
| 2003/0203724 | A1 | 10/2003 | Luo et al. |
| 2006/0197613 | A1 | 9/2006 | Bunch et al. |
| 2007/0013447 | A1 | 1/2007 | Hirano |
| 2007/0096796 | A1* | 5/2007 | Firmansyah ............ H02M 3/07 327/536 |
| 2007/0189417 | A1 | 8/2007 | Waheed et al. |
| 2007/0189431 | A1 | 8/2007 | Waheed et al. |
| 2008/0090565 | A1* | 4/2008 | Kim ........................ H04B 1/202 455/425 |
| 2008/0153437 | A1 | 6/2008 | Jensen |
| 2008/0211576 | A1 | 9/2008 | Moffatt |
| 2008/0225984 | A1 | 9/2008 | Ahmed |
| 2008/0253481 | A1 | 10/2008 | Rivkin |
| 2008/0290954 | A1 | 11/2008 | Chambers et al. |
| 2009/0054000 | A1 | 2/2009 | Waheed |
| 2009/0066423 | A1 | 3/2009 | Sareen et al. |
| 2009/0213980 | A1 | 8/2009 | Ding |
| 2010/0009641 | A1 | 1/2010 | Osman et al. |
| 2010/0260077 | A1 | 10/2010 | Nakatani et al. |
| 2010/0279617 | A1 | 11/2010 | Osman |
| 2013/0063220 | A1 | 3/2013 | McCune |
| 2014/0070857 | A1 | 3/2014 | Huang |
| 2015/0180594 | A1 | 6/2015 | Chakraborty et al. |
| 2016/0028411 | A1 | 1/2016 | Kuo et al. |
| 2016/0248431 | A1 | 8/2016 | Luo et al. |
| 2016/0322980 | A1 | 11/2016 | Xu et al. |
| 2017/0085405 | A1 | 3/2017 | Xu |
| 2018/0183447 | A1 | 6/2018 | Sim et al. |
| 2018/0287569 | A1 | 10/2018 | Xu et al. |
| 2020/0083893 | A1 | 3/2020 | Konradsson et al. |

OTHER PUBLICATIONS

Chowdhury et al., A Fully-Integrated Efficient CMOS Inverse Class-D Power Amplifier for Digital Polar Transmitters, May 2012, IEEE. (Year: 2012).*

International Search Report and Written Opinion for PCT/US2016/021833, dated Apr. 21, 2016, 1-11 (11 paged).

Craninckx, Jan , et al., "A 1.75-GHz/3-V Dual-Modulus Divide-By-128/129 Prescaler in 0.7-µM CMOS", ESSCIRC 95: Twenty-first European Solid-State Circuits Conference, Lille, France, Sep. 1995, 254-257 (4 pages).

Liao, Dongyi , et al., "An 802.11a/b/g/n Digital Fractional-N PLL With Automatic TDC Linearity Calibration for Spur Cancellation", IEEE Journal of Solid-State Circuits, 0018-9200, Jan. 16, 2017, 1-11 (11 pages).

Pellerano, Stefano , et al., "A 4.75-GHz Fractional Frequency Divider-by-1.25 With TDC-Based All-Digital Spur Calibration in 45-nm CMOS", IEEE Journal of Solid-State Circuits, vol. 44, No. 12, Dec. 2009, 3422-3433 (12 pages).

Bert Serneels, Michiel Steyaert and Wim Dehaene, A 5.5 V SOPA Line Driver in a Standard 1.2 V 0.13 µm CMOS Technology, ESAT-MICAS, Ku-Leuven, Kasteelpark Arenberg 10, B-3001 Leuven, Belgium,Proceedings of ESSCIRC, Grenoble, France, 2005, pp. 303-306 (4 pages).

Alden Wong, et al.; A Dual Core Power Combining Digital Power Amplifier for 802.11b/g/n with +26.8dBm Linear Output Power in 28nm CMOS; Marvell Semiconductor, Santa Clara, California, USA; 2017 IEEE, pp. 192-195 (4 pages).

David Cousinard, et al.; A 0.23mm2 Digital Power Amplifier with Hybrid Time/Amplitude Control Achieving 22.5dBm at 28% PAE for 802.11g; ISSCC 2017 / Session 13 / High-Performance Transmitters / 13.7; 2017 IEEE International Solid-State Circuits Conference, pp. 228-230 (3 pages).

Debopriyo Chowdhury; et al; A Fully-Integrated Efficient CMOS Inverse Class-D Power Amplifier for Digital Polar Transmitters; IEEE Journal of Solid-State Circuits, vol. 47, No. 5, May 2012, pp. 1113-1122 (10 pages).

Debopriyo Chowdhury, et al.; A 2.4GHz Mixed-Signal Polar Power Amplifier with Low-Power Integrated Filtering in 65nm CMOS; Berkeley Wireless Research Center, University of California at Berkeley, Berkeley, CA 94704; 2010 IEEE (4 pages).

Ritesh Bhat, et al; A Watt-Level 2.4 GHz RF I/Q Power DAC Transmitter with Integrated Mixed-Domain FIR Filtering of Quantization Noise in 65 nm CMOS; Department of Electrical Engineering, Columbia University, New York, NY-10027; 2014 IEEE, pp. 413-416 (4 pages).

Sang-Min Yoo, et al.; A Switched-Capacitor RF Power Amplifier; IEEE Journal of Solid-State Circuits, vol. 46, No. 12, Dec. 2011, pp. 2977-2987 (11 pages).

Debopriyo Chowdhury, et al.; An Efficient Mixed-Signal 2.4-GHz Polar Power Amplifier in 65-nm CMOS Technology; IEEE Journal of Solid-State Circuits, vol. 46, No. 8, Aug. 2011, pp. 1796-1806 (14 pages).

Lu Ye, et al.; Design Considerations for a Direct Digitally Modulated WLAN Transmitter With Integrated Phase Path and Dynamic Impedance Modulation; IEEE Journal of Solid-State Circuits, vol. 48, No. 12, Dec. 2013, pp. 3160-3177 (18 pages).

Sang-Min Yoo, et al.; A Class-G Switched-Capacitor RF Power Amplifier; IEEE Journal of Solid-State Circuits, vol. 48, No. 5, May 2013, pp. 1212-1223 (13 pages).

Xing-Qiang Peng, et al.; A 26.3 dBm 2.5 to 6 GHz Wideband Class-D Switched-Capacitor Power Amplifier with 40% Peak PAE; 2014 IEEE International Conference on Electron Devices and Solid-State Circuits; Jun. 18-20, 2014 (2 pages).

Sang-Min Yoo; et al.; A Class-G Switched-Capacitor RF Power Amplifier; IEEE Journal of Solid-State Circuits, vol. 48, No. 5, May 2013, pp. 1212-1224 (13 pages).

Jeffrey S. Walling, et al.; WSB: Digital PAs: Switched Capacitor Circuits Pave The Way to Reconfigurability; University of California, Berkeley; RFIC2014, Tampa Bay Jun. 1-3, 2014, pp. 1-32 (32 pages).

Morteza S. Alavi, et al.; AWideband2 13-bit All-Digital I/Q RF-DAC; IEEE Transactions on Microwave Theory and Techniques, vol. 62, No. 4, Apr. 2014, pp. 732-752 (21 pages).

Qiuyao Zhu, et al.; A Digital Polar Transmitter with DC-DC Converter Supporting 256-QAM WLAN and 40 MHz LTE-A Carrier Aggregation; 2016 IEEE Radio Frequency Integrated Circuits Symposium, pp. 198-201 (4 pages).

Wen Yuan, et al.; A Quadrature Switched Capacitor Power Amplifier; IEEE Journal of Solid-State Circuits, vol. 51, No. 5, May 2016, pp. 1200-1209 (10 pages).

Vladimir Aparin, et al.; A Transformer Combined Quadrature Switched Capacitor Power Amplifier in 65nm CMOS; ECE Dept., University of Utah Salt Lake City, UT, USA; IEEE Xplore: Oct. 24, 2016, pp. 1-4 (4 pages).

E. McCune et al. , "A Fully Polar Transmitter for Efficient Software-Defined Radios," IMS IEEE, Honolulu, Jun. 2017, pp. 1-4 (4 pages).

Hadong Jin, et al.; Efficient Digital Quadrature Transmitter Based on IQ Cell Sharing; IEEE Journal of Solid-State Circuits, vol. 52, No. 5, May 2017, pp. 1345-1357 (13 pages).

Wen Yuan, et al.; A Multiphase Switched Capacitor Power Amplifier; IEEE Journal of Solid-State Circuits, vol. 52, No. 5, May 2017, pp. 1320-1330 (11 pages).

(56) References Cited

OTHER PUBLICATIONS

Qiuyao Zhu, et al.; A Digital Polar Transmitter With DC-DC Converter Supporting 256-QAM WLAN and 40-MHz LTE-A Carrier Aggregation; IEEE Journal of Solid-State Circuits; 2017 IEEE, pp. 1-14 (14 pages).

Qiuyao Zhu, et al.; A Digital Polar Transmitter with DC-DC Converter Supporting 256-QAM WLAN and 40 MHz LTE-A Carrier Aggregation; San Francisco, CA, USA ; IEEE Xplore: Jul. 11, 2016, pp. 1-4 (4 pages).

Tsai-Pi Hung, et al.; "Design of H-Bridge Class-D Power Amplifiers for Digital Pulse Modulation Transmitters"; IEEE Transactions on Microwave Theory and Techniques, vol. 55, No. 12, Dec. 2007, pp. 2845-2855 (11 pages).

Ritesh Bhat, et al.; "A >1W 2.2GHz Switched-Capacitor Digital Power Amplifier with Wideband Mixed-Domain Multi-Tap FIR Filtering of OOB Noise Floor"; 2017 IEEE International Solid-State Circuits Conference, pp. 234-236 (3 pages).

Renaldi Winoto, et al.; "A 2×2 WLAN and Bluetooth Combo SoC in 28nm CMOS with On-Chip WLAN Digital Power Amplifier, Integrated 2G/BT SP3T Switch and BT Pulling Cancelation"; 2016 IEEE International Solid-State Circuits Conference, pp. 170-172 (3 pages).

C. D. Presti, et al., "A high resolution 24-dBm digitally-controlled CMOS PA for multi-standard RF polar transmitters," in Proc. IEEE ESSCIRC, Sep. 2008, pp. 482-485 (4 pages); IEEE Xplore: Feb. 25, 2016.

Z. Boos, et al., "A fully digital multimode polar transmitter employing 17b RF DAC in 3G mode," in Proc. IEEE ISSCC, Feb. 2011, pp. 376-378 (3 pages).

Mini-Circuits Application Note, "Application Note on Transformers (AN-20-002)", https://www.minicircuits.com/app/AN20-002.pdf; AN-20-002 Rev.: B M150261 (Jun. 2, 2010) File: AN20002.doc, pp. 1-15 (15 pages).

Mark Stitt; "Simple Filter Turns Square Waves Into Sine Waves"; Burr-Brown Appliation Bulletin; 1993 Burr-Brown Corporation, Printed in U.S.A. Dec. 1993, pp. 1-3 (3 pages).

Vaucher et al., "A Family of Low-Power Truly Modular Programmable Dividers in Standard 0.35-um CMCS Technology", IEEE Journal of Solid-State Circuits, vol. 35, No. 7, Jul. 2000, pp. 1039-1045 (7 pages).

Notification of Transmittal of the International Search Report and the Written Opinion of the International Searching Authority, or the Declaration for PCT/US16/21833, dated Apr. 21, 2016, pp. 1-11 (11 pages).

R. B. Staszewski et al., "Spur-Free Multirate All-Digital PLL for Mobile Phones in 65 nm CMOS," IEEE Journal of Solid-State Circuits, vol. 46, No. 12, pp. 2904-2919 (16 pages), Dec. 12, 2011.

Groe, John. (2007). Polar Transmitters for Wireless Communications. Communications Magazine, IEEE. 45. 58-63. 10.1109/MCOM. 2007.4342857, pp. 58-63 (6 pages).

W.-H. Yu, W.-F. Cheng, Y. Li, C.-F. Cheang, P.-I. Mak and R.P. Martins, "Low-complexity, full-resolution, mirror-switching digital predistortion scheme for polar-modulated power amplifiers", Electronics Letters Nov. 22, 2012 vol. 48 No. 24, pp. 1-2 (2 pages).

Calogero D. Presti, Donald F. Kimball, PeterM. Asbeck, "Closed-Loop Digital Predistortion System With Fast Real-Time Adaptation Applied to a Handset WCDMA PA Module", IEEE Transactions on Microwave Theory and Techniques, vol. 60, No. 3, Mar. 2012, pp. 604-618 (15 pages).

International Search Report and Written Opinion for PCT/US2019/067224, dated Apr. 24, 2020, 1-9 (9 pages).

* cited by examiner

SYSTEMS AND METHODS FOR MAXIMIZING POWER EFFICIENCY OF A DIGITAL POWER AMPLIFIER IN A POLAR TRANSMITTER

BACKGROUND

Recent advances in high speed integrated circuit technologies enable various innovative and versatile applications relating to the Internet of Things (IoT). For many wireless communications applications, the power consumption of the transceiver is very important, especially if the transceiver is battery powered.

Polar transmitters have been proposed as an energy-efficient solution for the generation of modulated radio-frequency signals. The use of efficient power amplifiers in such transmitters is desirable to minimize power consumption. However, selection of power amplifiers on the basis of minimal power consumption often entails tradeoffs in the form of increased nonlinearity in amplifier performance.

In a polar modulator, as a first step, a data signal carries information encoded via a quadrature modulation technique and characterized in an in-phase-quadrature (IQ) plane. Quadrature modulation makes use of Cartesian coordinates, x and y. When considering quadrature modulation, the x-axis is hereinafter referred to as the "I" (in-phase) axis, and the y-axis is hereinafter referred to as the "Q" (quadrature) axis.

The polar modulator may generally include a coordinate system converter such as an in-phase-quadrature to amplitude/phase (IQ-A/P) converter that generates polar phase samples and polar amplitude samples from the quadrature modulated data signal. Polar modulation is analogous to quadrature modulation in the same way that polar coordinates are analogous to Cartesian coordinates. Polar modulation makes use of polar coordinates, r (amplitude) and $\Theta$ (phase). Converting from a quadrature modulation schema to a polar modulation schema may be carried out via a plurality of known techniques. Mathematically, the process relies upon trigonometry. The tangent of the phase $\Theta$ is equivalent to the value of the quadrature component (Q) divided by the value of the in-phase component (I), while the amplitude r is given by the square root of the sum of the squares of the quadrature and in-phase components (Q and I, respectively).

The quadrature modulator approach to digital radio transmission often requires a linear RF power amplifier that can create a design conflict between improving power efficiency and maintaining amplifier linearity. Compromising linearity causes degraded signal quality, which can be a fundamental factor in limiting network performance and capacity. Additional problems with linear RF power amplifiers, including device parametric restrictions, temperature instability, power control accuracy, wideband noise and production yields are also common. On the other hand, compromising power efficiency increases power consumption (which reduces battery life in handheld devices) and generates more heat.

It may be desirable to attempt to maximize available power out of the power amplifier while still maximizing efficiency and minimizing power consumption of the amplifier.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts disclosed herein, and explain various principles and advantages of those embodiments.

Figure 1:
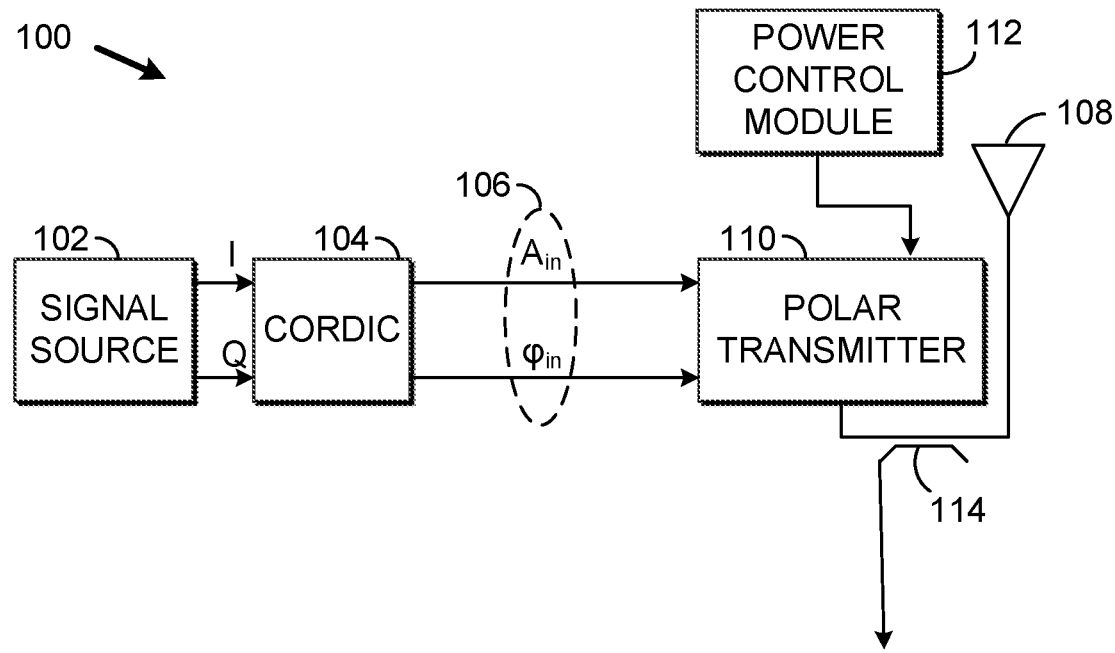
FIG. 1 is a block diagram of an example polar coordinate conversion and polar transmission system in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

Before proceeding with this detailed description, it is noted that the entities, connections, arrangements, and the like that are depicted in—and described in connection with—the various figures are presented by way of example and not by way of limitation. As such, any and all statements or other indications as to what a particular figure "depicts," what a particular element or entity in a particular figure "is" or "has," and any and all similar statements—that may in isolation and out of context be read as absolute and therefore limiting—can only properly be read as being constructively preceded by a clause such as "In at least one embodiment, . . . ." And it is for reasons akin to brevity and clarity of presentation that this implied leading clause is not repeated ad nauseum in this detailed description.

FIG. 1 is a block diagram of an example polar coordinate conversion and polar transmission system 100 in accordance with some embodiments. A signal source 102 is provided to generate in-phase (I) and quadrature (Q) values of a signal to be transmitted. Signal source 102 may be any source of I and Q values known to those of skill in the art, such as encoders for frequency modulated or phase-modulated radio-frequency signals, such as signals modulated using phase shift keying (PSK) or quadrature amplitude modulation (QAM). As the term is used in the present disclosure, phase-modulated signals include signals that are modulated in phase (e.g., binary phase-shift keying (BPSK), quadrature phase-shift keying (QPSK), 8-PSK, or 16-PSK) as well as signals that are modulated in both phase and amplitude (e.g., 16-QAM, 64-QAM, or 256-QAM, or multicarrier combinations of such signals, as in Orthogonal Frequency Division Multiplexed (OFDM) signals). Frequency modulated signals include, among others, frequency shift keying (FSK) signals such as binary frequency-shift keying (BFSK) signals, multiple frequency-shift keying (MFSK) signals, and minimum-shift keying (MSK) signals.

The in-phase and quadrature signals from signal source 102 are provided to a coordinate rotation digital computer (CORDIC) logic circuit 104. The CORDIC logic circuit 104 converts the Cartesian I and Q signals to a corresponding polar signal that includes digital amplitude and phase signals. The amplitude signal $A_{in}$ and the phase signal $\varphi_{in}$ are provided through a polar signal input 106 to a polar transmitter 110. The polar transmitter 110 generates a phase-and-amplitude modulated radio-frequency (RF) output signal corresponding to the polar signal and transmits the signal at an antenna 108. In some embodiments, the radio-frequency signal, also referred to herein as a modulated carrier signal, has a frequency in the range of 2412 MHz-2484 MHz, although the use of the polar transmitter 110 is not limited to that frequency range. In general, a polar transmitter and/or transceiver in accordance with some of the embodiments disclosed herein may be used at any suitable frequency. Some particular frequency bands and ranges include those for LTE (4G) (e.g., 700 MHz-6 GHz), 5G (e.g., 600 MHz-6 GHz, 24-86 GHz), and any applicable frequency bands for standards such as LTE, GSM, WiMax and WiFi 802.11 standards (e.g., 2.4 GHz, 5 GHz, 900 MHz), although it will be understood that any frequency may be used in accordance with a particular implementation.

The polar transmitter 110 includes power amplifier circuitry (not shown) in FIG. 1 in accordance with some embodiments described herein.

In some embodiments, the power of the output of the polar transmitter 110 is variable and is controlled by a power control module 112. In some embodiments, the power control module 112 may be implemented as a control circuit. Different power levels may be selected for different transmission modes. In some embodiments, the power level is controlled by changing the drain voltage VDD supplied to the polar transmitter 110 (and to, e.g., the power amplifier circuitry (not shown) of the polar transmitter 110). In some embodiments, the polar transmitter 110 may include the power control module 112.

In some embodiments, the example polar coordinate conversion and polar transmission system 100 may include a digital predistortion circuit (not shown in FIG. 1, e.g., inserted between the CORDIC logic circuit 104 and the polar transmitter 110) that may be used to apply predistortion to the amplitude signal $A_{in}$ and the phase signal $\varphi_{in}$ output by the CORDIC logic circuit 104, and in so doing generating a predistorted polar signal from these inputs, and, in particular, predistorted values $A_{pd}$ of the amplitude and $\varphi_{pd}$ of the phase, that may in turn be provided to the polar transmitter 110. The predistorted value $\varphi_{pd}$ of the phase may be wrapped so as to have values of the phase between 0 and $2\pi$ (or, in some embodiments, between $-\pi$ and $+\pi$, among other alternatives). In some embodiments, a polar receiver (not shown in FIG. 1) may sense signals transmitted by the polar transmitter using, e.g., a coupler 114, as shown in FIG. 1. Examples and implementations of a digital predistortion circuit (and of polar receivers used as part of, or in conjunction with such example circuit(s)) such as may be used, e.g., in the example polar coordinate conversion and polar transmission system 100 of FIG. 1 are described in greater detail in U.S. Pat. No. 10,148,230, issued Dec. 4, 2018, entitled "ADAPTIVE DIGITAL PREDISTORTION FOR POLAR TRANSMITTER," the entirety of which is incorporated herein by reference. In still further embodiments, the polar transmitter may include a linearization circuit, as described in U.S. patent application Ser. No. 16/125,510, filed Sep. 7, 2018, entitled "FREQUENCY CONTROL WORD LINEARIZATION FOR AN OSCILLATOR," the entirety of which is incorporated herein by reference.

In some embodiments, the CORDIC logic circuit 104 may include a signal phase generator and a signal envelope generator (not shown in FIG. 1). According to some embodiments, the baseband in-phase (I) signals and quadrature (Q) signals are received at the CORDIC logic circuit 104 from the signal source 102, with the signal phase generator configured to process the I and Q signals and perform a rectangular-to-polar conversion to generate the phase signal $\varphi_{in}$. In some embodiments, the signal phase generator is a CORDIC calculator. According to some embodiments, the signal envelope generator is configured to process the I and Q signals received at the CORDIC logic circuit 104 and perform a rectangular-to-polar conversion to generate an envelope signal, for example the amplitude signal $A_{in}$ of FIG. 1. The envelope signal may correspond to the envelope of a desired information-modulated transmit signal, such as the envelope formed by the magnitude of the I and Q signals received at the CORDIC logic circuit. The envelope signal may, e.g., be digital in nature and be used to control a digitally switching amplifier within the polar transmitter 100, (directly, or, in some embodiments, as converted into, e.g., an amplitude codeword that may be used to selectively engage or disengage individual amplifier cells) or may be analog and be used to control an analog power control input of an amplifier within the polar transmitter 100. Further, a digital envelope signal may be converted to an analog signal and applied to an analog power control input.

Figure 2:
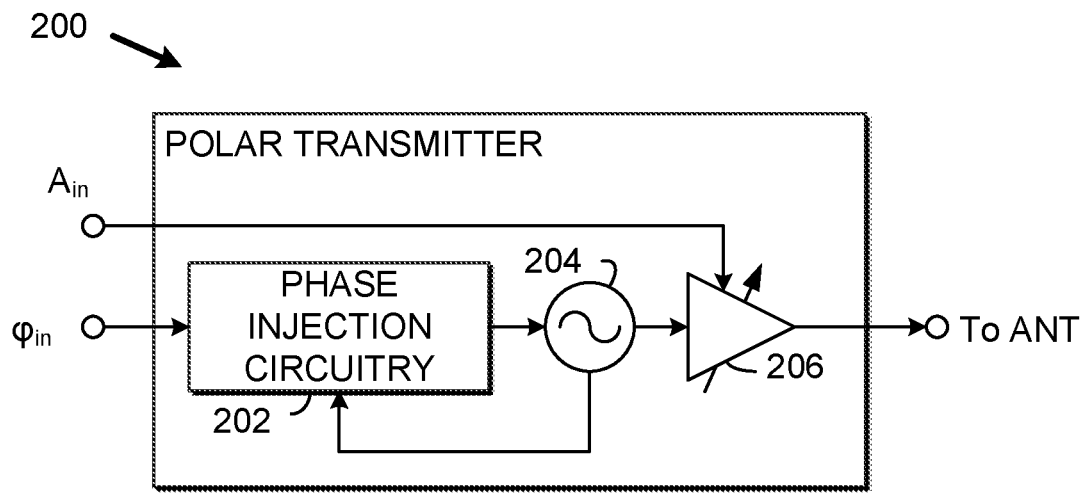
FIG. 2 is a block diagram of an example polar transmitter in accordance with some embodiments.

FIG. 2 is a block diagram of an example polar transmitter 200 in accordance with some embodiments. The polar transmitter 200 is an example implementation of the polar transmitter 110 of FIG. 1.

In the example of FIG. 2, the polar transmitter 200 receives the amplitude signal $A_{in}$ and the phase signal $\varphi_{in}$ output by the CORDIC logic circuit 104 of FIG. 1. According to the example, the phase signal $\varphi_{in}$ is injected using phase injection circuitry 202 into a phase-locked loop that includes a digitally-controlled oscillator (DCO) 204. The phase injection circuitry 202 compares the phase of the DCO output with the phase identified by the phase signal $\varphi_{in}$ and controls the DCO such that the phase of the DCO output more closely matches the phase of phase signal $\varphi_{in}$. The oscillating signal that is generated by the DCO 204 and that is the DCO output is then amplified by power amplifier circuitry 206, with the gain of the power amplifier circuitry 206 being controlled by the digital amplitude signal $A_{in}$. The radio-frequency output of the power amplifier circuitry 206 is provided to an antenna (e.g., antenna 108) for transmission.

Figure 3:
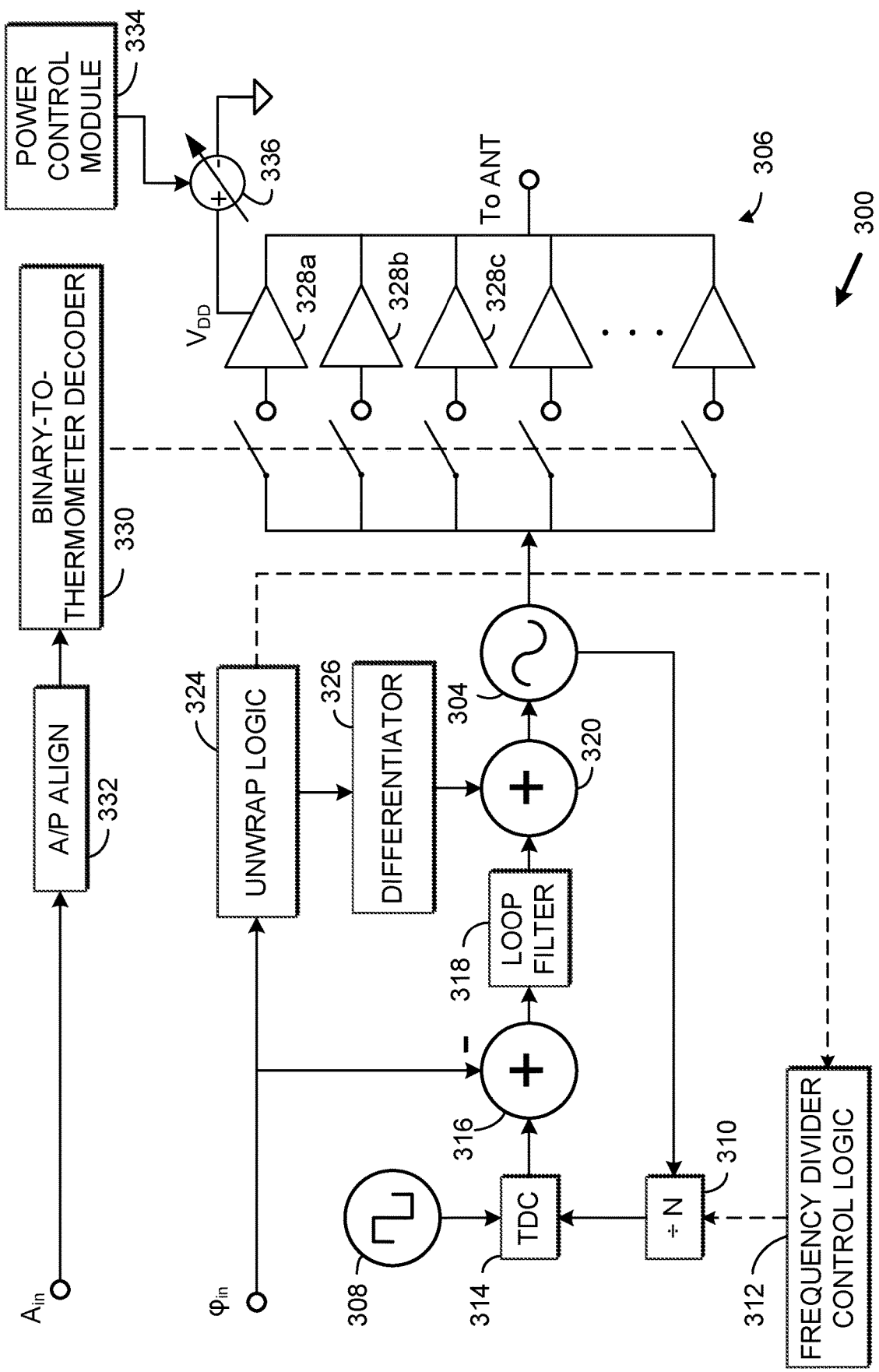
FIG. 3 is a block diagram of another example polar transmitter in accordance with some embodiments.

In some embodiments, as shown in, e.g., FIG. 3, the digital amplitude signal $A_{in}$ may be converted to, e.g., a thermometer code that may serve as an example of an amplitude codeword signal control of a power amplifier.

In some embodiments, the polar transmitter 200 may receive predistorted versions of the amplitude signal $A_{in}$ and the phase signal $\varphi_{in}$ (e.g., predistorted amplitude and phase signals $A_{pd}$, and $\varphi_{pd}$ as described above with respect to FIG. 1). In some embodiments, the output of the polar transmitter 200 may be further sampled by a coupler (e.g., coupler 114 of FIG. 1) for use by adaptive predistortion circuitry (including, e.g., a polar receiver).

In some embodiments, the polar transmitter 110 of FIG. 1 may be further simplified. In another example of a polar transmitter, the incoming phase signal $\varphi_{in}$ may be processed at a differentiator with the output of the differentiator then applied to a DCO, e.g., the DCO 204. The output of the DCO may be applied to a loop filter and then fed back and combined at the input the DCO with the output of the differentiator. The resulting DCO output may be applied to an amplifier (e.g., the power amplifier circuitry 206 of FIG. 2) to generate an amplified transmit signal (e.g., controlled by the amplitude signal $A_{in}$).

FIG. 3 is a block diagram of another example polar transmitter 300 in accordance with some embodiments. The polar transmitter 300 (using a phase-locked loop in the example shown in FIG. 3) is an example implementation of the polar transmitter 200 of FIG. 2.

According to the example of the polar transmitter 300 shown in FIG. 3, a digital voltage controlled oscillator 304 provides an oscillating signal to a frequency divider 310, which divides the frequency of the oscillating signal from the oscillator 304 by a frequency divisor N to generate a frequency-divided signal. In some embodiments, the frequency divider 310 is a variable frequency divider, with the frequency divisor N being controlled by frequency divider control logic 312. In some embodiments, a multi-modulus frequency divider (MMD) may be implemented using, for example, a cascaded chain of ⅔ frequency divider sections.

A reference clock 308 operates to provide a cyclic reference signal. A time-to-digital converter (TDC) 314 is operative to compare the phase of the frequency-divided signal with the phase of the cyclic reference signal to generate a measured phase signal. The time-to-digital converter 314 may operate by, for example, measuring an elapsed time between a rising edge of the cyclic reference signal and a rising edge of the frequency-divided signal.

Subtraction logic 316 is provided to generate an error signal representing the difference between the phase measured by the TDC 314 and the digital phase signal $\varphi_{in}$. The error signal generated by the subtraction logic 316 is filtered by a loop filter 318, which may be a digital proportional-integral (PI) filter, to generate a filtered error signal. In some embodiments, a differential of the phase signal $\varphi_{in}$ is generated by a differentiator 326 and injected into the loop by adder 320. To avoid large spikes in the differentiated signal (when, e.g. the phase signal shifts from near +π to near −π, or from near 0 to near +2π, the phase signal may be unwrapped using unwrap logic 324 before differentiation. The operation of a phase-locked loop such as that used in the example polar transmitter 300 of FIG. 3 is described in greater detail in U.S. Pat. No. 9,391,625, issued on Jul. 12, 2016 and filed Mar. 24, 2015, entitled "WIDEBAND DIRECT MODULATION WITH TWO-POINT INJECTION IN DIGITAL PHASE LOCKED LOOPS," the entirety of which is incorporated herein by reference. In further embodiments, the digital oscillator may operate at a higher frequency and undergo a frequency division to reduce oscillator pulling caused by the amplifier.

The output of the digitally-controlled oscillator 304 is amplified by power amplifier circuitry 306 that, in the example of FIG. 3, includes a plurality of power amplifier cells 328a, 328b, 328c, etc. In some embodiments, a phase tree multiplexer (not shown in FIG. 3) may be used prior to the power amplifier circuitry to select a signal phase input to the power amplifier circuitry 306. The amplitude of the signal output by the power amplifier circuitry 306 is controlled by engaging a variable number of power amplifier cells to amplify the signal from the digitally-controlled oscillator 304. Specifically, the amplitude of the radio frequency output signal of the polar transmitter 300 is substantially proportional to the number or cells engaged to amplify the signal. The output signal amplitude may deviate from strict proportionality due to, for example, nonlinear distortion effects, that, in some embodiments, may be mitigated by, e.g., adaptive predistortion circuitry as described above. A binary-to-thermometer decoder 330 is provided to receive the digital amplitude signal $A_{in}$ and convert the digital signal to a thermometer code that engages and disengages selected ones of the power amplifier cells to achieve the desired amplitude. To accommodate different time delays in the amplitude and phase transmission paths, amplitude/phase alignment logic 332 may be provided to align the signals.

In FIG. 3, for ease of description, a thermometer code is shown that selectively engages and disengages individual ones of the power amplifier cells. In some embodiments, individual bits of the thermometer code are received at respective individual power amplifier cells and any selective engagement or disengagement of the respective individual power amplifier cells is achieved internally to the individual power amplifier cells (e.g., power amplifier cells 328a, 328b, 328c, etc.), rather through the external switches as shown in FIG. 3.

The power amplifier circuitry 306 shown in FIG. 3 is a simplified example (e.g., showing multiple amplifier cells with, e.g., a single combined output) in accordance with some embodiments. The operation of example power amplifier circuitry (e.g., with one or more banks of multiple cells, and/or with one or more outputs corresponding to each bank) in accordance with some embodiments is described in greater detail below with respect to FIG. 4 and other figures.

In some embodiments, a power control module 334 (shown in FIG. 3 along with programmable voltage source 336 as part of the polar transmitter 300) is provided to control the voltage VDD provided to the amplifier cells 328a, 328b, 328c, etc. of the power amplifier circuitry 306. Different drain voltages VDD may be selected for different transmission modes. Power control module 334 is an example implementation of the power control module 112 of FIG. 1. In some embodiments, the power control module 334 may be implemented as a control circuit. In the example of FIG. 3, the power control circuit 334 digitally controls the output of the programmable voltage source 336 that in turn provides drain voltages VDD to the amplifier cells 328a, 328b, 328c, etc. The output of the power amplifier circuitry 306 is coupled to an antenna (e.g., antenna 108 of FIG. 1) for transmission.

In some embodiments, the polar transmitter 300 may receive predistorted versions of the amplitude signal $A_{in}$ and the phase signal $\varphi_{in}$ (e.g., predistorted amplitude and phase signals $A_{pd}$ and $\varphi_{pd}$ as described above with respect to FIG. 1). In some embodiments, the output of the polar transmitter 300 may be further sampled by a coupler (e.g., coupler 114 of FIG. 1) for use by adaptive predistortion circuitry (including, e.g., a polar receiver).

Figure 4:
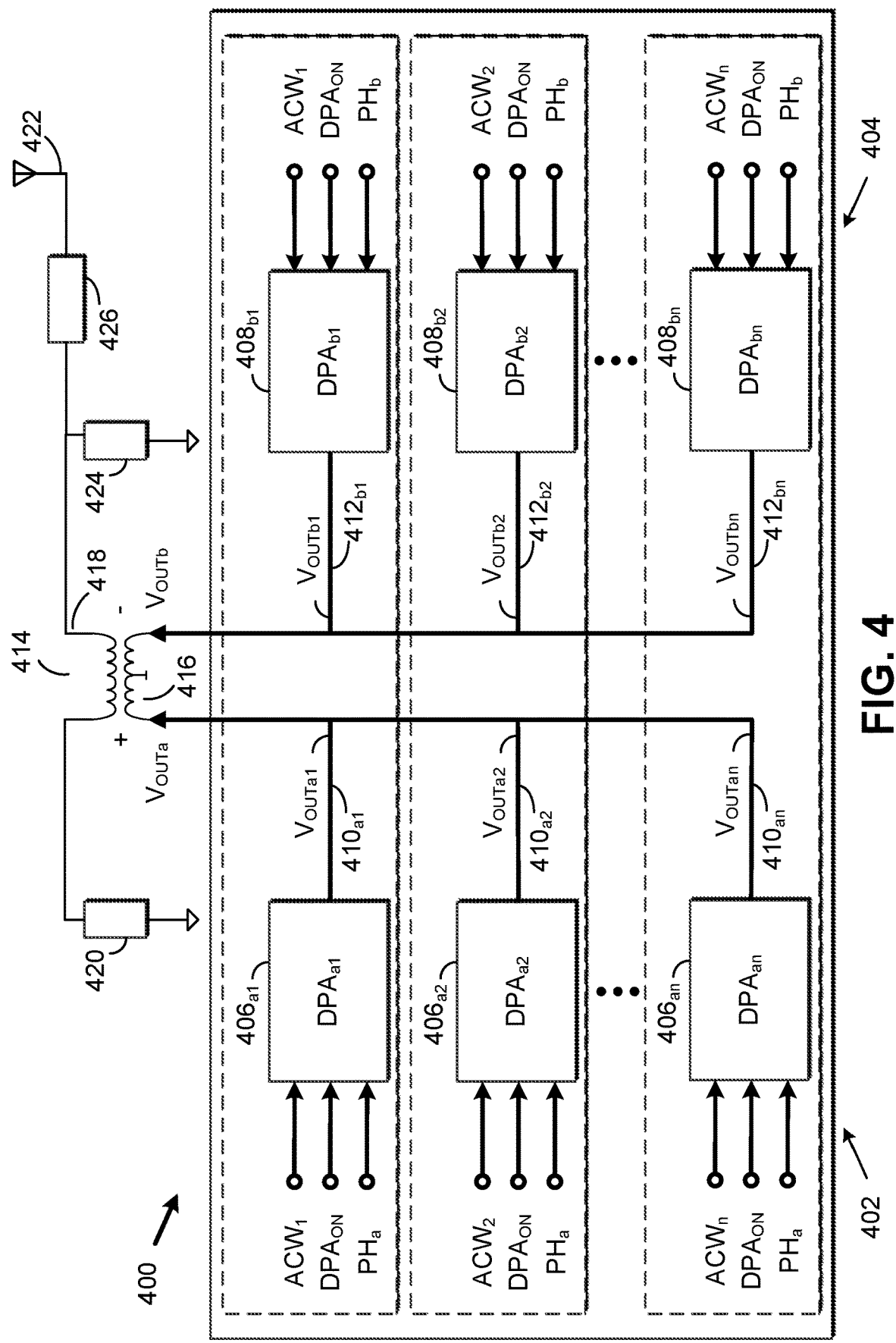
FIG. 4 is a block diagram of a digital power amplifier with two banks of amplifier cells in accordance with some embodiments.

FIG. 4 is a block diagram of a digital power amplifier (DPA) 400 with two banks 402, 404 of amplifier cells in accordance with some embodiments. The DPA 400 is an example implementation of, e.g., the power amplifier circuitry 206 of FIG. 2 or the power amplifier circuitry 306 shown in FIG. 3 in accordance with some embodiments.

The DPA 400 includes a first bank 402 (on the left hand side of FIG. 4) of n amplifier cells (e.g., digital power amplifier (DPA) cells, or DPA "stages") $DPA_{a1}$ $406_{a1}$, $DPA_{a2}$ $406_{a2}$, ..., $DPA_{an}$ $406_{an}$. The DPA 400 also includes a second, parallel bank 404 (on the right hand side of FIG. 4) of n amplifier cells (e.g., DPA cells) $DPA_{b1}$ $408_{b1}$, $DPA_{b2}$ $408b2$, ..., $DPA_{bn}$ $408bn$. Each bank 402, 404 of n amplifier cells may include, e.g., hundreds or even thousands of amplifier cells. In some embodiments, the number of amplifier cells n may be one thousand or more.

In some embodiments, the n amplifier cells 406 of the bank 402 and the n amplifier cells 408 of the bank 404 are each designed to be implemented as identical cells and are configured to process the same signal(s) in substantially the same way. At any given time, of course, whether identically configured or not, an individual amplifier cell may generally receive one or more different signals than another individual amplifier cell. Of course, other implementations are possible where amplifier cells vary in design as suitable for a particular application.

It should be noted that, the operation of an example implementation of a DPA cell such as amplifier cells 406, 408 is described in greater detail below with respect to FIGS. 5-9D in accordance with some embodiments, as discussed in further detail below.

Referring again to FIG. 4, dotted lines are drawn to identify and indicate pairs of parallel amplifier cells, with each amplifier cell from the first bank 402 having a corresponding parallel amplifier cell from the second bank 404, such that the DPA 400 would have n pairs of amplifier cells: $DPA_{a1}$ 406a1 and $DPA_{b1}$ 408b1 (first pair), $DPA_{a2}$ 406a2 and $DPA_{b2}$ 408b2 (second pair), ..., $DPA_{an}$ 406an and $DPA_{bn}$ 408bn (nth pair).

In some embodiments, each amplifier cell of a pair of parallel amplifier cells may be termed, e.g., a "half-cell," with two parallel "half-cells" forming a "cell," but for ease of description, each amplifier cell discussed herein is otherwise identified separately a being a cell and two parallel cells would constitute a "pair."

The first bank 402 of the DPA 400 includes a plurality of DPA cells 406 while the second bank 404 of the DPA 400 includes a plurality of parallel DPA cells 408. These pluralities of DPA cells 406, 408 are all configured to receive one or more DPA control signals.

As shown in FIG. 4, each DPA cell 406, 408 may receive several DPA control signals, e.g., a bit from an amplitude codeword (ACW) signal, an enable signal ($DPA_{ON}$) for, e.g., the entire DPA 400, and a phase modulated carrier signal (PH). In some embodiments, these signals may be targeted to particular amplifier cells, or to particular banks of amplifier cells. In some embodiments, particular DPA cells 406, 408 may receive more than one of each of these DPA control signals. For example, in some embodiments, two versions of each of these types of DPA control signals, having different voltage ranges, may be provided to each DPA cell 406, 408. The different voltage ranges on the DPA control signals may be provided by using level shifting circuitry (not shown in FIG. 4) prior to the DPA 400.

In the example DPA 400 of FIG. 4, each of the n DPA cells 406 ($DPA_{a1}$ 406a1, $DPA_{a2}$ 406a2, ..., $DPA_{an}$ 406an) of the first bank 402 of n DPA cells is configured to receive a phase modulated carrier signal $PH_a$. In accordance with the example DPA 400 of FIG. 4, each of the n parallel DPA cells 408 ($DPA_{b1}$ 408b1, $DPA_{b2}$ 408b2, ..., $DPA_{bn}$ 408bn) of the second bank 404 of n DPA cells may similarly be configured to receive a phase modulated carrier signal $PH_b$. In some embodiments, depending, e.g., on the particular transmitter and amplifier design, the phase modulated carrier signals $PH_a$, $PH_b$ may be related to one another, for example the same signal, or, e.g., lagged or leading versions of one another. In accordance with some embodiments, the phase modulated carrier signals $PH_a$ and $PH_b$ are 180 degrees out of phase with one another but are otherwise approximately identical. In some embodiments, one or both of the phase modulated carrier signals $PH_a$ and $PHb$ may be outputs of a phase tree multiplexer selected by the digitally controlled oscillator (DCO) 204 of FIG. 2 or the DCO 304 of FIG. 3, following processing of the initial digital phase signal $\varphi_{in}$ as in, e.g., FIGS. 2 and 3. In some embodiments, the phase modulated carrier signal may be a high frequency signal, having a frequency such as 2.4 gigahertz (GHz), although other frequencies may be used.

In some embodiments, the plurality of DPA cells 406 of the first bank 402 of the DPA 400 may be configured to receive a phase modulated carrier signal, e.g., $PH_a$. In some embodiments, the plurality of parallel DPA cells 408 of the second bank 404 of the DPA 400 may be configured to receive another phase modulated carrier signal, e.g., $PH_b$, where the another phase modulated carrier signal is 180 degrees out of the phase with the phase modulated carrier signal.

In the example DPA 400 of FIG. 4, each DPA cell 406, 408 is configured to receive an enable signal $DPA_{ON}$. In some embodiments, the enable signal $DPA_{ON}$ is configured to turn each DPA cell 406, 408, and thus the entire DPA 400, on or off. For example, circuitry with each DPA cell 406, 408 and the entire DPA 400 is designed to receive the enable signal $DPA_{ON}$ and shut down the DPA 400 or turn on the DPA 400. In some embodiments, the polar transmitter 110 of FIG. 1 may share resources, e.g., on-chip transceiver resources, with a polar receiver (not shown) and a polar transceiver system may be designed to reduce power consumption and use of system resources by the polar receiver while the polar transmitter 110 is transmitting (e.g., by turning off the polar receiver). Similarly, a polar transceiver system may be designed to reduce power consumption and use of system resources by the polar transmitter 110 when the polar receiver is receiving (e.g., by turning off the polar transmitter 110). In some embodiments, an enable signal such as enable signal $DPA_{ON}$ may be used to quickly and efficiently turn the DPA 400 "off" when, e.g., it is not in use and to turn the DPA 400 "on" when the DPA 400 is intended to be amplifying a transmit signal.

In some embodiments with a polar transmitter and a polar receiver, the enable signal $DPA_{ON}$ for the DPA (e.g., DPA 400) is operative to (a) activate the entire DPA (e.g., turn the entire DPA on) when the polar transmitter is operational and transmitting and to (b) turn the entire DPA off when the polar receiver is operational and receiving. In some embodiments, activating the DPA (e.g., the entire DPA) may amount to enabling the DPA for operation as a transmitter, but various DPA control signals (e.g., an ACW signal) may separately and selectively engage or disengage individual DPA cells (e.g., DPA cells 406, 408) within the DPA even when the DPA is activated (e.g., turned on).

In the example DPA 400 of FIG. 4, each DPA cell of the plurality of DPA cells 406, 408 is configured to receive an amplitude codeword (ACW) signal. In some embodiments, the ACW signal is operative to set a gain of the DPA 400 by, e.g., selectively engaging various DPA cells of the pluralities of DPA cells 406, 408.

In some embodiments, an ACW signal (generated from, e.g., a decoder such as binary-to-thermometer decoder 330 of FIG. 3) serves as a thermometer code that is made up of n separate individual bits configured to engage or disengage individual selected DPA cells. In some embodiments, selective engagement of an individual DPA cell, e.g., in effect determines whether or not a particular individual DPA cell will participate in amplifying a modulated carrier signal, where an engaged DPA cell will participate and, e.g., a disengaged DPA cell will not (or at least will not provide a contribution to a combined amplified modulated carrier signal). In the example DPA 400 of FIG. 4, the thermometer code of the ACW signal selectively engages and disengages individual ones of the DPA cells 406, 408 via, e.g., circuitry internal to the DPA cells 406, 408. In other embodiments, external switches such as those shown in FIG. 3 with respect to the amplifier cells 328$a$, 328$b$, 328$c$, etc. of the power amplifier circuitry 306 may be used. In the example DPA 400 shown in FIG. 4, ACW signal bits $ACW_1$, $ACW_2$, . . . , $ACW_n$ from the n-bit ACW signal are applied to respective corresponding n DPA cells 406 ($DPA_{a1}$ 406$a$1, $DPA_{a2}$ 406$a$2, . . . , $DPA_{an}$ 406$an$) of the first bank 402. In the example DPA 400, the same ACW signal bits $ACW_1$, $ACW_2$, . . . , $ACW_n$ from the n-bit ACW signal are applied to respective corresponding n DPA cells 408 ($DPA_{b1}$ 408$b$1, $DPA_{b2}$ 408$b$2, . . . , $DPA_{bn}$ 408$bn$) of the second bank 404. In some embodiments, the same n-bit ACW signal may be applied to each bank as in FIG. 4, although other designs may be used. In some embodiments, the n-bit ACW signal may be derived from the digital amplitude signal $A_{in}$ (for example, by way of a decoder such as decoder 330 of FIG. 3).

In the example DPA 400 of FIG. 4, each DPA cell of the pluralities of DPA cells 406, 408 has a corresponding output and is configured to generate an amplified modulated carrier signal at each corresponding output. According to the example DPA 400 of FIG. 4, each of the n DPA cells 406 ($DPA_{a1}$ 406$a$1, $DPA_{a2}$ 406$a$2, . . . , $DPA_{an}$ 406$an$) of the first bank 402 of n DPA cells has a respective output 410$a$1, 410$a$2, . . . , 410$an$ at which each DPA cell is configured to generate a respective amplified modulated carrier signal $V_{OUTa1}$, $V_{OUTa2}$, . . . , $V_{OUTan}$. In accordance with the example DPA 400 of FIG. 4, each of the n parallel DPA cells 408 ($DPA_{b1}$ 408$b$1, $DPA_{b2}$ 408$b$2, . . . , $DPA_{bn}$ 408$bn$) of the second bank 404 of n DPA cells has a respective output 412$a$1, 412$a$2, . . . , 412$an$ at which each DPA cell is configured to generate a respective amplified modulated carrier signal $V_{OUTb1}$, $V_{OUTb2}$, . . . , $V_{OUTbn}$.

In some embodiments, as described above, the pluralities of DPA cells 406, 408 of banks 402, 404 are configured to receive a respective bit of an ACW signal ACW signal bits (e.g., $ACW_1$, $ACW_2$, . . . , $ACW_n$) to selectively engage a subset of DPA cells (or, put another way, a subset of DPA cell pairs) of the pluralities of DPA cells 406, 408. In some embodiments, the selectively engaged subset of DPA cells of the plurality of DPA cells 406 is configured to contribute to a combined amplified modulated carrier signal $V_{OUTa}$, shown at the plus (+) input of an inductor 416 of a balun 414. In some embodiments, the selectively engaged subset of DPA cells of the plurality of DPA cells 408 is configured to contribute to a (e.g., parallel) combined amplified modulated carrier signal $V_{OUTb}$, shown at the minus (−) input of an inductor of the balun 414.

In the example of FIG. 4, the balun 414 includes a primary coil inductor 416 that is configured to receive the DPA 400 output signals $V_{OUTa}$ and $V_{OUTb}$ as an input signal, and a secondary coil inductor 418. The inductor 418 may have a switchable path to ground via a switch 420. In some embodiments, switch 420 may be implemented by a MOSFET, such as, e.g., a PMOS transistor. The inductor 418 is connected to antenna 422. In some embodiments, the inductor 418 may have intervening signal harmonic traps between the inductor 418 and the antenna 422. In some embodiments, the signal harmonic trap 424 may be an "H3 trap" or a "third harmonic trap" from the inductor 418 to ground. In some embodiments, the signal harmonic trap 426 may be an "H2 trap" or a "second harmonic trap" placed between the inductor 418 and the antenna 422. In some embodiments, the signal harmonic trap 424 may be implemented using a capacitor and an inductor in series, and the signal harmonic trap 426 may, e.g., be separately implemented using a capacitor and an inductor in series. In some embodiments, the H2 and H3 traps are intended to reduce second (and possibly other higher order even harmonics) and third order harmonics (and possibly other higher order odd harmonics) in the output from the balun 414.

In some embodiments, the combined amplified modulated carrier signal $V_{OUTa}$ is a sum of all of the amplified modulated carrier signals $V_{OUTa1}$, $V_{OUTa2}$, . . . , $V_{OUTan}$. In some embodiments, the (e.g., parallel) combined amplified modulated carrier signal $V_{OUT}b$ is a sum of all of the amplified modulated carrier signals $V_{OUTb1}$, $V_{OUTb2}$, . . . , $V_{OUTbn}$. In some embodiments, the amplified modulated carrier signals that meaningfully contribute to a magnitude of the combined amplified modulated carrier signal $V_{OUTa}$, $V_{OUTb}$ are those amplified modulated carrier signals from the selectively engaged subset of DPA cells, e.g., those DPA cells that have been engaged by the respective ACW signal bits received at those DPA cells. For example, a non-engaged DPA cell (or pair of DPA cells) may contribute no signal magnitude to the respective combined amplified modulated carrier signals $V_{OUTa}$, $V_{OUTb}$.

In some embodiments, according to the example DPA 400 of FIG. 4, the combined amplified modulated carrier signal $V_{OUTa}$ has a phase determined by the phase modulated carrier signal $PH_a$ and has an amplitude determined by a size of the selectively engaged subset of DPA cells of the plurality of DPA cells 406 of bank 402. In some embodiments, according to the example DPA 400 of FIG. 4, the combined amplified modulated carrier signal $V_{OUTb}$ has a phase determined by the phase modulated carrier signal PHb and has an amplitude determined by a size of the selectively engaged subset of DPA cells of the plurality of DPA cells 408 of bank 404.

In some embodiments, each amplified modulated carrier signal $V_{OUTa1}$, $V_{OUTa2}$, . . . , $V_{OUTan}$ generated by the plurality of DPA cells 406 and each parallel amplified modulated carrier signal $V_{OUTb1}$, $V_{OUTb2}$, . . . , $V_{OUTbn}$ generated by the plurality of DPA cells 408 has a duty cycle of approximately 50 percent, when the particular DPA cells 406, 408 are engaged and outputting modulated signal information.

In some embodiments, the combined amplified modulated carrier signals $V_{OUTa}$ and $V_{OUTb}$ each have duty cycles of approximately 50 percent. In some embodiments, the combined amplified modulated carrier signals $V_{OUTa}$ and $V_{OUTb}$ from the banks 402, 404 of the DPA 400 are 180 degrees out of phase with one another but are otherwise approximately identical.

In some embodiments, the plurality of DPA cells 406 of the first bank 402 of the DPA 400 may be configured to generate a combined amplified modulated carrier signal, e.g., $V_{OUTa}$. In some embodiments, the plurality of parallel DPA cells 408 of the second bank 404 of the DPA 400 may be configured to generate a parallel combined amplified modulated carrier signal, e.g. $V_{OUTb}$. In some embodiments, the combined amplified modulated carrier signal has a phase determined by the phase modulated carrier signal (e.g., $PH_a$, received at the plurality of DPA cells 406). In some embodiments, the parallel combined amplified modulated carrier signal $V_{OUTb}$ has a parallel phase determined by the another phase modulated carrier signal (e.g., $PH_b$, received at the plurality of parallel DPA cells 408). In some embodiments, the parallel combined amplified modulated carrier signal is 180 degrees out of phase with the combined amplified modulated carrier signal. In some embodiments, each of the combined amplified modulated carrier signals (e.g., $V_{OUTa}$, $V_{OUTb}$) have a 50 percent duty cycle, e.g., when the particular DPA cells of the pluralities of cells 406, 408 are engaged and outputting modulated signal information.

In some embodiments, an example polar transmitter includes a balun (such as balun 414 of FIG. 4) coupled to the DPA (e.g., DPA 400 of FIG. 4). In some embodiments, the balun may include an inductive load (e.g., an inductor 416 of the balun 414). The inductive load may, e.g., be configured to receive, and to supply a differential amplified modulated carrier signal output from, (a) a combined amplified modulated carrier signal (e.g., $V_{OUTa}$) from the plurality of DPA cells 406 and (b) a parallel combined amplified modulated carrier signal (e.g., $V_{OUTb}$) from the plurality of parallel DPA cells 408.

Returning to the concept of pairs of parallel amplifier cells as indicated by the dotted lined boxes of the DPA 400 in FIG. 4 ($DPA_{a1}$ 406a1 and $DPA_{b1}$ 408b1 (first pair), $DPA_{a2}$ 406a2 and $DPA_{b2}$ 408b2 (second pair), . . . , $DPA_{an}$ 406an and $DPA_{bn}$ 408bn (nth pair)), in some embodiments particular pairs of amplifier cells may be configured to operate and process signals in a dual manner. As one illustrative non-limiting example using an example amplifier cell pair and example input signal configurations in accordance with some embodiments, taking the nth pair of DPA cells $DPA_{an}$ 406an and $DPA_{bn}$ 408bn, each of the two DPA cells may be implemented identically and may be configured to process the same signal in substantially the same way. According the example, the DPA cell $DPA_{an}$ 406an receives a phase modulated carrier signal $PH_a$, while the DPA cell $DPA_{bn}$ 408bn receives a phase modulated carrier signal PHb that is, e.g., 180 degrees out of phase with $PH_a$ but is otherwise approximately identical. In some embodiments, the nth pair of cells $DPA_{an}$ 406an, $DPA_{bn}$ 408bn are configured to be turned on or off together and enabled or disabled together and are selectively engaged or disengaged together as ultimate contributors to their respective combined amplitude modulated carrier signal. As such, and further according to the example, each of $DPA_{an}$ 406an and $DPA_{bn}$ 408bn receives the same enable signal $DPA_{ON}$ and each cell of the nth pair is configured to be enabled or disabled (e.g., turned off) by the enable signal $DPA_{ON}$ together with its paired parallel cell. Further according to the example, the nth pair of cells $DPA_{an}$ 406an, $DPA_{bn}$ 408bn receives the same ACW signal bit $ACW_n$ of the n-bit ACW signal such that each cell of the nth pair is configured to be selectively engaged or disengaged by the ACW signal bit $ACW_n$ together with its paired parallel cell. Finally, further according to the example, when the nth pair is selectively engaged by the ACW signal bit ACW. the nth pair of cells are each configured to contribute respectively amplified modulated carrier signals $V_{OUTan}$, $V_{OUTbn}$ (which are, e.g., 180 degrees out of phase with one another but are otherwise approximately identical with a 50 percent duty cycle) at respective outputs 410an, 412bn to respective combined amplified modulated carrier signals $V_{OUTa}$, $V_{OUTb}$ (which are, e.g., 180 degrees out of phase with one another but are otherwise approximately identical with a 50 percent duty cycle, according to the example).

Figure 5:
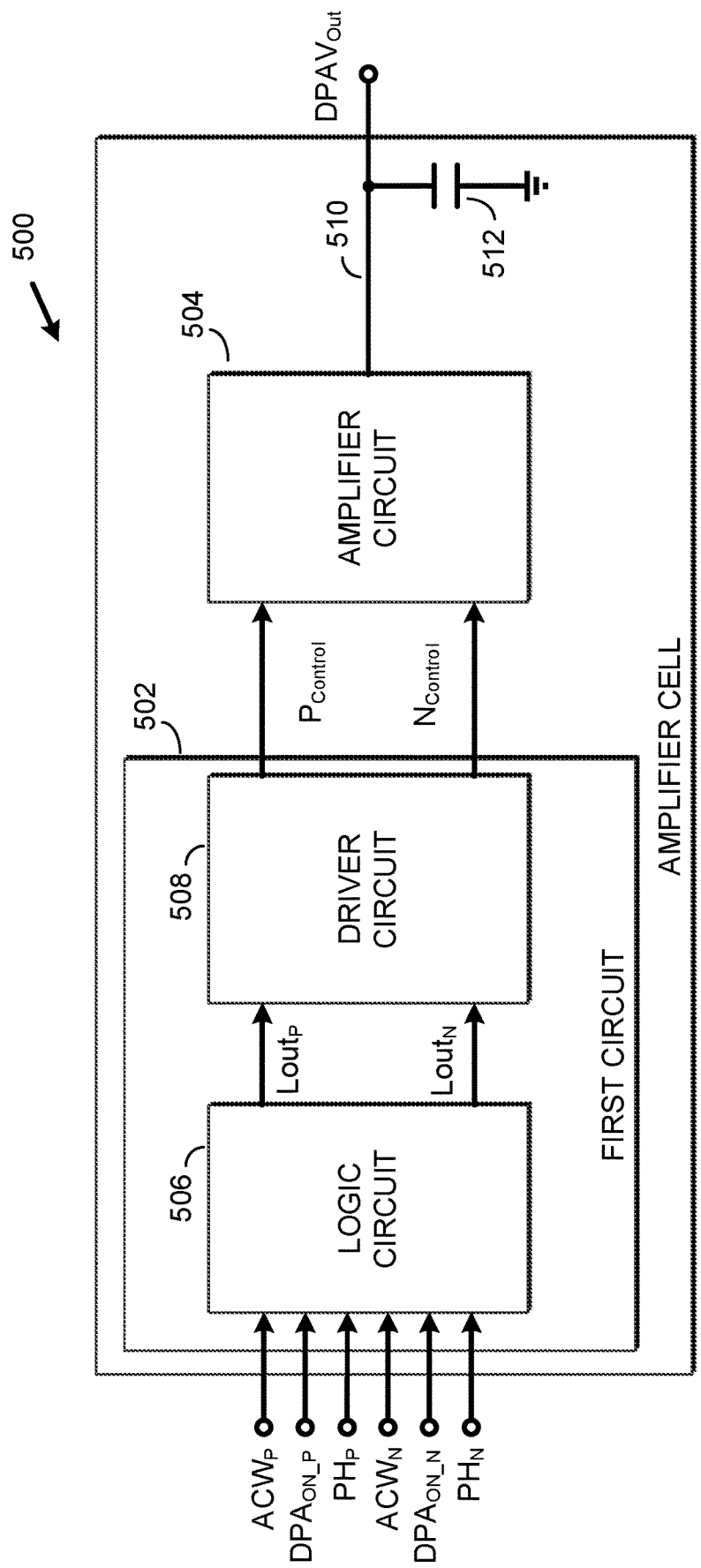
FIG. 5 is a block diagram of an example amplifier cell in accordance with some embodiments.

FIG. 5 is a block diagram of an example amplifier cell 500 in accordance with some embodiments. The amplifier cell 500 may be a digital power amplifier cell 500. The DPA cell 500 is an example implementation of, e.g., a DPA cell of the pluralities of DPA cells 406, 408 of FIG. 4 in accordance with some embodiments. The DPA cell 500 is an example implementation of, e.g., one or more DPA cells of, e.g., the power amplifier circuitry 206 of FIG. 2 or the power amplifier circuitry 306 shown in FIG. 3 in accordance with some embodiments. According to the example shown in FIG. 5, the DPA cell 500 includes a first circuit 502, an amplifier circuit 504, and a load capacitor 512 at an output 510 of the amplifier circuit 504 and the DPA cell 500. The load capacitor 512 may be internal to the DPA cell 500 (as shown in FIG. 5) or external. While the load capacitor 512 is shown as internal to the DPA cell 500 in FIG. 5, in some embodiments, the load capacitor 512 (and any other associated load circuitry, e.g., one or more other capacitors, one or more inductors, etc., if any) may be external to the DPA cell 500. According to the example, the first circuit 502 includes a logic circuit 506 and a driver circuit 508.

As shown in FIG. 5, the example DPA cell 500 may receive DPA control signals, e.g., a bit from an ACW signal, an enable signal $DPA_{ON}$, and a phase modulated carrier signal PH. In some embodiments, the particular example DPA cell 500 may receive more than one of each of these DPA control signals. For example, in some embodiments, two versions of each of these types of DPA control signals, having different voltage ranges, may be provided to the particular example DPA cell 500. The different voltage ranges on the DPA control signals, e.g., ACW, $DPA_{ON}$, and PH may be provided by using level shifting circuitry (not shown in FIG. 5) prior to the particular example DPA cell 500.

In some embodiments, the DPA cell 500 (and, e.g., each of the first circuit 502 (including, e.g., logic circuit 506 and driver circuit 508) and the amplifier circuit 504) receives supply voltages VDD (e.g., 3 volts (V)), VSS (e.g., 0V), and VDD/2 (e.g., 1.5V). In some embodiments, voltage ranges and signal levels of the DPA control signals may be impacted by, e.g., circuit designs of the DPA cell 500, the first circuit 506, and the amplifier circuit 504, values of local supply voltages available to the DPA cell 500, and the like. For example, in some embodiments, the DPA cell 500 may be configured to receive pairs of DPA control signals with respective different voltages ranging from, e.g., VDD to VDD/2 (e.g., 3V to 1.5V) and VDD/2 to VSS (e.g., 1.5V to 0V).

In some embodiments, the DPA cell 500 (and, e.g., in particular the logic circuit 506 of the first circuit 502) may be configured to receive a pair of phase modulated carrier signals $PH_P$, $PH_N$, a pair of enable signals $DPA_{ON\_P}$, $DPA_{ON\_N}$, and a pair of ACW signals $ACW_P$, $ACW_N$ (e.g., signals representing a "bit" from an ACW signal, where the "bit" corresponds to the DPA cell 500). These pairs of DPA control signals are example implementations that respectively correspond to the ACW signal bits $ACW_1$, $ACW_2$, . . . , $ACW_n$ the enable signal $DPA_{ON}$ and the phase modulated carrier signals $PH_a$, $PH_b$ for a given particular DPA cell 406, 408 of FIG. 4.

Figure 6:
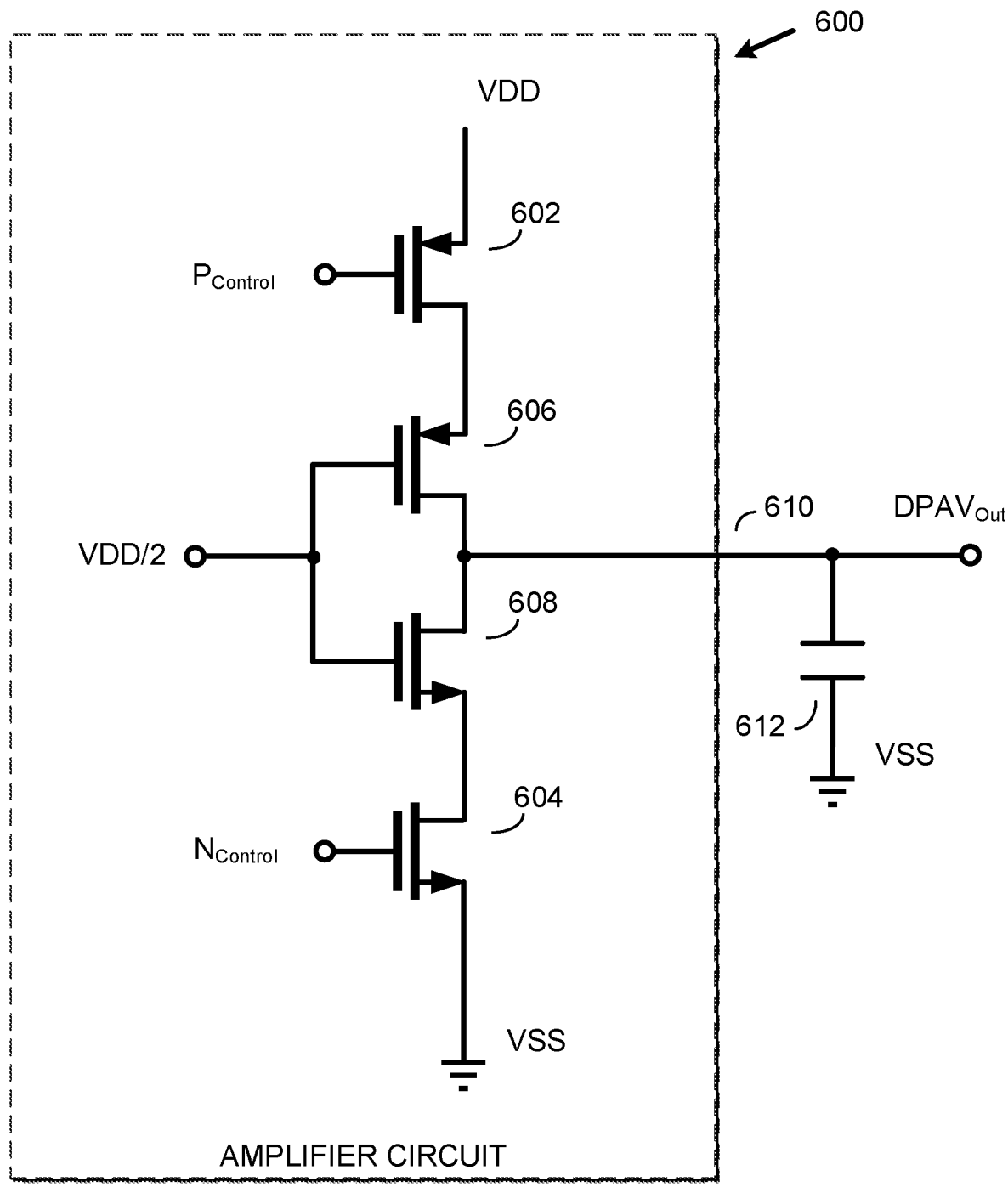
FIG. 6 is a depiction of an example amplifier circuit of a digital power amplifier cell in accordance with some embodiments.
Figure 7:
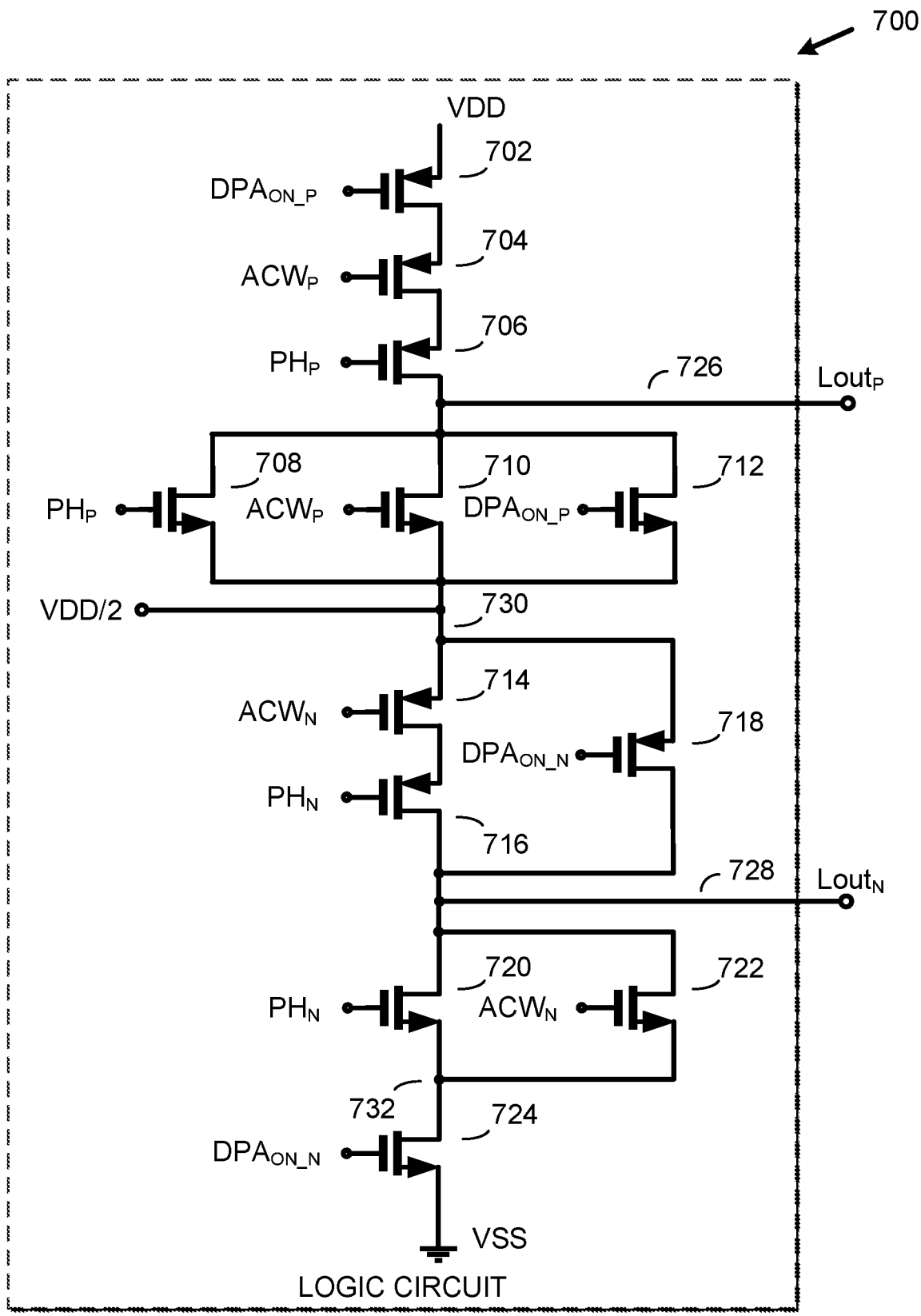
FIG. 7 is a depiction of an example logic circuit of a digital power amplifier cell in accordance with some embodiments.
Figure 8:
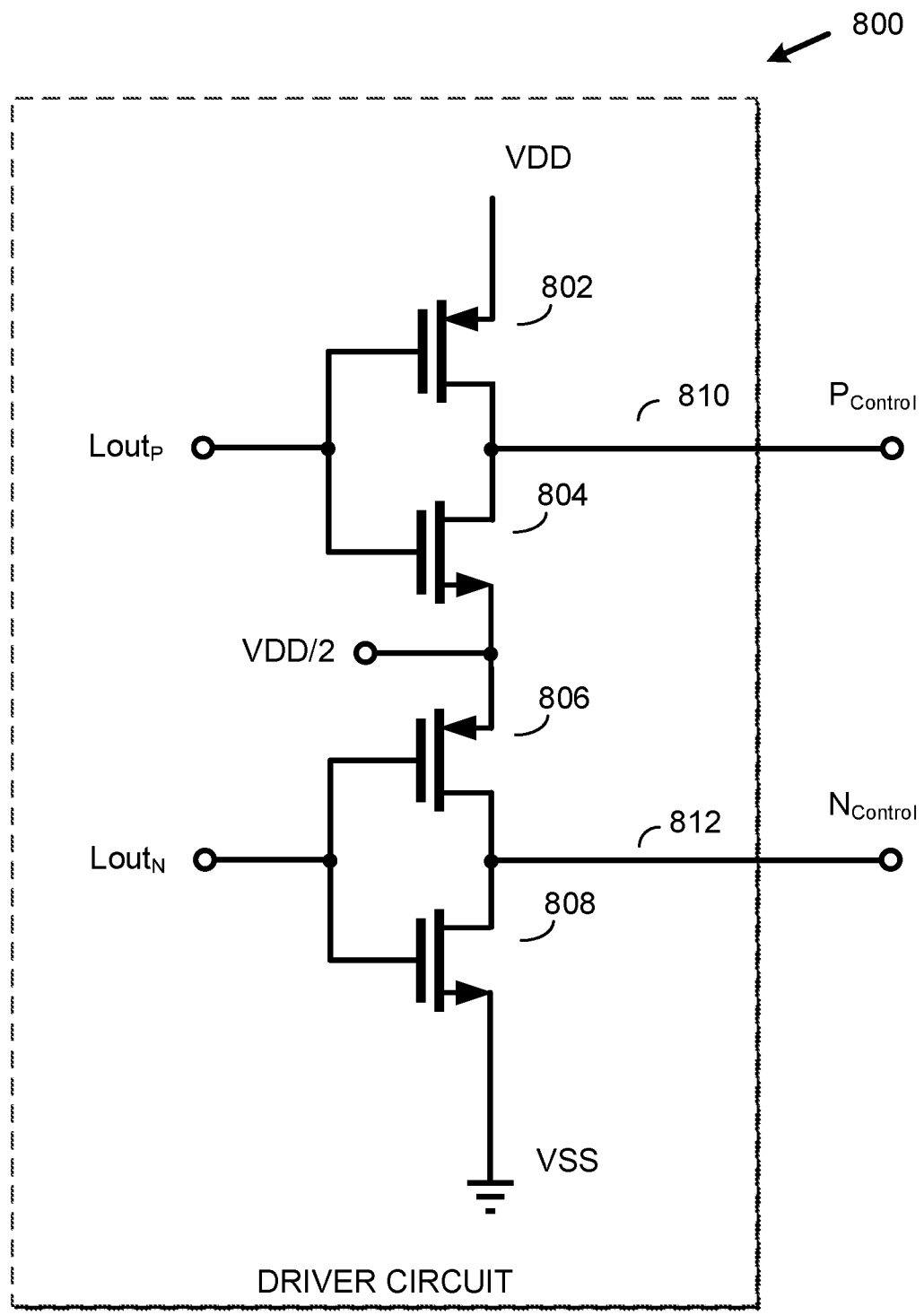
FIG. 8 is a depiction of an example driver circuit of a digital power amplifier cell in accordance with some embodiments.
Figure 9A:
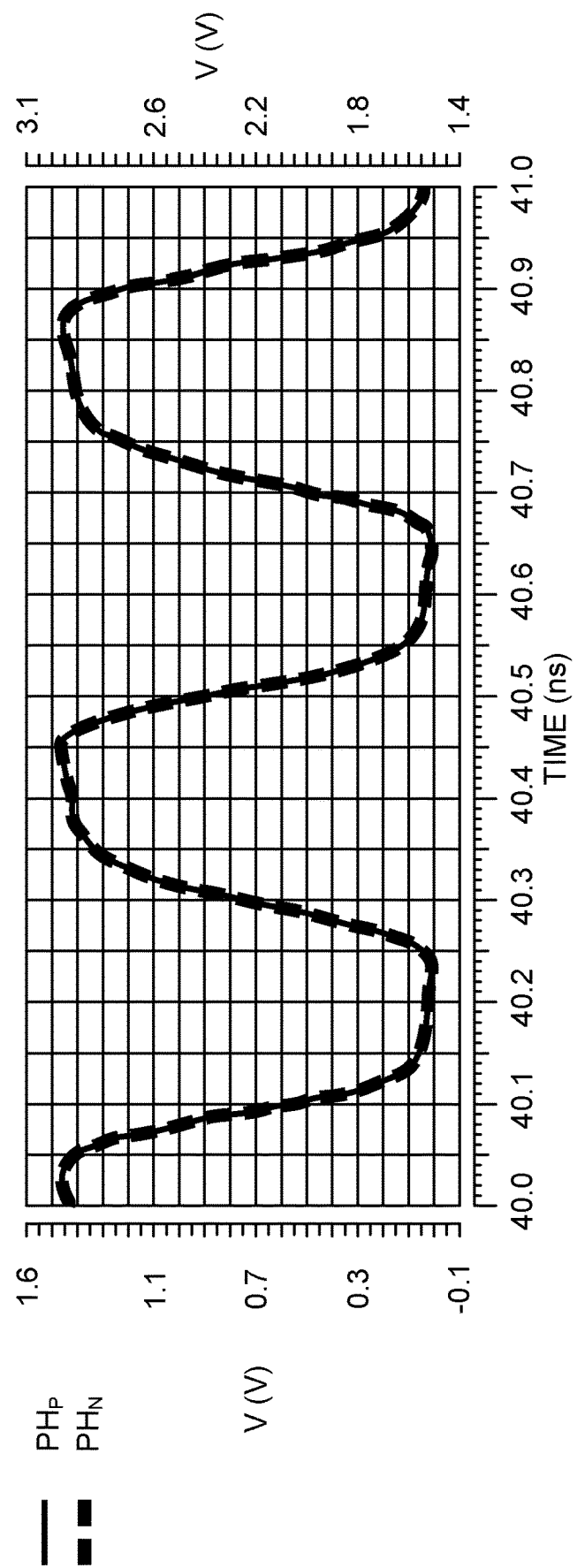
FIGS. 9A-9D are example signal diagrams for various input and output signals of the various circuits of the digital power amplifier cell in accordance with some embodiments.
Figure 9B:
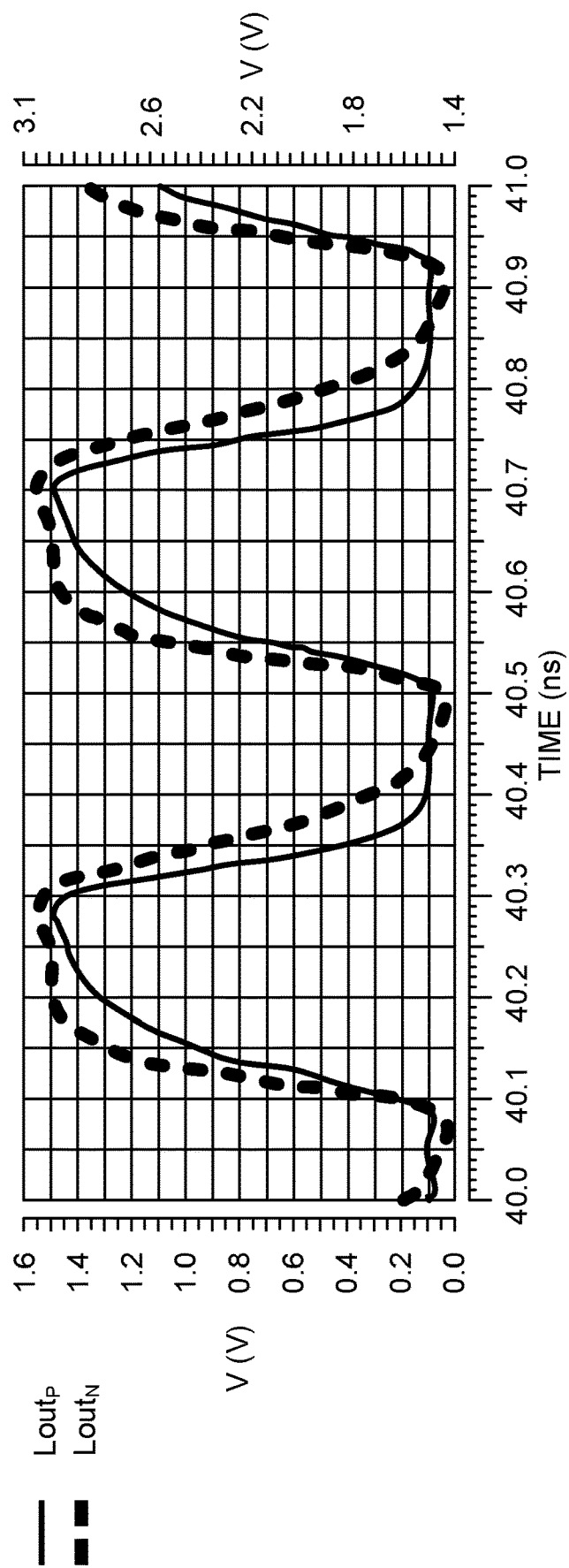
Figure 9C:
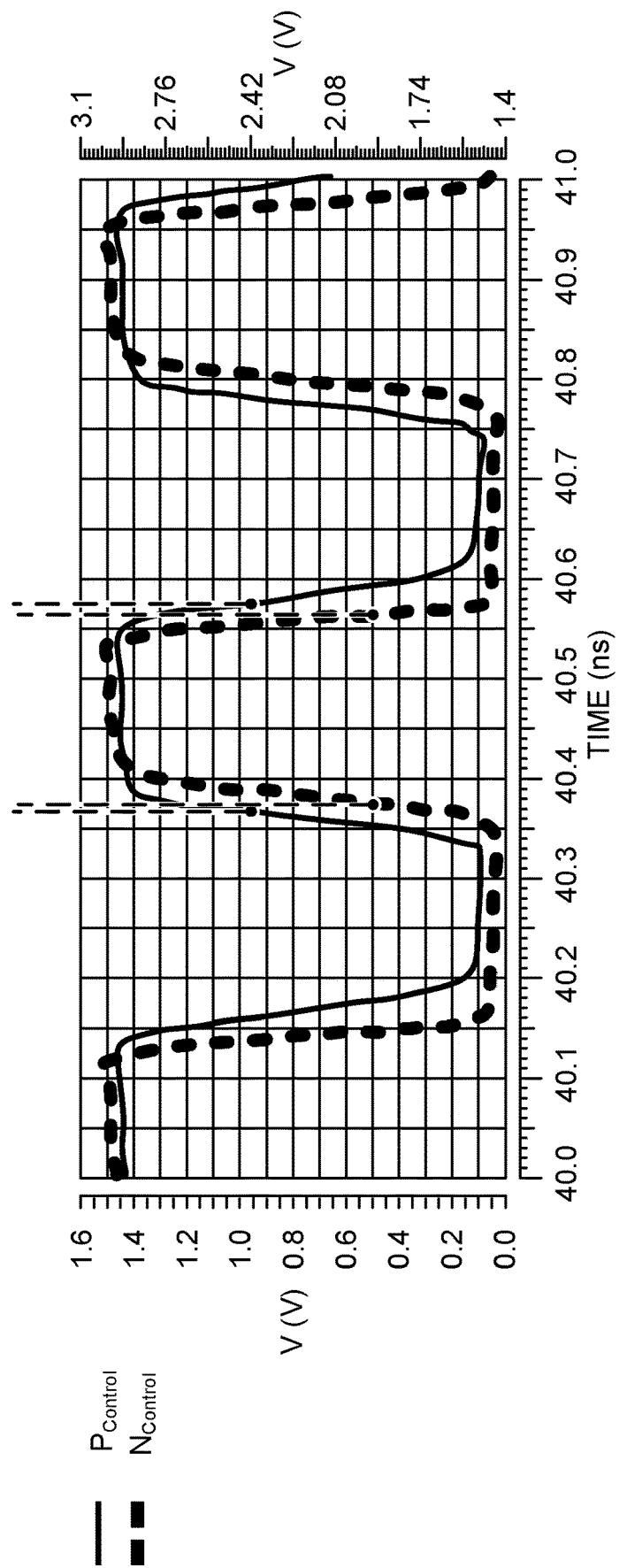
Figure 9D:
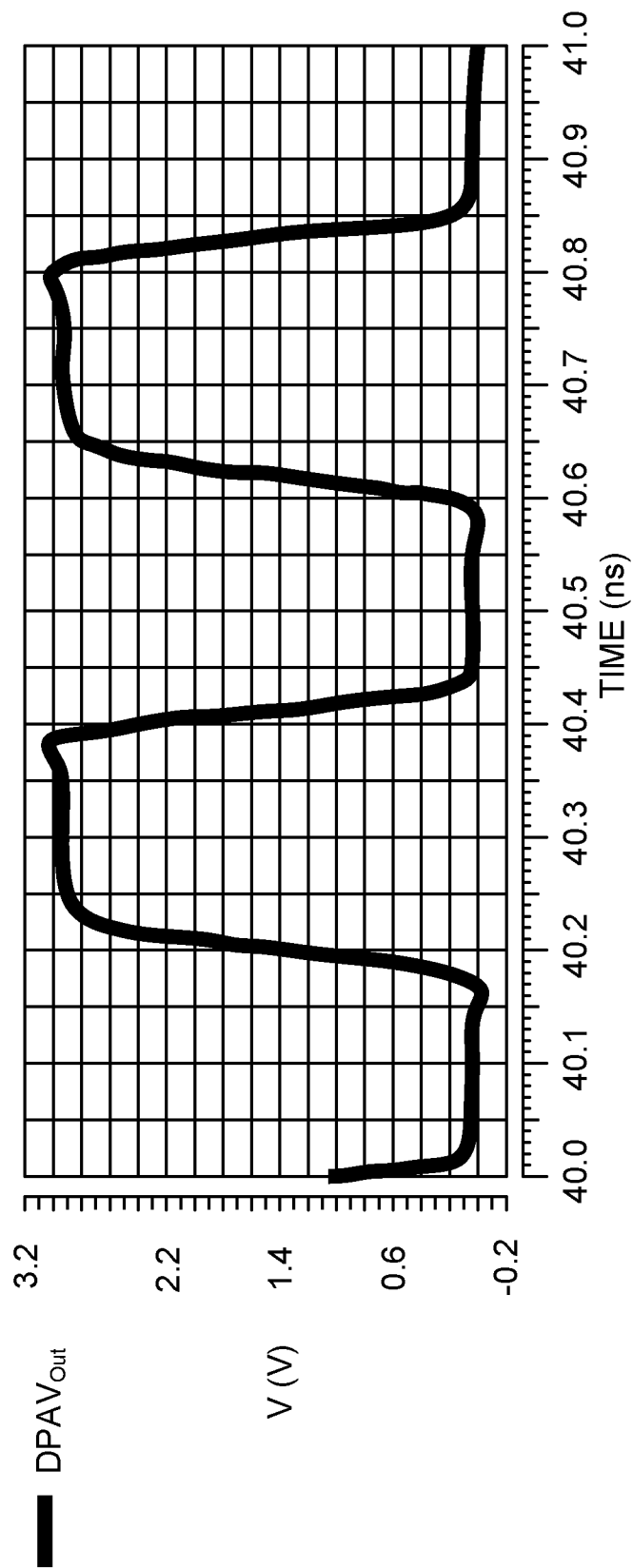

According to the example DPA cell 500 of FIG. 5, the logic circuit 506 (and thus the first circuit 502) may be configured to receive the DPA control signals $PH_P$, $PH_N$, $DPA_{ON\_P}$, $DPA_{ON\_N}$, $ACW_P$, $ACW_N$. An example implementation of the logic circuit 506 in accordance with some embodiments is shown in FIG. 7, discussed below. Some example simulated signal waveforms of phase modulated carrier signals $PH_P$, $PH_N$ are shown in FIG. 9A, discussed below. The logic circuit 506 of the first circuit 502 may be configured to generate a first logic signal $Lout_P$ and a second logic signal $Lout_N$. Some example simulated signal waveforms of logic signals $Lout_P$ and $Lout_N$ are shown in FIG. 9B, discussed below. The driver circuit 508 of the first circuit 502 may be configured to receive the first and second logic signals $Lout_P$ and $Lout_N$. An example implementation of the driver circuit 508 in accordance with some embodiments is shown in FIG. 8, discussed below. The driver circuit 508 (and thus the first circuit 502) may be configured to generate a PMOS control signal $P_{Control}$ and an NMOS control signal $N_{Control}$. Some example simulated signal waveforms of PMOS and NMOS control signals $P_{Control}$, $N_{Control}$ are shown in FIG. 9C, discussed below. The amplifier circuit 502 may be configured to receive the PMOS control signal $P_{Control}$ and the NMOS control signal $N_{Control}$ from the first circuit 502 and may be further configured to generate an amplified modulated carrier signal $DPAV_{Out}$ at output 510. An example implementation of the amplifier circuit 504 in accordance with some embodiments is shown in FIG. 6, discussed below. An example simulated signal waveform of an amplified modulated carrier signal $DPAV_{Out}$ is shown in FIG. 9D, discussed below.

In some embodiments, the DPA cell 500 may be configured to receive a first phase modulated carrier signal $PH_P$ and a second phase modulated carrier signal $PH_N$. The logic circuit 506 of the first circuit 502 may be configured to receive the signals $PH_P$, $PH_N$. In some embodiments, the phase modulated carrier signals $PH_P$ and $PH_N$ may be outputs of a phase tree multiplexer selected by the digitally controlled oscillator (DCO) 204 of FIG. 2 or the DCO 304 of FIG. 3, following processing of the initial digital phase signal $\varphi_{in}$ as in, e.g., FIGS. 2 and 3.

In some embodiments, depending on, e.g., a particular design of the logic circuit 506 and other circuitry of the DPA cell 500, the phase modulated carrier signals $PH_P$ and $PH_N$ have different voltage ranges but may be otherwise identical. In some embodiments, the phase modulated carrier signals $PH_P$, $PH_N$ include the modulation information relating to the phase of the signal to be amplified by the DPA cell 500.

In some embodiments, the DPA cell 500 may be configured to receive a first enable signal $DPA_{ON\_P}$ and a second enable signal $DPA_{ON\_N}$. The logic circuit 506 of the first circuit 502 may be configured to receive the enable signals $DPA_{ON\_P}$ and $DPA_{ON\_N}$. In some embodiments, depending on, e.g., a particular design of the logic circuit 506, the enable signals $DPA_{ON\_P}$ and $DPA_{ON\_N}$ are configured to turn the DPA cell 500 on or off.

In some embodiments, the enable signals $DPA_{ON\_P}$ and $DPA_{ON\_N}$ have different voltage ranges, but the enable signals may be logically inverted versions of one another.

In some embodiments, the DPA cell 500 may be configured to receive a first ACW signal $ACW_P$ and a second ACW signal $ACW_N$ (e.g., signals representing a "bit" from an ACW signal, where the "bit" corresponds to the DPA cell 500). The logic circuit 506 of the first circuit 502 may be configured to receive the ACW signals $ACW_P$ and $ACW_N$. In some embodiments, depending on, e.g., a particular design of the logic circuit 506, the ACW signals $ACW_P$ and $ACW_N$ are operative to contribute to setting a gain of a DPA (e.g., DPA 400) by, e.g., selectively engaging or selectively disengaging a particular DPA cell 500. ACW signal "bits" as part of a thermometer code (an n-bit ACW signal) that is made of up on n separate individual bits configured to turn individual selected DPA cells on or off, are discussed in more detail above with respect to, e.g., FIG. 4.

In some embodiments, the ACW signals $ACW_P$ and $ACW_N$ are derived from and represent variations of the same signal "bit" (of the n-bit ACW signal) that operates to selectively engage or disengage the DPA cell 500. In some embodiments, the ACW signal $ACW_P$ and $ACW_N$ have different voltage ranges but may be otherwise identical.

In the example DPA cell 500 of FIG. 5, the DPA cell 500 is configured to generate an amplified modulated carrier signal $DPAV_{Out}$ at the output 510 of the DPA cell 500. This amplified modulated carrier signal $DPAV_{Out}$ is an example implementation that corresponds to the amplified modulated carrier signals $V_{OUTa1}$, $V_{OUTa2}$, . . . , $V_{OUTan}$ (for the first bank 402 of n DPA cells) and $V_{OUTb1}$, $V_{OUTb2}$, . . . , $V_{OUTbn}$ (for the second bank 404 of n DPA cells) according to the example DPA 400 of FIG. 4.

In some embodiments, assuming that the DPA cell 500 is enabled by the first and second enable signal $DPA_{ON\_P}$ and $DPA_{ON\_N}$, the DPA cell 500 may be selectively engaged by a bit of an ACW signal (e.g., represented in the DPA cell 500 by a pair of ACW signals $ACW_P$ and $ACW_N$) and is configured to contribute the modulated carrier signal $DPAV_{Out}$ to e.g., a combined amplified modulated carrier signal (e.g., $V_{OUTa}$ or $V_{OUTb}$ of FIG. 4).

FIG. 6 is a depiction of an example amplifier circuit 600 of a digital power amplifier cell (e.g., DPA cell 500) in accordance with some embodiments. The amplifier circuit 600 is an example implementation of, e.g., the amplifier circuit 504 (of the first circuit 502) of FIG. 5 using metal-oxide-semiconductor field-effect transistors ("MOSFETs", p-type and n-type) in accordance with some embodiments. The p-type and n-type MOSFETs may be used in digital complementary metal-oxide-semiconductor (CMOS) logic circuits, as shown in, e.g., FIGS. 6-8. Of course, other MOSFET configurations as well as other transistors and circuit elements may be used.

According to the example of FIG. 6, the amplifier circuit 600 includes a PMOSFET transistor ("PMOS transistor", "PMOSFET", "NMOS") 602 configured to receive a control signal $P_{Control}$ at a gate input of the PMOS transistor 602 and an NMOSFET transistor ("NMOS transistor", "NMOSFET", "NMOS") 604 configured to receive a control signal $N_{Control}$ at a gate input of the NMOS transistor 604. In the example shown in FIG. 6, the amplifier circuit 600 further includes a second PMOS transistor 606 and a second NMOS transistor 608. A midpoint supply voltage (e.g., between VDD and VSS) VDD/2 is applied to the gates of the second PMOS transistor 606 and the second NMOS transistor 608. A load capacitor 612 (an example of the load capacitor 512 of FIG. 5) may be connected to an output 610 of the amplifier circuit 600 (e.g., analogously to the output 510 of the amplifier circuit 500 of FIG. 5). While the load capacitor 612 is shown as external to the amplifier circuit 600 in FIG.

6, in some embodiments, the load capacitor 612 (and any other associated load circuitry, e.g., one or more other capacitors, one or more inductors, etc., if any) may considered internal to the amplifier circuit 600. The amplifier circuit 600 is configured to generate an amplified modulated carrier signal $DPAV_{Out}$ at the output 610 of the amplifier circuit 600.

FIG. 7 is a depiction of an example logic circuit 700 of a digital power amplifier cell (e.g., DPA cell 500) in accordance with some embodiments. The logic circuit 700 is an example implementation of, e.g., the logic circuit 506 (of the first circuit 502) of FIG. 5 using MOSFETs in accordance with some embodiments.

According to the example of FIG. 7, the logic circuit 700 is configured to receive a pair of phase modulated carrier signals $PH_P$, $PH_N$, a pair of enable signals $DPA_{ON\_P}$, $DPA_{ON\_N}$, and a pair of ACW signals $ACW_P$, $ACW_N$ (e.g., signals representing a "bit" from an ACW signal, where the "bit" corresponds to the DPA cell 500), as described above with respect to FIG. 5.

The logic circuit 700 includes a top half configuration of MOSFETs (series PMOS transistors 706, 704, 702 and parallel NMOS transistors 708, 710, 712) configured to receive "P" DPA control signals $PH_P$, $ACW_P$, and $DPA_{ON\_P}$ at gates of the MOSFETs as shown in FIG. 7. The top half "P path" configuration of MOSFETs is configured to generate a first logic signal $Lout_P$ at an output node 726. The top half configuration of MOSFETs ("P path logic") has supply voltages between VDD (e.g., 3V) and VDD/2 (e.g., 1.5V), and, in some embodiments, the voltage range of the "P" DPA control signals $PH_P$, $ACW_P$, and $DPA_{ON\_P}$ is set accordingly between VDD and VDD/2. PMOS transistors 702, 704, 706 are in series with one another between the local "logic high" supply voltage VDD and the output node 726, while the NMOS transistors are in parallel with one another between the output node 726 and the local "logic low" supply voltage VDD/2 at a node 730.

The logic circuit 700 includes a bottom half configuration of MOSFETs (PMOS transistors 716, 714, 718 and NMOS transistors 720, 722, 724) configured to receive "N" DPA control signals $PH_N$, $ACW_N$, and $DPA_{ON\_N}$ at gates of the MOSFETs as shown in FIG. 7. The bottom half configuration of MOSFETs is configured to generate a second logic signal $Lout_N$ at an output node 728. The bottom half "N path" configuration of MOSFETs is connected to the top half "P path" configuration of MOSFETs at a midpoint supply voltage VDD/2 (e.g., 1.5V) at the node 730. The bottom half configuration of MOSFETs ("N path logic") has supply voltages between VDD/2 (e.g., 1.5V) and VSS (e.g., 0V), and in some embodiments, the voltage range of the "N" DPA control signals $PH_N$, $ACW_N$, and $DPA_{ON\_N}$ is set accordingly between VDD/2 and VSS. Series PMOS transistors 714, 716 are in parallel with PMOS transistor 718 between the local "logic high" supply voltage VDD/2 and the output node 728, while the parallel NMOS transistors 720, 722 are in series with NMOS transistor 724 at a node 732 and between the output node 728 and the local "logic low" supply voltage (ground) VSS.

In some embodiments, the logic circuit 700 (an example implementation of logic circuit 506 of the example DPA cell 500 of FIG. 5, in accordance with some embodiments) may be configured to receive a first phase modulated carrier signal $PH_P$ and a second phase modulated carrier signal $PH_N$.

In some embodiments, the phase modulated carrier signals $PH_P$, $PH_N$ include the modulation information relating to the phase of the signal to be amplified by the DPA cell 500.

In some embodiments, depending on, e.g., a particular design of the logic circuit 700, the phase modulated carrier signals $PH_P$ and $PH_N$ have different voltage ranges but may be otherwise identical. For example, the signal $PH_P$ may range from VDD to VDD/2 (e.g., 3V to 1.5V) and the signal $PH_N$ may range from VDD/2 to VSS (e.g., 1.5V to 0V). According to an example, the phase modulated carrier signals $PH_P$, $PH_N$ are identical such that when the first phase modulated carrier signal $PH_P$ is at logic low, the second phase modulated carrier signal $PH_N$ is at a logic low, and when $PH_P$ is at a logic high, $PH_N$ is at a logic high.

In some embodiments, the logic circuit 700 may be configured to receive a first enable signal $DPA_{ON\_P}$ and a second enable signal $DPA_{ON\_N}$. In some embodiments, depending on, e.g., a particular design of the logic circuit 700, the enable signals $DPA_{ON\_P}$ and $DPA_{ON\_N}$ are configured to turn the DPA cell 500 on or off.

In some embodiments, the enable signals $DPA_{ON\_P}$ and $DPA_{ON\_N}$ have different voltage ranges, but the enable signals may be logically inverted versions of one another. For example, the signal $DPA_{ON\_P}$ may range from VDD to VDD/2 (e.g., 3V to 1.5V) and the signal $DPA_{ON\_N}$ may range from VDD/2 to VSS (e.g., 1.5V to 0V), but, according to an example, the enable signals are logically inverted versions of one another such that when the first enable signal $DPA_{ON\_P}$ is at logic low, the second enable signal $DPA_{ON\_N}$ is at a logic high, and when $DPA_{ON\_P}$ is at a logic high, $DPA_{ON\_N}$ is at a logic low. In some embodiments, and further according to the example, the logic circuit 700 may be designed and configured such that the DPA cell 500 is turned "ON" when both of the following conditions are true: (1) the first enable signal $DPA_{ON\_P}$ is equal to VDD/2 (e.g., 1.5V, or a logic low) and (2) the second enable signal $DPA_{ON\_N}$ is equal to VDD/2 (e.g., 1.5V, or a logic high). Further according to the example, the logic circuit 700 may be designed and configured such that the DPA cell 500 is turned "OFF" when both of the following conditions are true: (1) the first enable signal $DPA_{ON\_P}$ is equal to VDD (e.g., 3V, or a logic high) and (2) the second enable signal $DPA_{ON\_N}$ is equal to VSS (e.g., 0V, or a logic low).

In some embodiments, the logic circuit 700 may be configured to receive a first ACW signal $ACW_P$ and a second ACW signal $ACW_N$ (e.g., signals representing a "bit" from an ACW signal, where the "bit" corresponds to the DPA cell 500). In some embodiments, depending on, e.g., a particular design of the logic circuit 700, the ACW signals $ACW_P$ and $ACW_N$ are operative to contribute to setting a gain of a DPA (e.g., DPA 400) by, e.g., selectively engaging or selectively disengaging a particular DPA cell 500. ACW signal "bits" as part of a thermometer code (an n-bit ACW signal) that is made of up on n separate individual bits configured to turn individual selected DPA cells on or off, are discussed in more detail above with respect to, e.g., FIG. 4.

In some embodiments, the ACW signals $ACW_P$ and $ACW_N$ are derived from and represent variations of the same signal "bit" (of the n-bit ACW signal) that operates to selectively engage or disengage the DPA cell 500. In some embodiments, the ACW signal $ACW_P$ and $ACW_N$ have different voltage ranges but may be otherwise identical. For example, the signal $ACW_P$ may range from VDD to VDD/2 (e.g., 3V to 1.5V) and the signal $ACW_N$ may range from VDD/2 to VSS (e.g., 1.5V to 0V). According to an example, the ACW signals $ACW_N$, $ACW_P$ are identical such that when the first ACW signal $ACW_P$ is at logic low, the second ACW signal $ACW_N$ is at a logic low, and when $ACW_P$ is at a logic high, $ACW_N$ is at a logic high. In some embodiments, and further according to the example, the logic circuit 700 may be designed and configured such that the DPA cell 500, once the DPA cell 500 is enabled by the first and second enable signals $DPA_{ON\_P}$ and $DPA_{ON\_N}$, is (A) selectively engaged by the ACW signals when both of the following conditions are true: (1) the first ACW signal $ACW_P$ is equal to VDD/2 (e.g., 1.5V, or a logic low) and (2) the second ACW signal $ACW_N$ is equal to VSS (e.g., 0V, or a logic low); and is (B) selectively disengaged by the ACW signals when both of the following conditions are true: (1) the first ACW signal $ACW_P$ is equal to VDD (e.g., 3V, or a logic high) and (2) the second ACW signal $ACW_N$ is equal to VDD/2 (e.g., 1.5V, or a logic high).

FIG. 8 is a depiction of an example driver circuit 800 of a digital power amplifier cell (e.g., DPA cell 500) in accordance with some embodiments. The driver circuit 800 is an example implementation of, e.g., the driver circuit 508 of FIG. 5 using MOSFETs in accordance with some embodiments.

According to the example of FIG. 8, the driver circuit 800 includes (on a top half, "P path") a first CMOS inverter that includes a PMOS transistor 802 and an NMOS transistor 804 and that is configured to receive a first logic signal $Lout_P$ at the gate inputs of the PMOS and NMOS transistors 802, 804. The CMOS inverter formed by transistors 802, 804 is configured to generate a PMOS control signal $P_{Control}$ at an output node 810. The first CMOS inverter (PMOS and NMOS transistors 802, 804, "P path driver") has supply voltages between VDD (e.g., 3V) and VDD/2 (e.g., 1.5V), and, in some embodiments, the voltage range of the first logic signal $Lout_P$ is set accordingly between VDD and VDD/2.

Further according to the example of FIG. 8, the driver circuit 800 further includes (on a bottom half, "N path") a second CMOS inverter that includes a PMOS transistor 806 and an NMOS transistor 808 and that is configured to receive a second logic signal $Lout_N$ at the gate inputs of the PMOS and NMOS transistors 806, 808. The CMOS inverter formed by transistors 806, 808 is configured to generate an NMOS control signal $N_{Control}$ at an output node 812. The second CMOS inverter (PMOS and NMOS transistors 806, 808, "N path driver") has supply voltages between VDD/2 (e.g., 1.5V) and VSS (e.g., 0V), and, in some embodiments, the voltage range of the second logic signal $Lout_N$ is set accordingly between VDD/2 and VSS.

In some embodiments, the "P path logic" and "P path driver" circuits of logic circuit 700 of FIG. 7 and driver circuit 800 of FIG. 8, respectively, are so named because signals proceeding along this "P path" are configured to ultimately generate the PMOS control signal $P_{Control}$ that, in the example amplifier circuit 600 of FIG. 6, is received at the gate input of the PMOS transistor 602 of amplifier circuit 600. Thus, in some embodiments, the "P path logic" and "P path driver" circuits are designed and configured to control the PMOS transistor 602 of the amplifier circuit 600. In some embodiments, control of the PMOS transistor 602 may include, e.g., ensuring that the PMOS transistor 602 does not simultaneously conduct with the NMOS transistor 604 of FIG. 6 (with control of this NMOS transistor 604 proceeding simultaneously and in parallel by signals processed through "N path logic" and "N path driver" circuits).

In some embodiments, the "N path logic" and "N path driver" circuits of logic circuit 700 of FIG. 7 and driver circuit 800 of FIG. 8, respectively, are so named because signals proceeding along this "N path" are configured to ultimately generate the NMOS control signal $N_{Control}$ that, in the example amplifier circuit 600 of FIG. 6, is received at the gate input of the NMOS transistor 604 of amplifier circuit 600. Thus, in some embodiments, the "N path logic" and "N path driver" circuits are designed and configured to control the NMOS transistor 604 of the amplifier circuit 600. In some embodiments, control of the NMOS transistor 604 may include, e.g., ensuring that the NMOS transistor 604 does not simultaneously conduct with the PMOS transistor 602 of FIG. 6 (with control of this PMOS transistor 602 proceeding simultaneously and in parallel by signals processed through "P path logic" and "P path driver" circuits).

In some embodiments, a logic circuit such as the example logic circuit 700 may be used to control one or more phase modulated carrier signals (e.g., the phase modulated carrier signals $PH_P$, $PH_N$) using e.g., one or more enable signals (e.g., enable signals $DPA_{ON\_P}$, $DPA_{ON\_N}$) and, e.g., one or more ACW signals (e.g., ACW signals $ACW_P$, $ACW_N$. In some embodiments, a logic circuit such as the example logic circuit 700 may be used to generate and configure non-overlapping PMOS and NMOS transistors (e.g., transistors that do not simultaneously conduct, that are not "on" at the same time) in a subsequent amplifier circuit such as example amplifier circuit 600.

In some embodiments, a driver circuit such as the example driver circuit 800 may be used to strengthen and reshape one or more phase modulated carrier signals (e.g., strengthening and reshaping e.g., one or more logic signals, e.g., $Lout_P$, $Lout_N$ that were, e.g., enabled and converted by a logic circuit from the phase modulated carrier signals $PH_P$, $PH_N$ into one or more control signals, e.g., PMOS and NMOS control signals $P_{Control}$, $N_{Control}$) prior to an amplifier stage (e.g., an amplifier circuit such as the example amplifier circuit 600).

In some embodiments, an amplifier circuit such as the example amplifier circuit 600 may be used to provide a full swing output voltage (e.g., from VDD to VSS, e.g., 3V to 0V) and to drive an output capacitor such as the load capacitor 612.

Example Design Objectives

In some embodiments, a DPA, including, e.g., one or more pluralities of DPA cells making up the DPA (for example, DPA cell 500 of FIG. 5 as an example implementation of DPA cells within the DPA 400 of FIG. 4) may be configured to process signals to achieve one or more simultaneous objectives.

In some embodiments, one design objective may include reducing or minimizing wasted current in a DPA cell and in the larger DPA to increase efficiency in the DPA.

In some embodiments, one design objective may include maximizing output power from the DPA and reducing signal harmonics of the combined amplified modulated carrier signals (e.g., $V_{OUTa}$ and $V_{OUTb}$) and reducing distortion on the signal output of the balun (such as balun 414), e.g., coupled to the DPA.

In some embodiments, both design objectives are pursued in, e.g., a DPA implementation.

For purposes of explanation of the example design objectives, example signals and example circuit implementations referring to, e.g., FIGS. 4-8 will be referenced as examples, but it should be understood other example signals and circuit implementations may be used to achieve one or more example design objectives.

Example design objective (in some embodiments): Reducing or minimizing wasted current by configuring transistors to not simultaneously conduct In some embodiments, a DPA cell (such as DPA cell 500) may be configured to prevent a PMOS transistor (such as PMOS transistor 602) and an NMOS transistor (such as NMOS transistor 604) in an amplifier circuit (such as amplifier circuit 600) of the DPA cell from conducting at the same time. In some embodiments, preventing the PMOS and NMOS transistors (e.g., 602, 604) in the amplifier circuit from simultaneously conducting avoids (or at least minimizes) "shoot through" current. In some embodiments, this shoot through current refers to current from conducting PMOS transistor(s) (e.g., 602, 606) through conducting NMOS transistor(s) (e.g., 604, 608) from supply to ground, e.g., VDD to VSS, and is effectively wasted current or "current loss." Such current is lost or "wasted" because such current does not serve or contribute to either charge or discharge a load capacitance (e.g., load capacitor 612 of FIG. 5) to a logic high or low and thus does not contribute to providing an amplified modulated carrier signal (e.g., $DPAV_{Out}$. In some embodiments, preventing the PMOS and NMOS transistors (e.g., 602, 604) in the amplifier circuit from being turned "on" at the same time promotes high (e.g., increased) efficiency of the DPA (e.g., 400) and DPA cell (e.g., DPA cell 500).

In some embodiments, a logic circuit (e.g., logic circuit 700) of the DPA cell may be designed and configured to (along with and by way of a driver circuit (e.g., driver circuit 800) of the DPA cell) ultimately generate PMOS and NMOS control signals (e.g., $P_{Control}$, $N_{Control}$, as output of the driver circuit) to respectively and separately control the PMOS and NMOS transistors (e.g., 602, 604) of the amplifier circuit of the DPA cell such that the PMOS and NMOS transistors 602, 604 do not conduct at the same time. In some embodiments, the separate control of the PMOS and NMOS transistors 602, 604 may be achieved, not only, by, e.g., using separate control signals $P_{Control}$, $N_{Control}$ for the PMOS and NMOS transistors to begin with, but also, e.g., by aligning the PMOS and NMOS control signals $P_{Control}$, $N_{Control}$ with respect to one another. In some embodiments, the PMOS and NMOS control signals may be aligned such that relative logic transitions of the signals are positioned so that, referring to the example amplifier circuit 600 of FIG. 6, e.g., (a) the PMOS transistor 602 turns off before the NMOS transistor 604 turns on (on a rising transition from logic low to logic high on the PMOS and NMOS control signals, the PMOS control signal $P_{Control}$ starts to rise before the NMOS control signal $N_{Control}$ and the two signals are aligned such that the PMOS control signal reaches the turnoff voltage (e.g., effective PMOS switching voltage, or $VDD-V_{tp}$ (e.g., 2.4V)) of the PMOS transistor 602 before the NMOS control signal reaches the turnon voltage (e.g., effective NMOS switching voltage, or $V_{tn}$-VSS (e.g., 0.5V)) of the NMOS transistor 604); and (b) the NMOS transistor 604 turns off before the PMOS transistor 602 turns on (on a falling transition from logic high to logic low on the PMOS and NMOS control signals, the NMOS control signal $N_{Control}$ starts to fall before the PMOS control signal $P_{Control}$ and the two signals are aligned such that the NMOS control signal reaches the turnoff voltage (e.g., effective NMOS switching voltage, or $V_{tn}$-VSS) of the NMOS transistor 604 before the PMOS control signal reaches the turnon voltage (e.g., effective PMOS switching voltage, or $VDD-V_{tp}$) of the PMOS transistor 602).

In some embodiments, and as discussed in more detail below, a logic circuit (see, e.g., logic circuit 700 of FIG. 7) prior to the driver circuit (e.g., driver circuit 800 of FIG. 8) provides differing relative rise and fall times on the logic signals (e.g., output from the logic circuit and input to the driver circuit; e.g., $Lout_P$ and $Lout_N$). In some embodiments, the differing relative rise and fall times of the logic signals as input to the driver circuit result in differences in alignment and in the duty cycles of the PMOS and NMOS control signals (e.g., $P_{Control}$, $N_{Control}$) generated by the driver circuit. In some embodiments, as discussed in more detail below, a design of the logic circuit (e.g., logic circuit 700) causes the differing rise and fall times and transistor sizing of the logic circuit may provide additional customization and fine tuning of the logic signals and thus the duty cycles of the PMOS and NMOS control signals output by the driver circuit.

In some embodiments, the PMOS control signal and the NMOS control signal (e.g., $P_{Control}$, $N_{Control}$) may have different duty cycles. In accordance with some embodiments, the PMOS control signal may have a duty cycle greater than a duty cycle of the NMOS control signal. In some embodiments, the logic high pulse width of the PMOS control signal may exceed the logic high pulse width of the NMOS control signal. In accordance with some embodiments, the PMOS control signal may have a duty cycle greater than 50 percent and the NMOS control signal may have a duty cycle less than 50 percent. In accordance with some embodiments, the PMOS control signal and the NMOS control signal may be configured to have duty cycles that allow for a non-overlapping percentage of time, e.g., a percentage of time that both PMOS and NMOS transistors (e.g., 602, 604) are off and not conducting. In some embodiments, the non-overlapping percentage of time may also refer to a difference between duty cycles of the PMOS and NMOS control signals $P_{Control}$, $N_{Control}$.

In some embodiments, a non-overlapping percentage of 5 percent may be used, resulting in a duty cycle difference of two times the non-overlapping percentage, or 10 percent.

In some embodiments, the non-overlapping percentage can exceed 5 percent to be, e.g., 10 percent, or 15 percent. In some embodiments, an increased non-overlapping percentage may trade off against output power of the DPA cell, or may otherwise impair performance of the DPA cell, e.g., by increasing amplifier distortion or introducing unwanted harmonics into the DPA output (e.g., combined amplified modulated carrier signals $V_{OUTa}$ and $V_{OUTb}$). In some embodiments, running a simulation of a DPA (e.g., used as part of a polar transmitter) may reveal a favorable ratio of the relative duty cycles of the PMOS and NMOS control signals $P_{Control}$, $N_{Control}$ or a favorable non-overlapping percentage that balances tradeoffs between minimizing wasted current in the amplifier circuit (e.g., amplifier circuit 600) and, e.g., maximizing DPA performance and output power. In some embodiments, a non-overlapping percentage of 5 percent may be used, although other percentages are possible.

In some embodiments, for a given difference in duty cycles between the PMOS and NMOS control signals $P_{Control}$, $N_{Control}$, the duty cycles may not need, e.g., to be centered around 50 percent. For example, in some embodiments, assuming, e.g., a non-overlapping percentage of 5 percent, leading to a duty cycle difference of 10 percent (2*5 percent), a duty cycle of 60 percent on the PMOS control signal could be paired with a duty cycle of 50 percent on the NMOS control signal.

In some embodiments, a design objective (as discussed below) may include achieving a 50 percent duty cycle on the amplified modulated carrier signal (e.g., $DPAV_{Out}$) output from an amplifier circuit (e.g., amplifier circuit 600). Consequently, in some embodiments, to, e.g., contribute to achieving a 50 percent duty cycle on the amplifier circuit output, the duty cycles of the PMOS and NMOS control signals (e.g., $P_{Control}$, $N_{Control}$ may be configured to be symmetrical (e.g., generally symmetrical) around 50 percent, for example, 65 and 35, 60 and 40, 55 and 45, on the PMOS and NMOS control signals respectively. In some embodiments, assuming, e.g., a non-overlapping percentage of 5 percent and a duty cycle difference of 10 percent, a duty of cycle of 55 percent on the PMOS control signal is used along with a duty cycle of 45 percent on the NMOS control signal. In some embodiments, the duty cycles of the PMOS and NMOS control signals may be slightly offset from being symmetrical around 50 percent. In some embodiments, assuming, e.g., a non-overlapping percentage of around 5 percent and a duty cycle difference of around 10 percent, a duty of cycle of around 52 percent (e.g., 52.4%) on the PMOS control signal is used along with a duty cycle of around 43 percent (e.g., 43.3%) on the NMOS control signal.

In design of CMOS circuits, PMOS and NMOS transistors may often be configured to receive the same signals on the gate inputs. This may result in PMOS and NMOS transistors conducting together at least briefly during switching of inputs. While CMOS designs in general reduce power consumption, there may still be some wasted current from the supply voltage to ground.

In some embodiments, an amplifier circuit such as the amplifier circuit 600 of FIG. 6 is designed to receive separate PMOS and NMOS control signal inputs on the gate inputs of the PMOS transistor 602 and the NMOS transistor 604, respectively. In some embodiments, separate PMOS and NMOS control signals $P_{Control}$, $N_{Control}$ may be configured and tightly controlled to prevent the PMOS transistor 602 and the NMOS transistor 604 from ever being turned on together at the same time, or to at least further minimize any time that the PMOS and NMOS transistors 602, 604 switch together, minimizing shoot through current, e.g., even more than in an example CMOS logic design.

Example design objective (in some embodiments): Maximizing DPA power to the load by designing toward a 50 percent duty cycle on the DPA cell and DPA output.

As described above with respect to FIG. 4, in some embodiments, the plurality of DPA cells 406 of the first bank 402 of the DPA 400 may be configured to receive a phase modulated carrier signal, e.g., $PH_a$. In some embodiments, the plurality of parallel DPA cells 408 of the second bank 404 of the DPA 400 may be configured to receive another phase modulated carrier signal, e.g., $PH_b$, where the another phase modulated carrier signal $PH_b$ is 180 degrees out of the phase with the phase modulated carrier signal $PH_a$.

In some embodiments, the combined amplified modulated carrier signals $V_{OUTa}$ and $V_{OUTb}$ each have duty cycles of approximately 50 percent. In some embodiments, the combined amplified modulated carrier signals $V_{OUTa}$ and $V_{OUTb}$ from the banks 402, 404 of the DPA 400 are 180 degrees out of phase with one another but are otherwise approximately identical.

In some embodiments, as described above with respect to the example DPA 400 of FIG. 4, the balun 414 includes a primary coil inductor 416 that is configured to receive the DPA 400 output signals $V_{OUTa}$ and $V_{OUTb}$ as an input signal, and a secondary coil inductor 418. The inductor 418 may have a switchable path to ground via a switch 420. The inductor 418 is connected to antenna 422. In some embodiments, the inductor 418 may have intervening signal harmonic traps between the inductor 418 and the antenna 422. In some embodiments, the signal harmonic trap 424 may be an "H3 trap" or a "third harmonic trap" from the inductor 418 to ground. In some embodiments, the signal harmonic trap 426 may be an "H2 trap" or a "second harmonic trap" placed between the inductor 418 and the antenna 422. In some embodiments, the signal harmonic trap 424 may be implemented using a capacitor and an inductor in series, and the signal harmonic trap 426 may, e.g., be separately implemented using a capacitor and an inductor in series. In some embodiments, the H2 and H3 traps are intended to reduce second (and possibly other higher order even harmonics) and third order harmonics (and possibly other higher order odd harmonics) in the output from the balun 414.

In some embodiments, a design objective of the DPA (e.g., the DPA 400 of FIG. 4) is to approach achieving a 50 percent duty cycle square wave output on the amplified modulated carrier signal (e.g., $DPAV_{Out}$ for the example DPA cell 500 of FIG. 5), of the (enabled and selectively engaged) DPA cells and on the combined amplified modulated carrier signal outputs (e.g., $V_{OUTa}$ and $V_{OUTb}$) of the DPA.

In some embodiments, as described above, the logic circuit and driver circuit (e.g., logic circuit 700 and driver circuit 800) may produce differing duty cycles on the PMOS and NMOS control signals (e.g., $P_{Control}$, $N_{Control}$) received by the amplifier circuit (e.g., amplifier circuit 600), but, e.g., the duty cycles for the PMOS and NMOS control signals for a DPA cell may be designed to be centered around and symmetrical to 50 percent (rather than, e.g., 60 and 50 percent) to result in an amplified modulated carrier signal output that approaches a 50 percent duty cycle.

In some embodiments, in a dual amplifier design, square wave outputs (e.g., combined amplified modulated carrier signals $V_{OUTa}$ and $V_{OUTb}$) from a DPA (such as the DPA 400) with a 180 degree phase shift are combined at a balun (such as balun 414) to produce a low distortion sinusoidal output with a reduced second harmonic and a maximized output power.

In some embodiments, providing a parallel differential DPA square wave output at a phase difference of 180 degrees at a primary inductor (e.g., inductor 416) of a balun (e.g., balun 414) results in a maximized power output since the differential signals (having a 180 degree phase shift) constructively combine at the balun, producing a sinusoidal output at the secondary inductor (e.g., inductor 418) of the balun of twice the range of the differential voltage (e.g., $V_{OUTa}$-$V_{OUTb}$) of the primary inductor (e.g., inductor 416).

In some embodiments, in practice, the DPA output signals (e.g., combined amplified modulated carrier signals $V_{OUTa}$ and $V_{OUTb}$) may include differential components (e.g., identical signals but 180 degrees phase shifted relative to one another) and common mode components (e.g., identical signals but in phase with one another). In some embodiments, at the balun (such as balun 414), the differential components will constructively add to one another (leading to an output having twice the signal level range) while the common mode components will constructively subtract from one another (leading to zero output).

In some embodiments, if the DPA output signals (e.g., combined amplified modulated carrier signals $V_{OUTa}$ and $V_{OUTb}$) are 180 degrees phase shifted relative to one another but at differing duty cycles (e.g., 70 percent and 30 percent, rather than each at 50 percent), then the output signal from the balun would see increased distortion on the sinusoid and less output signal power relative the ideal 50 percent duty cycle case.

According to some embodiments, outputting a 50 percent duty cycle symmetrical square wave output signal as the amplified modulated carrier signal (e.g., $DPAV_{Out}$) from each (selectively engaged) DPA cell generally may eliminate even harmonics (e.g., reducing the second order harmonic, at twice the fundamental frequency), and generally may maximize output power. An ideal 50 percent duty cycle square wave is made up of odd order harmonic sine waves. The fundamental frequency of the Fourier series for the 50 percent duty cycle square wave is the same as the square wave itself. Configuring the DPA cell output (e.g., DPAV$_{Out}$) and thus the DPA output (e.g., combined amplified modulated carrier signals V$_{OUTa}$ and V$_{OUTb}$) to approach an ideal 50 percent duty cycle square wave, in accordance with some embodiments, reduces the even order harmonics, including the second harmonic (ideally zero, practically nonzero). In addition, for the ideal 50 percent duty cycle square wave, the third order harmonic (at three times the fundamental frequency) is one third of the amplitude of the fundamental. As such, the 50 percent duty cycle square wave may be helpful for ultimately converting (at the balun) to a reduced (e.g., low) distortion sine wave of the same frequency. In high frequency operation, although the DPA may be configured in accordance with some embodiments toward generating a 50 percent duty cycle square wave, the DPA output (e.g., combined amplified modulated carrier signals V$_{OUTa}$ and V$_{OUTb}$) will generally not be an ideal 50 percent duty cycle square wave. In general, the more that the square wave output deviates from an ideal 50 percent duty cycle, the higher the even (e.g., second) order harmonics. In some embodiments, the sinusoidal output of the balun may be further filtered to remove second and third harmonics (see, e.g., FIG. 4 and surrounding discussion). For example, referring to FIG. 4, in some embodiments, the H2 and H3 traps may be used to reduce second (and possibly other higher order even harmonics) and third order harmonics (and possibly other higher order odd harmonics) in the output from the balun 414.

In some embodiments, a polar transmitter may include a digital power amplifier cell (DPA cell). In some embodiments, the DPA cell (e.g., DPA cell 500) may include, e.g., a first circuit and an amplifier circuit. According to the example, the first circuit (e.g., first circuit 502) of the DPA cell may be configured to receive a phase modulated carrier signal (e.g., one or more of signals PH$_P$, PH$_N$ of FIG. 5). Some example simulated signal waveforms of phase modulated carrier signals are shown in FIG. 9A, discussed below. The first circuit may be further configured to generate a PMOS control signal (e.g., "P$_{Control}$" of, e.g., FIG. 5) and an NMOS control signal (e.g., "N$_{Control}$" of, e.g., FIG. 5).

In some embodiments, the PMOS control signal and the NMOS control signal (e.g., P$_{Control}$, N$_{Control}$) may have different duty cycles.

According to the example, in accordance with some embodiments, the PMOS control signal may have a duty cycle greater than a duty cycle of the NMOS control signal.

According to the example, in accordance with some embodiments, the PMOS control signal may have a duty cycle greater than 50 percent and the NMOS control signal may have a duty cycle less than 50 percent.

Some example simulated signal waveforms of PMOS and NMOS control signals are shown in FIG. 9C, discussed in more detail below.

According to the example, in accordance with some embodiments, the amplifier circuit (e.g., amplifier circuit 504 of FIG. 5 or amplifier circuit 600 of FIG. 6) of the DPA cell may have an output (e.g., output 510 of FIG. 5 or 610 of FIG. 6) and may include a PMOS transistor (e.g., PMOS transistor 602 of FIG. 6) and an NMOS transistor (e.g., NMOS transistor 604 of FIG. 6). Further according to the example, the amplifier circuit may be configured to receive the PMOS control signal at the PMOS transistor and the NMOS control signal at the NMOS transistor.

According to the example, in accordance with some embodiments, the amplifier circuit (e.g., amplifier circuit 600 of FIG. 6) of the DPA cell may further include a second PMOS transistor (e.g., PMOS transistor 606 of FIG. 6) and a second NMOS transistor (e.g., NMOS transistor of FIG. 6) connected together to the output (e.g., output 610 of FIG. 6) of the amplifier circuit and configured to receive a midpoint supply voltage (e.g., VDD/2), wherein the PMOS transistor (e.g., PMOS transistor 602 of FIG. 6) is connected to the output through the second PMOS transistor and the NMOS transistor (e.g., NMOS transistor 604 of FIG. 6) is connected to the output through the second NMOS transistor.

According to the example, in accordance with some embodiments, the amplifier circuit (e.g., amplifier circuit 600 of FIG. 6) of the DPA cell may be further configured such that when the PMOS control signal (e.g., P$_{Control}$) received at the PMOS transistor (e.g., PMOS transistor 602) is at the midpoint supply voltage (e.g., VDD/2), the PMOS transistor is switched on and provides a logic high to the output (e.g., output 610) via the second PMOS transistor (e.g., PMOS transistor 606).

According to the example, in accordance with some embodiments, the amplifier circuit (e.g., amplifier circuit 600 of FIG. 6) of the DPA cell may be further configured such that when the NMOS control signal (e.g., N$_{Control}$) received at the NMOS transistor (e.g., NMOS transistor 604) is at the midpoint supply voltage (e.g., VDD/2), the NMOS transistor is switched on and provides a logic low to the output (e.g., output 610) via the second NMOS transistor (e.g., NMOS transistor 608).

According to the example, in accordance with some embodiments, the first circuit may be configured to align the PMOS control signal and the NMOS control signal with respect to one another such that a time that the PMOS transistor and the NMOS transistor (e.g., PMOS and NMOS transistors 602, 604 of FIG. 6) of the amplifier circuit are simultaneously conducting is minimized. Again, some example simulated signal waveforms of PMOS and NMOS control signals are shown in FIG. 9C, discussed in more detail below.

According to the example, in accordance with some embodiments, the first circuit may be configured to align the PMOS control signal and the NMOS control signal with respect to one another such that the PMOS control signal and the NMOS control signal are operative to prevent the PMOS transistor and the NMOS transistor (e.g., PMOS and NMOS transistors 602, 604 of FIG. 6) of the amplifier circuit from conducting at the same time.

According to the example, in accordance with some embodiments, the first circuit may be configured to align the PMOS control signal and the NMOS control signal with respect to one another such that when the NMOS transistor (e.g., NMOS transistor 604 of FIG. 6) is switched on, the PMOS transistor (e.g., PMOS transistor 602 of FIG. 6) is switched off and when the PMOS transistor is switched on, the NMOS transistor is switched off.

According to the example, in accordance with some embodiments, the first circuit may be configured to align the PMOS control signal and the NMOS control signal with respect to one another such that when the NMOS transistor (e.g., NMOS transistor 604 of FIG. 6) and the PMOS transistor (e.g., PMOS transistor 602 of FIG. 6) are both switched off at the same time for at least, e.g., a brief time period relative to, e.g., respective periods of the PMOS and NMOS control signals.

According to the example, in accordance with some embodiments, the DPA cell may further include a load capacitor (e.g., load capacitor 512 of FIG. 5 or load capacitor 612 of FIG. 6) connected to the output (e.g., output 510 of FIG. 5 or 610 of FIG. 6) of the amplifier circuit. According to the example, in accordance with some embodiments, the first circuit may be configured to align the PMOS control signal and the NMOS control signal with respect to one another such that a shoot through current from the PMOS transistor to the NMOS transistor is reduced to minimize wasting current not used to either charge or discharge the load capacitor of the amplifier circuit.

According to the example, in accordance with some embodiments, the amplifier circuit may be further configured to generate an amplified modulated carrier signal at the output of the amplifier circuit in response to, e.g., the PMOS and NMOS control signals from the first circuit. In some embodiments, the amplified modulated carrier signal may include, for example, "DPAV$_{out}$" of, e.g., FIG. 5 (which is an example implementation that corresponds to the amplified modulated carrier signals $V_{OUTa1}$, $V_{OUTa2}$, ..., $V_{OUTan}$ (for the first bank 402 of n DPA cells) and $V_{OUTb1}$, $V_{OUTb2}$, ..., $V_{OUTbn}$ (for the second bank 404 of n DPA cells) according to the example DPA 400 of FIG. 4.) In some embodiments, the amplified modulated carrier signal (e.g., "DPAV$_{out}$" of, e.g., FIG. 5) may have a duty cycle of approximately 50 percent. An example simulated signal waveform of an amplified modulated carrier signal is shown in FIG. 9D, discussed in more detail below.

According to the example, in accordance with some embodiments, the first circuit (e.g., first circuit 502 of FIG. 5) of the DPA cell may include a logic circuit (e.g., logic circuit 506 of FIG. 5 or logic circuit 700 of FIG. 7).

According to the example, in accordance with some embodiments, the logic circuit may be configured to receive the phase modulated carrier signal (e.g., one or more of signals PH$_P$, PH$_N$ of FIG. 5 or FIG. 7). In some embodiments, the logic circuit may be further configured to generate a first logic signal and a second logic signal (e.g., logic signals Lout$_P$ and Lout$_N$ of FIG. 5 or FIG. 7). In some embodiments, the logic circuit may be configured to generate the first logic signal and the second logic signal such that the first logic signal and the second logic signal have different rise and fall times relative to one another.

According to the example, in accordance with some embodiments, the logic circuit may be configured (e.g., logic circuit 700 of FIG. 7) to generate the first logic signal (e.g., Lout$_P$) and the second logic signal (e.g., Lout$_N$) such that a rise time of the first logic signal exceeds a rise time of the second logic signal and a fall time of the second logic signal exceeds a fall time of the first logic signal.

According to the example, in accordance with some embodiments, the phase modulated carrier signal may include a first phase modulated carrier signal (e.g., PH$_P$) and a second phase modulated carrier signal (e.g., PH$_N$). In some embodiments, the logic circuit (e.g., logic circuit 700 of FIG. 7) may include a first logic PMOS transistor (e.g., PMOS transistor 706 of FIG. 7) and a first logic NMOS transistor (e.g., NMOS transistor 708 of FIG. 7). In some embodiments, the first logic PMOS transistor and the first logic NMOS transistor may each be configured to receive the first phase modulated carrier signal (e.g., PH$_P$). In some embodiments, the logic circuit (e.g., logic circuit 700 of FIG. 7) may further include second logic PMOS transistor (e.g., PMOS transistor 716 of FIG. 7) and a second logic NMOS transistor (e.g., NMOS transistor 720 of FIG. 7). In some embodiments, the second logic PMOS transistor and the second logic NMOS transistor may each be configured to receive the second phase modulated carrier signal (e.g., PH$_N$).

According to the example, in accordance with some embodiments, the logic circuit (e.g., logic circuit 700 of FIG. 7) may be configured such that the first logic PMOS transistor (e.g., PMOS transistor 708) conducts more slowly in response to the first phase modulated carrier signal (e.g., PH$_P$) than the second logic PMOS transistor (e.g., PMOS transistor 716) conducts in response to the second phase modulated carrier signal (e.g., PH$_N$), causing the rise time of the first logic signal (e.g., Lout$_P$) to exceed the rise time of the second logic signal (e.g., Lout$_N$).

According to the example, in accordance with some embodiments, the logic circuit (e.g., logic circuit 700 of FIG. 7) may be configured such that the second logic NMOS transistor (e.g., NMOS transistor 720) conducts more slowly in response to the second phase modulated carrier signal (e.g., PH$_N$) than the first logic NMOS transistor (e.g., NMOS transistor 708) conducts in response to the first phase modulated carrier signal (e.g., PH$_P$), causing the fall time of the second logic signal (e.g., Lout$_N$) to exceed the fall time of the first logic signal (Lout$_P$).

According to the example, in accordance with some embodiments, the logic circuit (e.g., logic circuit 700 of FIG. 7) may include MOSFET transistors (e.g., according to the example logic circuit 700 of FIG. 7, PMOS transistors 702, 704, 706, 714, 716, 718 and NMOS transistors 708, 710, 712, 720, 722, 724). In some embodiments, two or more MOSFET transistors of the MOSFET transistors of the logic circuit may have different relative sizes that contribute to the first logic signal and the second logic signal (e.g., Lout$_P$ and Lout$_N$) having different rise and fall times relative to one another.

For example, as is known in the art, a PMOS transistor will have roughly twice the impedance of an NMOS transistor given the same transistor geometry and operating conditions. Thus, in applications that includes PMOS and NMOS transistors, e.g., in CMOS applications, and depending on the application, a PMOS transistor may be fabricated larger than (e.g., twice the size of) an NMOS transistor (or, e.g., an NMOS transistor may be fabricated smaller than (e.g., half the size of) a PMOS transistor) to, e.g., compensate for this relative impedance difference between the PMOS and NMOS transistors.

In some embodiments, in the logic circuit 700 of FIG. 7, certain groups of PMOS and NMOS transistor may be resized (e.g., by adjusting the channel length of the groups of PMOS and/or NMOS transistors), to, e.g., tune the performance of the logic circuit. According an illustrative example in accordance with some embodiments, and focusing on an example implementation of the DPA cell 500, that, e.g., includes the logic circuit 700 of FIG. 1, assuming that the example implementation of the DPA cell 500 is enabled, then the PMOS transistor 702 is on and conducting and NMOS transistor 712 is off (e.g., DPA$_{ON\_P}$ is equal to VDD/2) and NMOS transistor 724 is on and conducting and PMOS transistor 718 is off (e.g., DPA$_{ON\_N}$ is equal to VDD/2). Further assuming according to the example that the example implementation of the DPA cell 500 is enabled and is further selectively engaged, then the PMOS transistor 704 is on and conducting and the NMOS transistor 710 is off (e.g., the first ACW signal ACW$_P$ is equal to VDD/2) and the PMOS transistor 716 is on and conducting and the NMOS transistor 722 is off (e.g., the second ACW signal ACW$_N$ is equal to VSS).

According to the illustrative example, in accordance with some embodiments, and with respect to the example logic circuit 700 of FIG. 7, the group of PMOS transistors 702, 704, 706 conducts more slowly than the group of PMOS transistors 714, 716, 718 by virtue of the way in which these groups of PMOS transistors are configured together. More particularly, when an example DPA cell 500 that, e.g., includes the example logic circuit 700 of FIG. 7 is enabled and is selectively engaged, PMOS transistors 704, 702 are on and when the first phase modulated carrier signal PH$_P$ transitions from VDD to VDD/2, then as PMOS transistor 706 turns on and begins to conduct, PMOS transistor 706 faces a series resistance from both PMOS transistors 704, 702 in charging current to the input capacitance as seen looking into the driver circuit 800 (e.g., from the gates of the PMOS transistor 802 and the NMOS transistor 804). By contrast, the PMOS transistor 706, simultaneously receiving at the gate input the second phase modulated carrier signal PH$_N$ transitioning from VDD/2 to VSS, turns on and begins to conduct, but does so more quickly for the same geometry given that the PMOS transistor 706 faces a series resistance from a single PMOS transistor 714 in charging current to the input capacitance as seen looking into the driver circuit 800 (e.g., from the gates of the PMOS transistor 806 and the NMOS transistor 804). In some embodiments, the channel width of the group of PMOS transistors 702, 704, 706 may be resized to be smaller (larger) than the channel width of the group of PMOS transistors 714, 716, 718 to reduce (increase) the speed of the group of PMOS transistors relative to the group of PMOS transistors, and vice versa. In some embodiments according to the illustrative example, resizing the PMOS transistors to create any additional difference in the relative speed of the groups of PMOS transistors may, in addition to the configuration of the logic circuit 700 apart from relative sizing, may further contribute to the first logic signal and the second logic signal (e.g., Lout$_P$ and Lout$_N$) having different rise times relative to one another.

Further according to the illustrative example, in accordance with some embodiments, and with respect to the example logic circuit 700 of FIG. 7, the group of NMOS transistors 720, 722, 724 conducts more slowly than the group of NMOS transistors 708, 710, 712 by virtue of the way in which these groups of NMOS transistors are configured together. More particularly, when an example DPA cell 500 that, e.g., includes the example logic circuit 700 of FIG. 7 is enabled and is selectively engaged, NMOS transistor 724 is on and when the second phase modulated carrier signal PH$_N$ transitions from VSS to VDD/2, then as NMOS transistor 720 turns on and begins to conduct, NMOS transistor 720 faces a series resistance from the NMOS transistor 724 in discharging current from the input capacitance as seen looking into the driver circuit 800 (e.g., from the gates of the PMOS transistor 806 and the NMOS transistor 808). By contrast, the NMOS transistor 708, simultaneously receiving at the gate input the first phase modulated carrier signal PH$_P$ transitioning from VDD/2 to VDD, turns on and begins to conduct, but does so more quickly for the same geometry given that the NMOS transistor 708 faces effectively no series resistance from another NMOS transistor on the output path from VDD/2 to the output node 726 in discharging current from the input capacitance as seen looking into the driver circuit 800 (e.g., from the gates of the PMOS transistor 802 and the NMOS transistor 804). In some embodiments, the channel width of the group of NMOS transistors 720, 722, 724 may be resized to be smaller (larger) than the channel width of the group of NMOS transistors 708, 710, 712 to reduce (increase) the speed of the group of PMOS transistors relative to the group of NMOS transistors, and vice versa. In some embodiments according to the illustrative example, resizing the NMOS transistors to create any additional difference in the relative speed of the groups of NMOS transistors may, in addition to the configuration of the logic circuit 700 apart from relative sizing, may further contribute to the first logic signal and the second logic signal (e.g., Lout$_P$ and Lout$_N$) having different fall times relative to one another.

According to the example, in accordance with some embodiments, the logic circuit (e.g., logic circuit 700 of FIG. 7) may include MOSFET transistors (e.g., according to the example logic circuit 700 of FIG. 7, PMOS transistors 702, 704, 706, 714, 716, 718 and NMOS transistors 708, 710, 712, 720, 722, 724), and wherein at least one MOSFET transistor (e.g., PMOS transistor 702 and PMOS transistor 704 of FIG. 7, PMOS transistor 714 of FIG. 7, NMOS transistor 724 of FIG. 7) of the MOSFET transistors is configured to, when conducting, present a series resistance to at least one other MOSFET transistor (e.g., respectively PMOS transistor 706 of FIG. 7, PMOS transistor 716 of FIG. 7, NMOS transistor 720 of FIG. 7) of the MOSFET transistors of the logic circuit, wherein the series resistance when present contributes to the first logic signal and the second logic signal having different rise and fall times relative to one another.

For an illustrative example, in accordance with some embodiments, the series resistance presented by PMOS transistors 702, 704 to PMOS transistor 706 (when a difference between VDD and the first phase modulated carrier signal PH$_P$ exceeds a switching voltage of the PMOS transistor 706 and the PMOS transistor 706 turns on) causes the PMOS transistor 706 to conduct more slowly than any effect due to the series resistance presented by the PMOS transistor 714 to the PMOS transistor 716 (when a difference between VDD/2 and the second phase modulated carrier signal PH$_N$ exceeds a switching voltage of the PMOS transistor 716 and the PMOS transistor 716 turns on). Thus, as the first and second phase modulated carrier signals PH$_P$, PH$_N$ both fall from VDD to VDD/2 and VDD/2 to VSS, respectively, the gate to source voltages of the PMOS transistors 706, 716 eventually exceed the threshold voltages of the PMOS transistors in absolute value and the PMOS transistors 706, 716 turn on and begin to conduct, providing a logic high (VDD and VDD/2, respectively) to the first and second logic signals Lout$_P$, Lout$_N$, respectively. Although, e.g., the first and second logic signals Lout$_P$, Lout$_N$ may begin to rise together from VDD/2 to VDD and VSS to VDD/2 (in the case, e.g., of generally identical PH$_P$, PH$_N$ inputs apart from voltage levels, see, e.g., FIG. 9A), respectively, the rise times of the first and second logic signals will vary with respect to one another (see, e.g., FIG. 9B).

For an illustrative example, in accordance with some embodiments, the series resistance presented by NMOS transistor 724 to NMOS transistor 720 (when a difference between the second phase modulated carrier signal PH$_N$ and VSS exceeds a switching voltage of the NMOS transistor 720 and the NMOS transistor 720 turns on) causes the NMOS transistor 720 to conduct more slowly than the NMOS transistor 708 (when a difference between the first phase modulated carrier signal PH$_P$ and VDD/2 exceeds a switching voltage of the NMOS transistor 708 and the NMOS transistor 708 turns on) given that the NMOS transistor 708 effectively faces no series resistance from another NMOS transistor on the output path from VDD/2 to the output node 726. Thus, as the first and second phase modulated carrier signals $PH_P$, $PH_N$ both rise from VDD/2 to VDD and VSS to VDD/2, respectively, the gate to source voltages of the NMOS transistors 708, 720 eventually exceed the threshold voltages of the NMOS transistors in absolute value and the PMOS transistors 708, 720 turn on and begin to conduct, providing a logic low (VDD/2 and VSS, respectively) to the first and second logic signals $Lout_P$, $Lout_N$, respectively. Although, e.g., the first and second logic signals $Lout_P$, $Lout_N$ may begin to fall together from VDD to VDD/2 and VDD/2 to VSS (in the case, e.g., of generally identical $PH_P$, $PH_N$ inputs apart from voltage levels, see, e.g., FIG. 9A), respectively, the fall times of the first and second logic signals will vary with respect to one another (see, e.g., FIG. 9B).

Some example simulated signal waveforms of logic signals $Lout_P$ and $Lout_N$ are shown in FIG. 9B, discussed below.

According to the example, in accordance with some embodiments, the first circuit (e.g., first circuit 502 of FIG. 5) of the DPA cell may include a driver circuit (e.g., driver circuit 508 of FIG. 5 or driver circuit 800 of FIG. 7).

According to the example, in accordance with some embodiments, the driver circuit may be coupled to the logic circuit. In some embodiments, the driver circuit may be configured to receive the first logic signal and the second logic signal (e.g., logic signals $Lout_P$ and $Lout_N$ of FIG. 5 or FIG. 7 or FIG. 8). In some embodiments, the driver circuit may be further configured generate the PMOS control signal (e.g., "$P_{Control}$" of, e.g., FIG. 5 or FIG. 8) and the NMOS control signal (e.g., "$N_{Control}$" of, e.g., FIG. 5 or FIG. 8) having the different duty cycles, such that a duty cycle of the PMOS control signal exceeds a duty cycle of the NMOS control signal based on the different rise and fall times of the first logic signal and the second logic signal relative to one another.

According to the example, in accordance with some embodiments, the driver circuit (e.g., driver circuit 800 of FIG. 7) may include a first CMOS inverter (e.g., an inverter circuit that includes PMOS transistor 802 and NMOS transistor 804 of FIG. 8) and a second CMOS inverter (e.g., an inverter circuit that includes PMOS transistor 806 and NMOS transistor 808 of FIG. 808). In some embodiments, the first CMOS inverter may be configured to receive the first logic signal and may be configured to generate the PMOS control signal. In some embodiments, the second CMOS inverter may be configured to receive the second logic signal and configured to generate the NMOS control signal.

FIGS. 9A-9D are signal diagrams for various example input and output signals of the various circuits of the digital power amplifier cell in accordance with some embodiments.

Some example simulated signal waveforms of phase modulated carrier signals $PH_P$, $PH_N$ are shown in FIG. 9A.

Some example simulated signal waveforms of logic signals $Lout_P$ and $Lout_N$ are shown in FIG. 9B.

Some example simulated signal waveforms of PMOS and NMOS control signals $P_{Control}$, $N_{Control}$ are shown in FIG. 9C.

An example simulated signal waveform of an amplified modulated carrier signal $DPAV_{Out}$ is shown in FIG. 9D.

An illustrative non-limiting example in accordance with some embodiments will now be described with reference to the example circuit implementations of the DPA cell 500 of FIG. 5 (logic circuit 700 of FIG. 7, driver circuit 800 of FIG. 8, and amplifier circuit 600 of FIG. 6) using, e.g., the example simulated signal waveforms of FIGS. 9A-9D.

In addition, as shown in FIG. 4, in some embodiments particular pairs of amplifier cells may be configured to operate and process signals in a dual manner. For example, in the illustrative non-limiting example using the nth pair of DPA cells $DPA_{an}$ 406an and $DPA_{bn}$ 408bn as an example amplifier cell pair and example input signal configurations in accordance with some embodiments, According the example, each of the two DPA cells 406an, 406bn may be implemented identically and may be configured to, e.g., process the same signal in substantially the same way.

For purposes of the illustrative example with reference to FIGS. 9A-9D, and referring to FIGS. 6-8, (1) the supply voltages are assumed to be roughly as follows: VDD=3V, VSS=0V, and VDD/2=1.5V; (2) the DPA control signals $PH_P$, $PH_N$, $DPA_{ON\_P}$, $DPA_{ON\_N}$, $ACW_P$, $ACW_N$ are assumed to be in pairs with respective different voltages ranging from, e.g., VDD to VDD/2 (here 3V to 1.5V) for the signals $PH_P$, $DPA_{ON\_P}$, $ACW_P$ and VDD/2 to VSS (here 1.5V to 0V) for the signals $PH_N$, $DPA_{ON\_N}$, $ACW_N$; and (3) the amplified modulated carrier signal $DPAV_{Out}$ when the DPA cell 500 is enabled and selectively engaged may range in voltage from VDD to VSS (here 3V to 0V). Although of course these voltage values and levels for the illustrative example are merely examples and other values and levels may be used.

The values and ranges of the signals used are merely examples intended to explain in further detail some features of the example logic circuit 700, example driver circuit 800, and example amplifier circuit 600, and of course it will be understood that other signals, alignments, circuit implementations and designs may be used.

Case 1: DPA Cell Not Enabled or DPA Cell Turned "Off"

The logic circuit 700 of FIG. 7 (an example implementation in accordance with some embodiments of the logic circuit 506 of the DPA cell 500 of FIG. 5) may be configured to receive the DPA control signals $PH_P$, $PH_N$, $DPA_{ON\_P}$, $DPA_{ON\_N}$, $ACW_P$, $ACW_N$.

The logic circuit 700 includes a top half configuration of MOSFETs (series PMOS transistors 706, 704, 702 and parallel NMOS transistors 708, 710, 712) configured to receive "P" DPA control signals $PH_P$, $ACW_P$, and $DPA_{ON\_P}$ at gates of the MOSFETs as shown in FIG. 7. The top half "P path" configuration of MOSFETs is configured to generate a first logic signal $Lout_P$ at an output node 726.

The logic circuit 700 includes a bottom half configuration of MOSFETs (PMOS transistors 716, 714, 718 and NMOS transistors 720, 722, 724) configured to receive "N" DPA control signals $PH_N$, $ACW_N$, and $DPA_{ON\_N}$ at gates of the MOSFETs as shown in FIG. 7. The bottom half configuration of MOSFETs is configured to generate a second logic signal $Lout_N$ at an output node 728. The bottom half "N path" configuration of MOSFETs is connected to the top half "P path" configuration of MOSFETs at a midpoint supply voltage VDD/2 (e.g., 1.5V) at the node 730.

In some embodiments, depending on, e.g., a particular design of the logic circuit 700, the enable signals $DPA_{ON\_P}$ and $DPA_{ON\_N}$ are configured to turn the DPA cell 500 on or off.

Further according to the illustrative example, the enable signals $DPA_{ON\_P}$ and $DPA_{ON\_N}$ are logically inverted versions of one another such that when the first enable signal $DPA_{ON\_P}$ is at logic low, the second enable signal $DPA_{ON\_N}$ is at a logic high, and when $DPA_{ON\_P}$ is at a logic high, $DPA_{ON\_N}$ is at a logic low.

According to the illustrative example, the logic circuit 700 may be designed and configured such that the DPA cell 500 is turned "OFF" when both of the following conditions are true: (1) the first enable signal $DPA_{ON\_P}$ is equal to VDD (here 3V, or a logic high) and (2) the second enable signal $DPA_{ON\_N}$ is equal to VSS (here 0V, or a logic low).

According to the illustrative example, referring to FIG. 7, when the first enable signal $DPA_{ON\_P}$ is equal to VDD (here 3V, or a logic high), PMOS transistor 702 is turned off and NMOS transistor 712 is turned on, passing a logic low (VDD/2, here 1.5V) for the top half "P path" configuration of MOSFETs to the output node 726, resulting in a logic signal $Lout_P$ output of VDD/2 (here 1.5V) for the top half "P path" configuration of the logic circuit 700.

Similarly, according to the illustrative example, when the second enable signal $DPA_{ON\_N}$ is equal to VSS (here 0V, or a logic low), NMOS transistor 724 is turned off and PMOS transistor 718 is turned on, passing a logic high (VDD/2, here 1.5V) for the bottom half "N" path" configuration of MOSFETs to the output node 728, resulting in a logic signal $Lout_N$ output of VDD/2 (here 1.5V) for the bottom half "N path" configuration of the logic circuit 700.

In some embodiments, when the enable signals $DPA_{ON\_P}$, $DPA_{ON\_N}$ disable or turn off the DPA cell 500, the signal values of the other DPA control signals $PH_P$, $PH_N$, $ACW_P$, $ACW_N$ don't impact the output of the logic circuit 700 or of the DPA cell 500, such that, e.g., these control signals may be thought of "don't care" values.

According to the illustrative example, referring to FIG. 8, when the DPA cell 500 is off, the logic signal inputs $Lout_P$, $Lout_N$ received by the driver circuit 800 of FIG. 8 are VDD/2 (here 1.5V) and cause (A) the NMOS transistor 804 to be turned off and the PMOS transistor 802 to be turned on, passing a logic high (VDD, here 3V) to the output node 810, resulting in a PMOS control output $P_{Control}$ of VDD (here 3V) and the NMOS transistor 804 to be turned off; and (B) the PMOS transistor 806 to be turned off and the NMOS transistor 808 to be turned on, passing a logic low (VSS, here 0V) to the output node 812, resulting in an NMOS control output $N_{Control}$ of VSS (here 0V).

According to the illustrative example, referring to FIG. 6, when the DPA cell 500 is off and disabled by the enable signals, the PMOS control signal $P_{Control}$ received by the amplifier circuit 600 of FIG. 6 is equal to VDD (here 3V) and the PMOS transistor 602 is turned off. Similarly, the NMOS control signal $N_{Control}$ received by the amplifier circuit 600 of FIG. 6 is equal to VSS (here 0V) and the NMOS transistor 604 is turned off. Thus, the output $DPAV_{out}$ floats at an indeterminate value (e.g., VDD/2), such that the amplified modulated carrier signal $DPAV_{Out}$ at the output 610 of the amplifier circuit 600 is not enabled and does not contribute to the combined amplified modulated carrier signal $V_{OUTa}$, $V_{OUTb}$ of FIG. 4. In addition, according to the illustrative example, when the DPA cell 500 is off and disabled, the receive amplifiers of a polar transceiver (e.g., low noise amplifier (LNA) stages) will not see load capacitance (since, e.g., load capacitor 612 will be floating at an indeterminate value) from the DPA cell 500.

Case 2: DPA Cell Enabled or DPA Cell Turned "On"

In some embodiments, depending on, e.g., a particular design of the logic circuit 700, the enable signals $DPA_{ON\_P}$ and $DPA_{ON\_N}$ are configured to turn the DPA cell 500 on or off.

Further according to the illustrative example, the enable signals $DPA_{ON\_P}$ and $DPA_{ON\_N}$ are logically inverted versions of one another such that when the first enable signal $DPA_{ON\_P}$ is at logic low, the second enable signal $DPA_{ON\_N}$ is at a logic high, and when $DPA_{ON\_P}$ is at a logic high, $DPA_{ON\_N}$ is at a logic low.

According to the illustrative example, the logic circuit 700 may be designed and configured such that the DPA cell 500 is turned "ON" when both of the following conditions are true: (1) the first enable signal $DPA_{ON\_P}$ is equal to VDD/2 (here 1.5V, or a logic low) and (2) the second enable signal $DPA_{ON\_N}$ is equal to VDD/2 (here 1.5V, or a logic high).

According to the illustrative example, referring to FIG. 7, when the first enable signal $DPA_{ON\_P}$ is equal to VDD/2 (here 1.5V, or a logic low), NMOS transistor 712 is turned off (since the NMOS transistor 712 is in parallel with parallel NMOS transistors 708, 710, the NMOS transistor 712 effectively "drops out" and is treated as an open circuit) and PMOS transistor 702 is turned on, creating a series resistance to the series PMOS transistors 704, 706. The resulting effective circuit for the top half "P path" configuration of MOSFETs is two PMOS transistors 704, 706 in series (with a series resistance from the PMOS transistor 702) connected at the node 726 to two NMOS transistors 708, 710 in parallel.

Similarly, according to the illustrative example, when the second enable signal $DPA_{ON\_N}$ is equal to VDD/2 (here 1.5V, or a logic high), PMOS transistor 718 is turned off (since the PMOS transistor 718 is in parallel with series PMOS transistors 714, 716, the PMOS transistor 718 effectively "drops out" and is treated as an open circuit) and NMOS transistor 724 is turned on, creating a series resistance to the parallel NMOS transistors 720, 722. The resulting effective circuit for the bottom half "N path" configuration of MOSFETs is two PMOS transistors 714, 716 in series connected at the node 728 to two NMOS transistors 720, 722 in parallel (with a series resistance from the NMOS transistor 724).

According to the illustrative example in accordance with some embodiments, referring to FIG. 8, when the DPA cell 500 is on and enabled by the enable signals, the logic signal inputs $Lout_P$, $Lout_N$ received by the driver circuit 800 of FIG. 8 and subsequent signal values (e.g., PMOS control signal $P_{Control}$ and NMOS control signal $N_{Control}$, $DPAV_{out}$) may generally depend on the DPA control signals $PH_P$, $PH_N$, $ACW_P$, $ACW_N$.

Case 2A: DPA Cell Enabled or DPA Cell Turned "on" and ACW Set to Selectively Disengage the DPA Cell.

In some embodiments, depending on, e.g., a particular design of the logic circuit 700, the ACW signals $ACW_P$ and $ACW_N$ are operative to contribute to setting a gain of a DPA (e.g., DPA 400) by, e.g., selectively engaging or selectively disengaging a particular DPA cell 500.

In some embodiments, the ACW signal $ACW_P$ and $ACW_N$ have different voltage ranges but may be otherwise identical. According to the illustrative example, the signal $ACW_P$ may range from VDD to VDD/2 (here 3V to 1.5V) and the signal $ACW_N$ may range from VDD/2 to VSS (here 1.5V to 0V). According to the illustrative example, the ACW signals $ACW_N$, $ACW_P$ are identical such that when the first ACW signal $ACW_P$ is at logic low, the second ACW signal $ACW_N$ is at a logic low, and when $ACW_P$ is at a logic high, $ACW_N$ is at a logic high.

Further according to the illustrative example, the logic circuit 700 may be designed and configured such that, once the DPA cell 500 is enabled by the first and second enable signals $DPA_{ON\_P}$ and $DPA_{ON\_N}$, (e.g., Case 2 generally), the DPA cell 500 is selectively disengaged by the ACW signals when both of the following conditions are true: (1) the first ACW signal $ACW_P$ is equal to VDD (here 3V, or a logic high) and (2) the second ACW signal $ACW_N$ is equal to VDD/2 (here 1.5V, or a logic high).

According to the illustrative example, referring to the top half "P path" configuration of MOSFETs of the logic circuit 700 of FIG. 7, when the first enable signal $DPA_{ON\_P}$ is equal to VDD/2 (here 1.5V, or a logic low), the resulting effective circuit for the top half "P path" configuration of MOSFETs is two PMOS transistors 704, 706 in series (with a series resistance from the PMOS transistor 702) connected at the node 726 to two NMOS transistors 708, 710 in parallel. With this effective circuit (with the DPA cell 500 enabled), according to the illustrative example, referring to FIG. 7, when the first ACW signal $ACW_P$ is equal to VDD (here 3V, or a logic high) the PMOS transistor 704 is turned off and the NMOS transistor 710 is turned on, passing a logic low (VDD/2, here 1.5V) for the top half "P path" configuration of MOSFETs to the output node 726, resulting in a logic signal $Lout_P$ output of VDD/2 (here 1.5V) for the top half "P path" configuration of the logic circuit 700.

Similarly, according to the illustrative example, referring to the bottom half "N path" configuration of MOSFETs of the logic circuit 700 of FIG. 7, when the second enable signal $DPA_{ON\_N}$ is equal to VDD/2 (here 1.5V, or a logic high) the resulting effective circuit for the bottom half "N path" configuration of MOSFETs is two PMOS transistors 714, 716 in series connected at the node 728 to two NMOS transistors 720, 722 in parallel (with a series resistance from the NMOS transistor 724). With this effective circuit (with the DPA cell 500 enabled), according to the illustrative example, referring to FIG. 7, when the second ACW signal $ACW_N$ is equal to VDD/2 (here 1.5V, or a logic high) the PMOS transistor 714 is turned off and the NMOS transistor 722 is turned on, passing a logic low (VSS, here 0V) for the bottom half "N path" configuration of MOSFETs to the output node 728, resulting in a logic signal $Lout_N$ output of VSS (here 0V) for the bottom half "N path" configuration of the logic circuit 700.

According to the illustrative example, referring to FIG. 8, when the DPA cell 500 is enabled by the enable signals but selectively disengaged by the ACW signals (e.g., Case 2A), the logic signal inputs $Lout_P$, $Lout_N$ received by the driver circuit 800 of FIG. 8 are VDD/2 (here 1.5V) and VSS (here 0V) respectively. The logic signal input $Lout_P$ of VDD/2 (here 1.5V) causes the NMOS transistor 804 to be turned off and the PMOS transistor 802 to be turned on, passing a logic high (VDD, here 3V) to the output node 810, resulting in a PMOS control output $P_{Control}$ of VDD (here 3V). The logic signal input $Lout_N$ of VSS (here 0V) causes the NMOS transistor 808 to be turned off and the PMOS transistor 806 to be turned on, passing a logic high (VDD/2, here 1.5V) to the output node 812, resulting in an NMOS control output $N_{Control}$ of VDD/2 (here 1.5V).

According to the illustrative example, referring to FIG. 6, when the DPA cell 500 is enabled by the enable signals but selectively disengaged by the ACW signals (e.g., Case 2A), the PMOS control signal $P_{Control}$ received by the amplifier circuit 600 of FIG. 6 is equal to VDD (here 3V) and the PMOS transistor 602 is turned off. According to the illustrative example, the NMOS control signal $N_{Control}$ received by the amplifier circuit 600 of FIG. 6 is equal to VDD/2 (here 1.5V) and the NMOS transistor 604 is turned on, causing the NMOS transistor 608 to also be turned on, and passing a logic low (VSS, here 0V) to the output node 610 (discharging current from the load capacitor 612 to a logic low VSS), resulting in an amplified modulated carrier signal $DPAV_{Out}$ (from the selectively disengaged DPA cell 500) at the output 610 of the amplifier circuit 600 that is effectively at logic low and that does not contribute to the combined amplified modulated carrier signal $V_{OUTa}$, $V_{OUTb}$.

Case 2B: DPA cell enabled or DPA turned "on" and ACW set to selectively engage the DPA cell; PH signal waveform example.

In some embodiments, the phase modulated carrier signals $PH_P$, $PH_N$ received by the logic circuit 700 of FIG. 7 include the modulation information relating to the phase of the signal to be amplified by the example DPA cell 500.

In some embodiments, depending on, e.g., a particular design of the logic circuit 700, the phase modulated carrier signals $PH_P$ and $PH_N$ have different voltage ranges but may be otherwise identical. For example, the signal $PH_P$ may range from VDD to VDD/2 (e.g., 3V to 1.5V) and the signal $PH_N$ may range from VDD/2 to VSS (e.g., 1.5V to 0V). According to the illustrative example, the phase modulated carrier signals $PH_P$, $PH_N$ are identical such that when the first phase modulated carrier signal $PH_P$ is at logic low, the second phase modulated carrier signal $PH_N$ is at a logic low, and when $PH_P$ is at a logic high, $PH_N$ is at a logic high.

Some example simulated signal waveforms of phase modulated carrier signals $PH_P$, $PH_N$ are shown in FIG. 9A. The voltage values of the first phase modulated carrier signal $PH_P$ are measured against the right hand vertical axis and range roughly from 3V to 1.5V. The voltage values of the second phase modulated carrier signal $PH_N$ are measured against the left hand vertical axis and range roughly from 1.5V to 0V. According to the simulation, the first and second phase modulated carrier signal $PH_P$, $PH_N$ are essentially identical (sharing the same amplitude and phase), level shifted versions of one another as shown in FIG. 9A.

Further according to the illustrative example, the logic circuit 700 may be designed and configured such that, once the DPA cell 500 is enabled by the first and second enable signals $DPA_{ON\_P}$ and $DPA_{ON\_N}$, (e.g., Case 2 generally), the DPA cell 500 is selectively engaged by the ACW signals when both of the following conditions are true: (1) the first ACW signal $ACW_P$ is equal to VDD/2 (e.g., 1.5V, or a logic low) and (2) the second ACW signal $ACW_N$ is equal to VSS (e.g., 0V, or a logic low).

According to the illustrative example, referring to the top half "P path" configuration of MOSFETs of the logic circuit 700 of FIG. 7, when the first enable signal $DPA_{ON\_P}$ is equal to VDD/2 (here 1.5V, or a logic low), the resulting effective circuit for the top half "P path" configuration of MOSFETs is two PMOS transistors 704, 706 in series (with a series resistance from the PMOS transistor 702) connected at the node 726 to two NMOS transistors 708, 710 in parallel. With this effective circuit (with the DPA cell 500 enabled), according to the illustrative example, referring to FIG. 7, when the first ACW signal $ACW_P$ is equal to VDD/2 (here 1.5V, or a logic low) the NMOS transistor 710 is turned off (since the NMOS transistor 710 is in parallel with the remaining NMOS transistor 708, the NMOS transistor 710 effectively "drops out" and is treated as an open circuit) and the PMOS transistor 704 is turned on, creating an additional series resistance with PMOS transistor 702 to the PMOS transistor 706. The resulting effective circuit for the top half "P path" configuration of MOSFETs is the PMOS transistor 706 (with a series resistance from the PMOS transistors 702, 704) connected at the node 726 to the NMOS transistor 708 (facing effectively no series resistance from another NMOS transistor since both parallel NMOS transistors 710, 712 are turned off).

According to the illustrative example, referring to the bottom half "N path" configuration of MOSFETs of the logic circuit 700 of FIG. 7, when the second enable signal $DPA_{ON\_N}$ is equal to VDD/2 (here 1.5V, or a logic high), the resulting effective circuit for the bottom half "N path" configuration of MOSFETs is two PMOS transistors 714, 716 in series connected at the node 728 to two NMOS transistors 720, 722 in parallel (with a series resistance from the NMOS transistor 724). With this effective circuit (with the DPA cell 500 enabled), according to the illustrative example, referring to FIG. 7, when the second ACW signal $ACW_N$ is equal to VSS (here 0V, or a logic low) the NMOS transistor 722 is turned off (since the NMOS transistor 710 is in parallel with the NMOS transistor 720, the NMOS transistor 722 effectively "drops out" and is treated as an open circuit) and the PMOS transistor 714 is turned on, creating a series resistance to the PMOS transistor 716. The resulting effective circuit for the bottom half "N path" configuration of MOSFETs is the PMOS transistor 716 (with a series resistance from the PMOS transistors 714) connected at the node 728 to the NMOS transistor 720 (with a series resistance from the NMOS transistor 724).

Assuming relatively steady state values of the enable signals $DPA_{ON\_P}$, $DPA_{ON\_N}$ and the ACW signals $ACW_P$, $ACW_N$ for purposes of and according to the illustrative example, the operation of the example circuit implementations of the DPA cell 500 of FIG. 5 (logic circuit 700 of FIG. 7, driver circuit 800 of FIG. 8, and amplifier circuit 600 of FIG. 6) may be described using, e.g., the example simulated signal waveforms of FIGS. 9A-9D, for Case 2B, in which the example DPA cell 500 is enabled and selectively engaged.

Under these conditions, according to the illustrative example, the top half "P path" configuration and the bottom half "N path" configuration of the logic circuit 700 result in effective circuits as described above.

According to the illustrative example, when the example DPA cell 500 that includes the example implementation of the logic circuit 700 of FIG. 7 is enabled and selectively engaged: (A) the resulting effective circuit for the top half "P path" configuration reduces down to a CMOS inverter (formed by transistors 706, 708) for the phase modulated carrier signal $PH_P$ received at the gate inputs of the PMOS transistor 706 and the NMOS transistor 708 such that (when values settle) the logic output signal $Lout_P$ at the output node 726 from this effective circuit is a logically inverted value of the phase modulated carrier signal $PH_P$; and (B) the resulting effective circuit for the bottom half "N path" configuration reduces down to a CMOS inverter (formed by transistors 716, 720) for the phase modulated carrier signal $PH_N$ received at the gate inputs of the PMOS transistor 716 and the NMOS transistor 720 such that (when values settle) the logic output signal $Lout_N$ at the output node 728 from this effective circuit is a logically inverted value of the phase modulated carrier signal $PH_N$.

Some example simulated signal waveforms of logic signals $Lout_P$ and $Lout_N$ are shown in FIG. 9B. The voltage values of the first logic signal $Lout_P$ are measured against the right hand vertical axis and range roughly from 3V to 1.5V. The voltage values of the second logic signal $Lout_N$ are measured against the left hand vertical axis and range roughly from 1.5V to 0V. According to the simulation, the first and second logic signals $Lout_P$ and $Lout_N$ tend toward the same logic values (level shifted) with roughly the same phase and amplitude but have different signal transition/rise and fall times relative to one another, as shown in FIG. 9B.

According to the illustrative example in accordance with some embodiments, since the initial phase modulated carrier signals $PH_P$ and $PH_N$ are identical but for their voltage ranges, and since in Case 2B the effective circuits of top half "P path" and bottom half "N path" configuration of the logic circuit 700 essentially serve to logically invert these incoming phase modulated carrier signals, the logic circuit 700 logic output signals $Lout_P$ and $Lout_N$ will ultimately reach similar logic highs and lows to one another but the design of the logic circuit 700 causes differences in the relative signal transition time in the logic output signals $Lout_P$ and $Lout_N$. As described above, and as will be described in more detail below, the particular design of the logic circuit 700 when the DPA cell 500 is enabled and selectively engaged is designed to present series resistances to different conducting PMOS and NMOS transistors that in turn result in different rise and fall times on the output logic signals $Lout_P$ ("P path" output) and $Lout_N$ ("N path" output) even given the same signal inputs on the "P path" (the first phase modulated carrier signal $PH_P$) and on the "N path" (the second modulated carrier signal $PH_N$), respectively. In some embodiments, as described above, in addition to the particular logic design of the logic circuit 700, e.g., relative transistor sizing adjustments may be made in the layout that can impact signal timing for the particular logic design of the logic circuit 700 and subsequent signals processed by the DPA cell 500.

According to the illustrative example, and as will be described in more detail with respect to, e.g., FIGS. 9B-9C, the driver circuit 800 of FIG. 8 that receives the logic signals $Lout_P$ and $Lout_N$ will effectively generate PMOS and NMOS control signals $P_{Control}$ and $N_{Control}$ that are effectively logically inverted values of these logic signals, respectively.

According to the illustrative example, when the DPA cell 500 is enabled and selectively engaged, when the first logic signal $Lout_P$ is at a logic high of VDD (here 3V), the second logic signal $Lout_N$ will also be at a logic high of VDD/2 (here 1.5V), and the PMOS transistor 802 is off and the NMOS transistor 804 is on and conducts a logic low of VDD/2 (here 1.5V) to the output node 810 as the PMOS control signal $P_{Control}$, and the PMOS transistor 806 is off and the NMOS transistor 808 is on and conducts a logic low of VSS (here 0V) to the output node 812 as the NMOS control signal $N_{Control}$.

According to the illustrative example, when the DPA cell 500 is enabled and selectively engaged, when the first logic signal $Lout_P$ is at a logic low of VDD/2 (here 1.5V), the second logic signal $Lout_N$ will also be at a logic low of VSS (here 0V), and the NMOS transistor 804 is off and the PMOS transistor 802 is on and conducts a logic high of VDD (here 3V) to the output node 810 as the PMOS control signal $P_{Control}$, and the NMOS transistor 808 is off and the PMOS transistor 806 is on and conducts a logic high of VDD/2 (here 1.5V) to the output node 812 as the NMOS control signal $N_{Control}$.

Some example simulated signal waveforms of PMOS and NMOS control signals $P_{Control}$, $N_{Control}$ are shown in FIG. 9C. The voltage values of the PMOS control signal $P_{Control}$ are measured against the right hand vertical axis and range roughly from 3V to 1.5V. The voltage values of the NMOS control signal $N_{Control}$ are measured against the left hand vertical axis and range roughly from 1.5V to 0V. According to the simulation, as shown in FIG. 9C, the PMOS and NMOS control signals $P_{Control}$, $N_{Control}$ tend toward the same logic values (level shifted) with roughly the same amplitude but have, e.g., by design, different duty cycles, with e.g., relative alignment of the rise and fall logic transitions to prevent the PMOS transistor 602 and the NMOS transistor 604 of the amplifier circuit 600 from being turned on and conducting at the same time.

According to the illustrative example, and as will be described in more detail with respect to FIGS. 9C-9D, when the DPA cell 500 is enabled and selectively engaged, the amplifier circuit 600 of FIG. 6 that receives the PMOS and NMOS control signals $P_{Control}$ and $N_{Control}$ (two input signals) will effectively generate at the output 610 an amplified modulated carrier signal $DPAV_{Out}$ (one output signal) that is effectively a logically inverted value of the $P_{Control}$ and $N_{Control}$ signals (but with a full voltage range from logic high VDD (here 3V) to logic low VSS (here 0V)).

According to the illustrative example, referring to the amplifier circuit 600 of FIG. 6, the $P_{Control}$ signal input serves as a control signal for the PMOS transistor 602 such that when $P_{Control}$ is at VDD (here 3V and a logic high), the PMOS transistor 602 is off, and when $P_{Control}$ is at VDD/2 (here 1.5V and a logic low), the PMOS transistor 602 is on and conducts and charges the capacitor 612 and the output $DPAV_{Out}$ at node 610 to VDD (here 3V and a logic high).

According to the illustrative example, referring to the amplifier circuit 600 of FIG. 6, the $N_{Control}$ signal input serves as a control signal for the NMOS transistor 604 such that when $N_{Control}$ is at VDD/2 (here 1.5V and a logic high), the NMOS transistor 604 is on and conducts and discharges the capacitor 612 to a logic low and brings the output $DPAV_{Out}$ to VSS (here 0V and a logic low), and when $N_{Control}$ is at VSS (here 0V and a logic high), the NMOS transistor 604 is off.

An example simulated signal waveform of an amplified modulated carrier signal $DPAV_{Out}$ is shown in FIG. 9D. The voltage values of the amplified modulated carrier signal $DPAV_{Out}$ are measured against the left hand vertical axis and range roughly from 3V to 0V.

According to the illustrative example, since when the DPA cell 500 is enabled and selectively engaged, the PMOS control signal $P_{Control}$ and the NMOS control signal $N_{Control}$ by design settle to effectively the same value (apart from having, e.g., different duty cycles and logic transitions at different times) such that, e.g., one is not a logic high when the other is at logic low, and vice versa, the PMOS transistor 602 and the NMOS transistor 604 are, again by design, never on together and thus never conduct at the same time, thus ensuring that no current is wasted (or at least minimizing wasted current).

According to the illustrative example, assuming relatively steady state values of the enable signals $DPA_{ON\_P}$, $DPA_{ON\_N}$ and the ACW signals $ACW_P$, $ACW_N$ for purposes of and according to the illustrative example, the operation of the example circuit implementations of the DPA cell 500 of FIG. 5 (logic circuit 700 of FIG. 7, driver circuit 800 of FIG. 8, and amplifier circuit 600 of FIG. 6) may be described using, e.g., the example simulated signal waveforms of FIGS. 9A-9D, for Case 2B, in which the example DPA cell 500 is enabled and selectively engaged.

Signal Processing Example 1: Phase Modulated Carrier Signals $PH_P$, $PH_N$ (From Logic Low to Logic High)

Referring first to FIG. 9A and FIG. 7, the example simulated first and second phase modulated carrier signals $PH_P$, $PH_N$ received at the logic circuit 700 of FIG. 7 are essentially identical (sharing the same amplitude and phase), level shifted versions of one another as shown in FIG. 9A, with the voltage values shown on the right hand and left hand vertical axes, respectively. The horizontal axis on FIG. 9A (and on FIGS. 9B-9D as well) measures simulation time (t) and ranges from 40.0 to 41.0 nanoseconds ("ns"; $10^{-9}$ seconds). Times (and voltage values) referenced below with respect to, e.g., this illustrative example are estimated based on inspection of the signal waveform diagrams in FIGS. 9A-9D and are not precise simulation time values (or voltage value), and for ease of description the word "roughly" or "approximately" or "around" may be assumed to preface any referenced time value (voltage value). Supply voltage values for this illustrative example are assumed to be (or approximate) VDD=3V, VDD/2=1.5V, and VSS=0V, but of course other voltage supply values and signal voltage ranges and values may be used. The signal waveforms shown in FIGS. 9A-9D are clearly non-limiting example simulated signals intended to illustrate example operation of example circuit implementations of the DPA cell 500 of FIG. 5 (logic circuit 700 of FIG. 7, driver circuit 800 of FIG. 8, and amplifier circuit 600 of FIG. 6) in accordance with some embodiments.

Just prior to, e.g., t=40.2 ns, both the phase modulated carrier signals $PH_P$, $PH_N$ are at logic low values (here around VDD/2=1.5V and VSS=0V, respectively) such that (referring to the logic circuit 700 of FIG. 7) the PMOS transistor 706 is on, the NMOS transistor 708 is off, and the PMOS transistor 716 is on, and the NMOS transistor 720 is off. As such, just prior to t=40.2 ns, $Lout_P$ and $Lout_N$ at nodes 726, 728 are at logic high values (here around VDD=3V and VDD/2=1.5V, respectively) or approaching these values (see FIG. 9B, $Lout_P$=2.8V and $Lout_N$=1.5V just prior to t=40.2 ns).

At time t=40.24 ns, both the phase modulated carrier signals $PH_P$, $PH_N$ begin to rise from the logic low values toward logic high values (here around VDD=3V and VDD/2=1.5V, respectively). During this rise, just after time t=40.28 ns, both the phase modulated carrier signals $PH_P$, $PH_N$ begin to exceed values of 2.0V and 0.5V respectively. When the $PH_P$ signal begins to exceed 2.0V just after t=40.28 ns, the gate to source voltage ($V_{gs}$) of the NMOS transistor 708 (between the gate input and the source node 730) begins to exceed the NMOS transistor threshold voltage $V_{tn}$ (assumed for ease of description to be 0.5V for all NMOS transistors under discussion in the illustrative example) of the NMOS transistor 708 ($V_{gs}$=$PH_P$−(VDD/2) >$V_{tn}$), and the NMOS transistor 708 turns on and begins to conduct. (The PMOS transistor 706 is still on at this time t=40.28 ns, but the PMOS transistor 706 will begin to turn off as the $PH_P$ signal begins to exceed 2.4V at t=40.31 ns (assuming a PMOS transistor threshold voltage $V_{tp}$ of −0.6V, assumed for ease of description to be this value −0.6V for all PMOS transistors under discussion in the illustrative example).) Of course, it will be understood that these assumed threshold voltages are example values and other threshold voltages may be used, according to design choice (e.g., choice of transistor geometry and/or operating conditions). When the $PH_N$ signal begins to exceed 0.5V just after t=40.28 ns, the gate to source voltage ($V_{gs}$) of the NMOS transistor 720 (between the gate input and the source node 732) begins to exceed the NMOS threshold voltage $V_{tn}$ (0.5V) of the NMOS transistor 720 ($V_{gs}$=$PH_N$−(VSS)>$V_{tn}$), and the NMOS transistor 720 turns on and begins to conduct. (The PMOS transistor 716 is still on at this time t=40.28 ns, but the PMOS transistor 716 will begin to turn off as the $PH_N$ signal begins to exceed 0.9V at t=40.31 ns (assuming the PMOS transistor threshold voltage $V_{tp}$ of −0.6V).)

Only a short time after t=40.28 ns, at t=40.29 ns, referring to FIG. 9B, the output logic signals $Lout_P$ and $Lout_N$ of the logic circuit 700 of FIG. 7 begin to fall from the logic high values ($Lout_P$=3V and $Lout_N$=1.5V) toward logic low values as the NMOS transistors 708 and 720 turn on and begin to conduct and to sink current discharged from the input gate capacitance presented by the driver circuit transistors 802, 804 and 806, 808 (of the driver circuit 800 of FIG. 8) which receive the logic signals $Lout_P$ and $Lout_N$, respectively.

According to the illustrative example, and in accordance with some embodiments, the logic circuit 700 is designed and configured to generate different fall times (and rise times) on the logic signals $Lout_P$ and $Lout_N$. For example, the $Lout_P$ signal falls from a logic high to a logic low from 40.29 ns to 40.4 ns, while the $Lout_N$ signal falls from a logic high to a logic low from 40.29 ns to 40.5 ns, with the $Lout_P$ signal falling significantly faster than the $Lout_N$ signal. According to the illustrative example, and as described above with respect to, e.g., the logic circuit 700 of FIG. 7, the difference in logic signal $Lout_P$, $Lout_N$ fall times is due to at least partly to a difference in series resistance faced by the NMOS transistors 708 and 720, respectively, when the example implementation of the DPA cell 500 is enabled and selectively engaged (e.g., Case 2B). When the NMOS transistor 708 turns on and begins to conduct, the NMOS transistor 708 faces no series resistance from another NMOS transistor in the NMOS transistor's 708 conducting path from VDD/2 at node 730 to the $Lout_P$ signal at the output node 726. By contrast, when the NMOS transistor 720 turns on and begins to conduct, the NMOS transistor 720 faces series resistance on the NMOS transistor's 708 conducting path (from VSS to the $Lout_N$ signal at the output node 728) presented by the conducting NMOS transistor 724 (in Case 2B turned on by the enable signal $DPA_{ON\_N}$) between VSS and the node 732. Therefore, relatively speaking, assuming, e.g., identical geometry and operating conditions, the NMOS transistor 720 ("NSLOW") will conduct more slowly than the NMOS transistor 708 ("NFAST"), leading to a shorter fall time for the logic signal $Lout_P$ than the logic signal $Lout_N$, as shown in FIG. 9B.

According to the illustrative example, and referring to FIGS. 9B and 9C, the different fall times of the logic signals $Lout_P$, $Lout_N$ due to differences in series resistance in the NMOS transistor 708, 720 conducting paths in the logic circuit 700 of FIG. 7 are impactful on the PMOS and NMOS control signals $P_{Control}$, $N_{Control}$ generated by the driver circuit 800 of FIG. 8. In some embodiments, and as shown in the example signal waveforms $P_{Control}$, $N_{Control}$ of FIG. 9C, the different fall times (and rise times) of the logic signals $Lout_P$, $Lout_N$ lead to different duty cycles for the PMOS and NMOS control signals $P_{Control}$, $N_{Control}$. The different duty cycles (controlled by the logic circuit 700 and the $Lout_P$, $Lout_N$ logic signal outputs) of the PMOS and NMOS control signals $P_{Control}$, $N_{Control}$ permit a relative alignment of $P_{Control}$, $N_{Control}$ with respect to one another such that the respective PMOS and NMOS transistors 602, 604 of the amplifier circuit 600 of FIG. 6 configured to receive $P_{Control}$, $N_{Control}$ respectively, e.g., do not conduct simultaneously and are thus non-overlapping.

According to the illustrative example, as described above, only a short time after t=40.28 ns, at t=40.29 ns, referring to FIG. 9B, the output logic signals $Lout_P$ and $Lout_N$ of the logic circuit 700 of FIG. 7 begin to fall from the logic high values ($Lout_P$=3V and $Lout_N$=1.5V) toward logic low values as the NMOS transistors 708 and 720 turn on and begin to conduct. For example, the $Lout_P$ signal falls from a logic high to a logic low from 40.29 ns to 40.4 ns, while the $Lout_N$ signal falls from a logic high to a logic low from 40.29 ns to 40.5 ns, with the $Lout_P$ signal falling significantly faster than the $Lout_N$ signal.

Referring to FIG. 9B, during this fall of the logic signals $Lout_P$ and $Lout_N$ toward logic low values (here around VDD/2=1.5V and VSS=0V, respectively), both the logic signals $Lout_P$ and $Lout_N$ received by the driver circuit 800 of FIG. 8 begin to fall below values of 2.4V and 0.9V respectively. When the $Lout_P$ signal received at the PMOS transistor 802 of the driver circuit 800 begins to fall below 2.4V just after t=40.325 ns, the gate to source voltage ($V_{gs}$) of the PMOS transistor 802 (between the gate input and the source at VDD) begins to exceed the PMOS transistor threshold voltage $V_{tp}$ of −0.6V of the PMOS transistor 802 in absolute value terms ($V_{gs}$=|$Lout_P$−VDD|>|$V_{tp}$|), and the PMOS transistor 802 turns on and begins to conduct. (The NMOS transistor 804 is still on at this time t=40.325 ns, but the NMOS transistor 804 will begin to turn off as the $Lout_P$ signal begins to fall below 2.0V at t=40.345 ns (with an NMOS transistor threshold voltage $V_{tn}$ of 0.5V).) When the $Lout_N$ signal received at the PMOS transistor 806 of the driver circuit 800 begins to fall below 0.9V just after t=40.35 ns, the gate to source voltage ($V_{gs}$) of the PMOS transistor 806 (between the gate input and the source at VDD/2) begins to exceed the PMOS transistor threshold voltage $V_{tp}$ of −0.6V of the PMOS transistor 806 in absolute value terms ($V_{gs}$=|$Lout_N$−VDD/2|>|$V_{tp}$|), and the PMOS transistor 806 turns on and begins to conduct. (The NMOS transistor 808 is still on at this time t=40.35 ns, but the NMOS transistor 808 will begin to turn off as the $Lout_N$ signal begins to fall below 0.5V at t=40.375 ns (with an NMOS transistor threshold voltage $V_{tn}$ of 0.5V).)

Only a short time after t=40.325 ns, at t=40.335 ns, referring to FIG. 9C, the PMOS control signal $P_{Control}$ of the driver circuit 800 of FIG. 8 begins to rise from a logic low value (VDD/2=1.5V) toward a logic high value (VDD=3V) as the PMOS transistor 802 turns on and begins to conduct (in response to the falling value of the logic signal $Lout_P$) and to source current to charge the input gate capacitance presented by the amplifier circuit PMOS transistor 602 (of the amplifier circuit 600 of FIG. 6) which receives the PMOS control signal $P_{Control}$.

Only a short time after t=40.35 ns, at t=40.355 ns, referring to FIG. 9C, the NMOS control signal $N_{Control}$ of the driver circuit 800 of FIG. 8 begins to rise from a logic low value (VSS=0V) toward a logic high value (VDD/2=1.5V) as the PMOS transistor 806 turns on and begins to conduct (in response to the falling value of the logic signal $Lout_N$) and to source current to charge the input gate capacitance presented by the amplifier circuit NMOS transistor 604 (of the amplifier circuit 600 of FIG. 6) which receives the NMOS control signal $N_{Control}$.

According to the illustrative example, and in accordance with some embodiments, the logic circuit 700 is designed and configured to generate different fall times (and rise times) on the logic signals $Lout_P$ and $Lout_N$ (see, e.g., FIG. 9B), and, in so doing, configure and align the PMOS and NMOS control signals $P_{Control}$, $N_{Control}$ (see, e.g., FIG. 9C) generated by the driver circuit 800.

For example, when the logic signals $Lout_P$ and $Lout_N$ are both falling from a logic high to a logic low, the logic signal $Lout_P$ is falling more quickly than the logic signal $Lout_N$. The corresponding result and impact on the PMOS and NMOS control signals $P_{Control}$, $N_{Control}$ is that both will rise correspondingly from a logic low to a logic high and the $P_{Control}$ signal will begin to rise (t=40.335 ns) before the $N_{Control}$ signal begins to rise (t=40.355 ns) and the $P_{Control}$ signal will finish rising (e.g., t=40.385) before the $N_{Control}$ signal finishes rising (e.g., t=40.41). While the rise times of the $P_{Control}$ and $N_{Control}$ signals are comparable, the $P_{Control}$ signal does rise first because the logic signal $Lout_P$ falls more quickly than the logic signal $Lout_N$, so that the PMOS transistor 802 turns on before the PMOS transistor 806, causing the node 810 to begin to move toward logic high (VDD) before the node 812 begins to move toward logic high (VDD/2).

According to the illustrative example, as the PMOS control signal $P_{Control}$ rises, the $P_{Control}$ signal has been configured to reach the "turn off" voltage of the PMOS transistor 602 before the $N_{Control}$ signal rises and reaches the "turn on" voltage of the NMOS transistor 604. This condition on the relative signal rising transitions of the $P_{Control}$ and $N_{Control}$ signals (along with an accompanying condition on the signal falling transitions) results in the PMOS transistor 602 and the NMOS transistor 604 not being turned on or conducting at the same time.

In some embodiments not shown in the illustrative example and not shown in FIG. 9C, the PMOS and NMOS control signals $P_{Control}$ and $N_{Control}$ may be otherwise aligned such that, e.g., (on a signal rising transition) the $P_{Control}$ signal may be configured to rise to reach the "turn off" voltage of the PMOS transistor 602 at or close to the same time that the $N_{Control}$ signal rises and reaches the "turn on" voltage of the NMOS transistor 604, such that, e.g., the transistors 602, 604 are never "on" together, but are also not both "off" together. As another example, on a signal rising transition, the $P_{Control}$ signal may be configured to rise to reach the "turn off" voltage of the PMOS transistor 602 just after (or very shortly after) the $N_{Control}$ signal rises and reaches the "turn on" voltage of the NMOS transistor 604, such that, e.g., the transistors 602, 604 conduct together only briefly, or for a short time, such that the time that both transistors 602, 604 are on is still minimized (or at least minimal) but not nonexistent.

Returning to the illustrative example, as the PMOS control signal $P_{Control}$ rises, the $P_{Control}$ signal has been configured to reach the "turn off" voltage of the PMOS transistor 602 before the $N_{Control}$ signal rises and reaches the "turn on" voltage of the NMOS transistor 604. This condition on the relative signal rising transitions of the $P_{Control}$ and $N_{Control}$ signals (along with an accompanying condition on the signal falling transitions) results in the PMOS transistor 602 and the NMOS transistor 604 not being turned on or conducting at the same time.

According to the illustrative example, referring to FIG. 9C, FIG. 6, and FIG. 9D, when t=40.3 ns, the PMOS control signal $P_{Control}$ is at a logic low (VDD/2=1.5V), and the PMOS transistor 602 is turned on. When t=40.3 ns, the NMOS control signal $N_{Control}$ is also at a logic low (VSS=0V), and the NMOS transistor 604 is turned off. Since only the PMOS transistor 602 (of the transistors 602, 604; PMOS transistor 606 is also turned on at this time) is on and conducting, the capacitor 612 is charged to a logic high (VDD=3V) at the output node 610 and, as shown in FIG. 9D, at t=40.3 ns the amplified modulated carrier signal $DPAV_{Out}$ is at a logic high (VDD=3V).

According to the illustrative example, referring to FIG. 9C and FIG. 6, and FIG. 9D, at t=40.335 ns, the PMOS control signal $P_{Control}$ received by the PMOS transistor 602 of the amplifier circuit 600 begins to rise from a logic low value (VDD/2=1.5V). The PMOS transistor 602 remains turned on, the NMOS transistor 604 (with $N_{Control}$ still at logic low) remains off, and the amplified modulated carrier signal $DPAV_{Out}$ is at a logic high.

According to the illustrative example, referring to FIG. 9C and FIG. 6, and FIG. 9D, at t=40.355 ns, the NMOS control signal $N_{Control}$ received by the NMOS transistor 604 of the amplifier circuit 600 begins to rise from a logic low value (VSS=0V). (The PMOS control signal $P_{Control}$ is still rising and is roughly at 1.96V.) The PMOS transistor 602 remains turned on, the NMOS transistor 604 remains off, and the amplified modulated carrier signal $DPAV_{Out}$ is at a logic high.

According to the illustrative example, referring to FIG. 9C and FIG. 6, and FIG. 9D, just after t=40.365 ns, the PMOS control signal $P_{Control}$ begins to rise above 2.4V such that the gate to source voltage ($V_{gs}$) of the PMOS transistor 602 (between the gate input and the source at VDD) begins to fall below the PMOS transistor threshold voltage $V_{tp}$ of −0.6V of the PMOS transistor 602 in absolute value terms ($V_{gs}=|P_{Control}-VDD|<|V_{tp}|$), and the PMOS transistor 602 begins to turn off and stop conducting. (The NMOS control signal $N_{Control}$ is still rising and is roughly at 0.2V.) The NMOS transistor 604 remains off (note that both transistors 602, 604 are off at this time), and the amplified modulated carrier signal $DPAV_{Out}$ is at a logic high.

According to the illustrative example, referring to FIG. 9C and FIG. 6, and FIG. 9D, just after t=40.375 ns, the NMOS control signal $N_{Control}$ begins to exceed 0.5V such that the gate to source voltage ($V_{gs}$) of the NMOS transistor 604 (between the gate input and the source at VSS) begins to exceed the NMOS threshold voltage $V_{tn}$ (0.5V) of the NMOS transistor 604 ($V_{gs}=N_{Control}-(VSS)>V_{tn}$), and the NMOS transistor 604 turns on and begins to conduct. The PMOS transistor 602 remains off as the $P_{Control}$ signal is still rising and is roughly at 2.65V. The amplified modulated carrier signal $DPAV_{Out}$ is still at a logic high, with the NMOS transistor 604 just beginning to conduct.

According to the illustrative example, referring to FIG. 9C and FIG. 6, and FIG. 9D, only a short time after t=40.375 ns, at t=40.38 ns, the amplified modulated carrier signal $DPAV_{Out}$ begins to fall from the logic high value (VDD=3V) toward (eventually, at t=40.45 ns) a logic low value (VSS=0V) as the NMOS transistor 604 turns on and begins to conduct (in response to the rising value of the NMOS control signal $N_{Control}$) and to sink current to discharge the load capacitor 612 and to eventually (e.g., as $N_{Control}$ reaches a logic high of VDD/2=1.5V at t=40.44 ns) bring the output node 610 (and $DPAV_{Out}$) from a logic high (at t=40.375 ns) to a logic low (at t=40.45 ns). The PMOS transistor 602 remains off through this time period.

According to the illustrative example, referring to FIG. 9C and FIG. 6, and FIG. 9D, when t=40.5 ns, the PMOS control signal $P_{Control}$ has reached and is at a logic high (VDD=3V), and the PMOS transistor 602 remains turned off. When t=40.5 ns, the NMOS control signal $N_{Control}$ has reached and is at a logic high (VDD=1.5V), and the NMOS transistor 604 remains turned on. Since only the NMOS transistor 604 (of the transistors 602, 604; NMOS transistor 608 is also turned on at this time) is on and conducting, the capacitor 612 is now fully discharged to, and remains at, a logic low (VSS=0V) at the output node 610 and, as shown in FIG. 9D, at t=40.5 ns the amplified modulated carrier signal $DPAV_{Out}$ is at a logic low (VSS=0V). Note again that $DPAV_{Out}$ (per the example signal waveform shown in FIG. 9D) has a full voltage swing from 3V to 0V and is at a 50 percent duty cycle.

Note that during the PMOS and NMOS control signal $P_{Control}$, $N_{Control}$ signal rise transition portion of the illustrative example, the PMOS transistor 602 and the NMOS transistor 604 were never turned on and conducting at the same time; rather, both transistors 602, 604 were off briefly, or, when one transistor was on, the other was off.

Signal Processing Example 2: Phase Modulated Carrier Signals $PH_P$, $PH_N$ (From Logic High to Logic Low)

Referring first to FIG. 9A and FIG. 7, the example simulated first and second phase modulated carrier signals $PH_P$, $PH_N$ received at the logic circuit 700 of FIG. 7 are essentially identical (sharing the same amplitude and phase), level shifted versions of one another as shown in FIG. 9A, with the voltage values shown on the right hand and left hand vertical axes, respectively. The horizontal axis on FIG. 9A (and on FIGS. 9B-9D as well) measures simulation time (t) and ranges from 40.0 to 41.0 nanoseconds ("ns"; $10^{-9}$ seconds). Times (and voltage values) referenced below with respect to, e.g., this illustrative example are estimated based on inspection of the signal waveform diagrams in FIGS. 9A-9D and are not precise simulation time values (or voltage value), and for ease of description the word "roughly" or "approximately" or "around" may be assumed to preface any referenced time value (voltage value). Supply voltage values for this illustrative example are assumed to be (or approximate) VDD=3V, VDD/2=1.5V, and VSS=0V, but of course other voltage supply values and signal voltage ranges and values may be used. The signal waveforms shown in FIGS. 9A-9D are clearly non-limiting example simulated signals intended to illustrate example operation of example circuit implementations of the DPA cell 500 of FIG. 5 (logic circuit 700 of FIG. 7, driver circuit 800 of FIG. 8, and amplifier circuit 600 of FIG. 6) in accordance with some embodiments.

Just prior to, e.g., t=40.4 ns, both the phase modulated carrier signals $PH_P$, $PH_N$ are at logic high values (here around VDD=3V and VDD/2=1.5V, respectively) such that (referring to the logic circuit 700 of FIG. 7) the PMOS transistor 706 is off, the NMOS transistor 708 is on, and the PMOS transistor 716 is off, and the NMOS transistor 720 is on. As such, just prior to t=40.4 ns, $Lout_P$ and $Lout_N$ at nodes 726, 728 are at logic low values (here around VDD/2=1.5V and VSS=0V, respectively) or approaching these values (see FIG. 9B, $Lout_P$=1.5V and $Lout_N$=0.3V just prior to t=40.4 ns).

At time t=40.45 ns, both the phase modulated carrier signals $PH_P$, $PH_N$ begin to fall from the logic high values toward logic low values (here around VDD/2=1.5V and VSS=0V, respectively). During this rise, just after time t=40.5 ns, both the phase modulated carrier signals $PH_P$, $PH_N$ begin to fall below values of 2.4V and 0.9V respectively. When the $PH_P$ signal begins to fall below 2.4V just after t=40.5 ns, the gate to source voltage ($V_{gs}$) of the PMOS transistor 706 (between the gate input and the voltage VDD at the source; PMOS transistors 702, 704 are on per Case 2B and conduct VDD to the source of the PMOS transistor 706) begins to exceed the PMOS transistor threshold voltage $V_{tp}$ of −0.6V of the PMOS transistor 706 in absolute terms ($V_{gs}$=|$PH_P$−(VDD)|>|$V_{tp}$|), and the PMOS transistor 706 turns on and begins to conduct. (The NMOS transistor 708 is still on at this time t=40.5 ns, but the NMOS transistor 708 will begin to turn off as the $PH_P$ signal begins to fall below 2.0V at t=40.52 ns (with an NMOS transistor threshold voltage $V_{tn}$ of −0.5V).) When the $PH_N$ signal begins to fall below 0.9V just after t=40.5 ns, the gate to source voltage ($V_{gs}$) of the PMOS transistor 716 (between the gate input and the voltage VDD/2 at the source; PMOS transistor 714 is on per Case 2B and conducts VDD/2 to the source of the PMOS transistor 716) begins to exceed the PMOS threshold voltage $V_{tp}$ of −0.6V of the PMOS transistor 716 ($V_{gs}$=$PH_N$−(VDD/2)>$V_{tn}$), and the PMOS transistor 716 turns on and begins to conduct. (The NMOS transistor 720 is still on at this time t=40.5 ns, but the NMOS transistor 720 will begin to turn off as the $PH_N$ signal begins to fall below 0.5V at t=40.52 ns (with an NMOS transistor threshold voltage $V_{tn}$ of −0.6V).)

At or only a short time after t=40.5 ns, at t=40.505 ns, referring to FIG. 9B, the output logic signals $Lout_P$ and $Lout_N$ of the logic circuit 700 of FIG. 7 begin to rise from the logic low values ($Lout_P$=1.5V and $Lout_N$=0V) toward logic high values as the PMOS transistors 706 and 716 turn on and begin to conduct and to source current to charge the input gate capacitance presented by the driver circuit transistors 802, 804 and 806, 808 (of the driver circuit 800 of FIG. 8) which receive the logic signals $Lout_P$ and $Lout_N$, respectively.

According to the illustrative example, and in accordance with some embodiments, the logic circuit 700 is designed and configured to generate different rise times (and fall times) on the logic signals $Lout_P$ and $Lout_N$. For example, the $Lout_P$ signal rises from a logic low to a logic high from 40.505 ns to 40.7 ns, while the $Lout_N$ signal rises from a logic low to a logic high from 40.505 ns to 40.62 ns, with the $Lout_N$ signal rising significantly faster than the $Lout_P$ signal. According to the illustrative example, and as described above with respect to, e.g., the logic circuit 700 of FIG. 7, the difference in logic signal $Lout_P$, $Lout_N$ rise times is due to at least partly to a difference in series resistance faced by the PMOS transistors 706 and 716, respectively, when the example implementation of the DPA cell 500 is enabled and selectively engaged (e.g., Case 2B). When the PMOS transistor 716 turns on and begins to conduct, the PMOS transistor 716 faces series resistance on the PMOS transistor's 716 conducting path (from VDD/2 at node 730 to the $Lout_N$ signal at the output node 728) presented by the conducting PMOS transistor 714 (in Case 2B turned on by the ACW signal $ACW_N$). By contrast, when the PMOS transistor 706 turns on and begins to conduct, the PMOS transistor 706 faces series resistance on the PMOS transistor's 706 conducting path (from VDD to the $Lout_P$ signal at the output node 726) presented by both of the conducting PMOS transistors 702, 704 (in Case 2B turned on by the enable signal $DPA_{ON\_P}$ and the ACW signal $ACW_P$) between VDD and the source of the PMOS transistor 706. Therefore, relatively speaking, assuming, e.g., identical geometry and operating conditions, the PMOS transistor 706 ("PSLOW") will conduct more slowly than the PMOS transistor 716 ("PFAST"), leading to a shorter rise time for the logic signal $Lout_N$ than the logic signal $Lout_P$, as shown in FIG. 9B.

According to the illustrative example, and referring to FIGS. 9B and 9C, the different rise times of the logic signals $Lout_P$, $Lout_N$ due to differences in series resistance in the PMOS transistor 706, 716 conducting paths in the logic circuit 700 of FIG. 7 are impactful on the PMOS and NMOS control signals $P_{Control}$, $N_{Control}$ generated by the driver circuit 800 of FIG. 8. In some embodiments, and as shown in the example signal waveforms $P_{Control}$, $N_{Control}$ of FIG. 9C, the different rise times (and fall times) of the logic signals $Lout_P$, $Lout_N$ lead to different duty cycles for the PMOS and NMOS control signals $P_{Control}$, $N_{Control}$. The different duty cycles (controlled by the logic circuit 700 and the $Lout_P$, $Lout_N$ logic signal outputs) of the PMOS and NMOS control signals $P_{Control}$, $N_{Control}$ permit a relative alignment of $P_{Control}$, $N_{Control}$ with respect to one another such that the respective PMOS and NMOS transistors 602, 604 of the amplifier circuit 600 of FIG. 6 configured to receive $P_{Control}$, $N_{Control}$ respectively, e.g., do not conduct simultaneously and are thus non-overlapping.

According to the illustrative example, as described above, at or only a short time after t=40.5 ns, at t=40.505 ns, referring to FIG. 9B, the output logic signals $Lout_P$ and $Lout_N$ of the logic circuit 700 of FIG. 7 begin to rise from the logic low values ($Lout_P$=1.5V and $Lout_N$=0V) toward logic high values as the PMOS transistors 706 and 716 turn on and begin to conduct. For example, the $Lout_P$ signal rises from a logic low to a logic high from 40.505 ns to 40.7 ns, while the $Lout_N$ signal rises from a logic low to a logic high from 40.505 ns to 40.62 ns, with the $Lout_N$ signal rising significantly faster than the $Lout_P$ signal.

Referring to FIG. 9B, during this rise of the logic signals $Lout_P$ and $Lout_N$ toward logic high values (here around VDD=3V and VDD/2=1.5V, respectively), both the logic signals $Lout_P$ and $Lout_N$ received by the driver circuit 800 of FIG. 8 begin to exceed values of 2.0V and 0.5V respectively. When the $Lout_N$ signal received at the NMOS transistor 808 of the driver circuit 800 begins rise above 0.5V just after t=40.53 ns, the gate to source voltage ($V_{gs}$) of the NMOS transistor 808 (between the gate input and the source at VSS) begins to exceed the NMOS transistor threshold voltage $V_{tn}$ of 0.5V of the NMOS transistor 808 ($V_{gs}$=$Lout_N$–(VSS)>$V_{tn}$), and the NMOS transistor 808 turns on and begins to conduct. (The PMOS transistor 806 is still on at this time t=40.53 ns, but the PMOS transistor 806 will begin to turn off as the $Lout_N$ signal begins to rise above 0.9V at t=40.545 ns (with a PMOS transistor threshold voltage $V_{tp}$ of –0.6V).) When the $Lout_P$ signal received at the NMOS transistor 804 of the driver circuit 800 begins to rise above 2.0V just after t=40.545 ns, the gate to source voltage ($V_{gs}$) of the NMOS transistor 804 (between the gate input and the source at VDD/2) begins to exceed the NMOS transistor threshold voltage $V_{tn}$ of 0.5V of the NMOS transistor 804 ($V_{gs}$=$Lout_P$–(VDD/2)>$V_{tn}$), and the NMOS transistor 804 turns on and begins to conduct. (The PMOS transistor 802 is still on at this time t=40.545 ns, but the PMOS transistor 802 will begin to turn off as the $Lout_P$ signal begins to rise above 2.4V at t=40.57 ns (with a PMOS transistor threshold voltage $V_{tp}$ of –0.6V).)

At or only a short time after t=40.53 ns, at t=40.53 ns, referring to FIG. 9C, the NMOS control signal $N_{Control}$ of the driver circuit 800 of FIG. 8 begins to fall from a logic high value (VDD/2=1.5V) toward a logic low value (VSS=0V) as the NMOS transistor 808 turns on and begins to conduct (in response to the rising value of the logic signal $Lout_N$) and to sink current to discharge the input gate capacitance presented by the amplifier circuit NMOS transistor 604 (of the amplifier circuit 600 of FIG. 6) which receives the NMOS control signal $N_{Control}$.

At or only a short time after t=40.545 ns, at t=40.545 ns, referring to FIG. 9C, the PMOS control signal $P_{Control}$ of the driver circuit 800 of FIG. 8 begins to fall from a logic high value (VDD=3V) toward a logic low value (VDD/2=1.5V) as the NMOS transistor 804 turns on and begins to conduct (in response to the rising value of the logic signal $Lout_P$) and to sink current to discharge the input gate capacitance presented by the amplifier circuit PMOS transistor 602 (of the amplifier circuit 600 of FIG. 6) which receives the PMOS control signal $P_{Control}$.

According to the illustrative example, and in accordance with some embodiments, the logic circuit 700 is designed and configured to generate different rise times (and fall times) on the logic signals $Lout_P$ and $Lout_N$ (see, e.g., FIG. 9B), and, in so doing, configure and align the PMOS and NMOS control signals $P_{Control}$, $N_{Control}$ (see, e.g., FIG. 9C) generated by the driver circuit 800.

For example, when the logic signals $Lout_P$ and $Lout_N$ are both rising from a logic low to a logic high, the logic signal $Lout_N$ is rising more quickly than the logic signal $Lout_P$. The corresponding result and impact on the PMOS and NMOS control signals $P_{Control}$, $N_{Control}$ is that both will fall correspondingly from a logic high to a logic low and the $N_{Control}$ signal will begin to fall (t=40.53 ns) before the $P_{Control}$ signal begins to fall (t=40.545 ns) and the $N_{Control}$ signal will finish falling (e.g., t=40.58) before the $P_{Control}$ signal finishes falling (e.g., t=40.63). The fall times of the $P_{Control}$ and $N_{Control}$ signals are somewhat different, and the $N_{Control}$ signal does fall first because the logic signal $Lout_N$ rises more quickly than the logic signal $Lout_P$, so that the NMOS transistor 808 turns on before the NMOS transistor 804, causing the node 812 to begin to move toward logic low (VSS) before the node 810 begins to move toward logic low (VDD/2).

According to the illustrative example, as the NMOS control signal $N_{Control}$ falls, the $N_{Control}$ signal has been configured to reach the "turn off" voltage of the NMOS transistor 604 before the $P_{Control}$ signal falls and reaches the "turn on" voltage of the PMOS transistor 602. This condition on the relative signal falling transitions of the $P_{Control}$ and $N_{Control}$ signals (along with an accompanying condition on the signal rising transitions) results in the PMOS transistor 602 and the NMOS transistor 604 not being turned on or conducting at the same time.

In some embodiments not shown in the illustrative example and not shown in FIG. 9C, the PMOS and NMOS control signals $P_{Control}$ and $N_{Control}$ may be otherwise aligned such that, e.g., (on a signal falling transition) the $N_{Control}$ signal may be configured to fall to reach the "turn off" voltage of the NMOS transistor 604 at or close to the same time that the $P_{Control}$ signal falls and reaches the "turn on" voltage of the PMOS transistor 602, such that, e.g., the transistors 602, 604 are never "on" together, but are also not both "off" together. As another example, on a signal falling transition, the $N_{Control}$ signal may be configured to fall to reach the "turn off" voltage of the NMOS transistor 604 just after (or very shortly after) the $P_{Control}$ signal falls and reaches the "turn on" voltage of the PMOS transistor 602, such that, e.g., the transistors 602, 604 conduct together only briefly, or for a short time, such that the time that both transistors 602, 604 are on is still minimized (or at least minimal) but not nonexistent.

Returning to the illustrative example, as the NMOS control signal $N_{Control}$ falls, the $N_{Control}$ signal has been configured to reach the "turn off" voltage of the NMOS transistor 604 before the $P_{Control}$ signal falls and reaches the "turn on" voltage of the PMOS transistor 602. This condition on the relative signal falling transitions of the $P_{Control}$ and $N_{Control}$ signals (along with an accompanying condition on the signal rising transitions) results in the PMOS transistor 602 and the NMOS transistor 604 not being turned on or conducting at the same time.

According to the illustrative example, referring to FIG. 9C, FIG. 6, and FIG. 9D, when t=40.5 ns, the NMOS control signal $N_{Control}$ is at a logic high (VDD/2=1.5V), and the NMOS transistor 604 is turned on. When t=40.5 ns, the PMOS control signal $P_{Control}$ is also at a logic high (VDD=3V), and the PMOS transistor 602 is turned off. Since only the NMOS transistor 604 (of the transistors 602, 604; NMOS transistor 608 is also turned on at this time) is on and conducting, the capacitor 612 is discharged to a logic low (VSS=0V) at the output node 610 and, as shown in FIG. 9D, at t=40.5 ns the amplified modulated carrier signal $DPAV_{Out}$ is at a logic low (VSS=0V).

According to the illustrative example, referring to FIG. 9C and FIG. 6, and FIG. 9D, at t=40.53 ns, the NMOS control signal $N_{Control}$ received by the NMOS transistor 604 of the amplifier circuit 600 begins to fall from a logic high value (VDD/2=1.5V). The NMOS transistor 604 remains turned on, the PMOS transistor 602 (with $P_{Control}$ still at logic high) remains off, and the amplified modulated carrier signal $DPAV_{Out}$ is at a logic low.

According to the illustrative example, referring to FIG. 9C and FIG. 6, and FIG. 9D, at t=40.545 ns, the PMOS control signal $P_{Control}$ received by the PMOS transistor 602 of the amplifier circuit 600 begins to fall from a logic high value (VDD=3V). (The NMOS control signal $N_{Control}$ is still falling and is roughly at 1.4V.) The NMOS transistor 604 remains turned on, the PMOS transistor 602 remains off, and the amplified modulated carrier signal $DPAV_{Out}$ is at a logic high.

According to the illustrative example, referring to FIG. 9C and FIG. 6, and FIG. 9D, just after t=40.565 ns, the NMOS control signal $N_{Control}$ begins to fall below 0.5V such that the gate to source voltage ($V_{gs}$) of the NMOS transistor 604 (between the gate input and the source at VSS) begins to fall below the NMOS transistor threshold voltage $V_{tn}$ of 0.5V of the NMOS transistor 604 ($V_{gs}=N_{Control}-(VSS)<V_{tn}$), and the NMOS transistor 604 begins to turn off and stop conducting. (The PMOS control signal $P_{Control}$ is still falling and is roughly at 2.8V.) The PMOS transistor 602 remains off (note that both transistors 602, 604 are off at this time), and the amplified modulated carrier signal $DPAV_{Out}$ is at a logic high.

According to the illustrative example, referring to FIG. 9C and FIG. 6, and FIG. 9D, just after t=40.575 ns, the PMOS control signal $P_{Control}$ begins to fall below 2.4V such that the gate to source voltage ($V_{gs}$) of the PMOS transistor 602 (between the gate input and the source at VDD) begins to exceed the PMOS threshold voltage $V_{tp}$ (−0.6V) of the PMOS transistor 602 in absolute value terms ($V_{gs}=|P_{Control}-VDD|>|V_{tp}|$), and the PMOS transistor 602 turns on and begins to conduct. The NMOS transistor 604 remains off as the $N_{Control}$ signal is still falling and is roughly at 0.1V. The amplified modulated carrier signal $DPAV_{Out}$ is still at a logic high, with the PMOS transistor 602 just beginning to conduct.

According to the illustrative example, referring to FIG. 9C and FIG. 6, and FIG. 9D, only a short time after t=40.575 ns, at t=40.58 ns, the amplified modulated carrier signal $DPAV_{Out}$ begins to rise from the logic low value (VSS=0V) toward (eventually, at t=40.69 ns) a logic high value (VDD=3V) as the PMOS transistor 602 turns on and begins to conduct (in response to the falling value of the PMOS control signal $P_{Control}$) and to source current to charge the load capacitor 612 and to eventually (e.g., as $P_{Control}$ reaches a logic low of VDD/2=1.5V at t=40.635 ns) bring the output node 610 (and $DPAV_{Out}$) from a logic low (at t=40.575 ns) to a logic high (at t=40.69 ns). The NMOS transistor 604 remains off through this time period.

According to the illustrative example, referring to FIG. 9C and FIG. 6, and FIG. 9D, when t=40.7 ns, the NMOS control signal $N_{Control}$ has reached and is at a logic low (VSS=0V), and the NMOS transistor 604 remains turned off. When t=40.7 ns, the PMOS control signal $P_{Control}$ has reached and is at a logic low (VDD/2=1.5V), and the PMOS transistor 602 remains turned on. Since only the PMOS transistor 602 (of the transistors 602, 604; PMOS transistor 606 is also turned on at this time) is on and conducting, the capacitor 612 is now fully charged to, and remains at, a logic high (VDD=3V) at the output node 610 and, as shown in FIG. 9D, at t=40.7 ns the amplified modulated carrier signal $DPAV_{Out}$ is at a logic high (VDD=3V). Note again that $DPAV_{Out}$ (per the example signal waveform shown in FIG. 9D) has a full voltage swing from 3V to 0V and is at a 50 percent duty cycle.

Note that during the PMOS and NMOS control signal $P_{Control}$, $N_{Control}$ signal fall transition portion of the illustrative example, the PMOS transistor 602 and the NMOS transistor 604 were never turned on and conducting at the same time; rather, both transistors 602, 604 were off briefly, or, when one transistor was on, the other was off.

Figure 10:
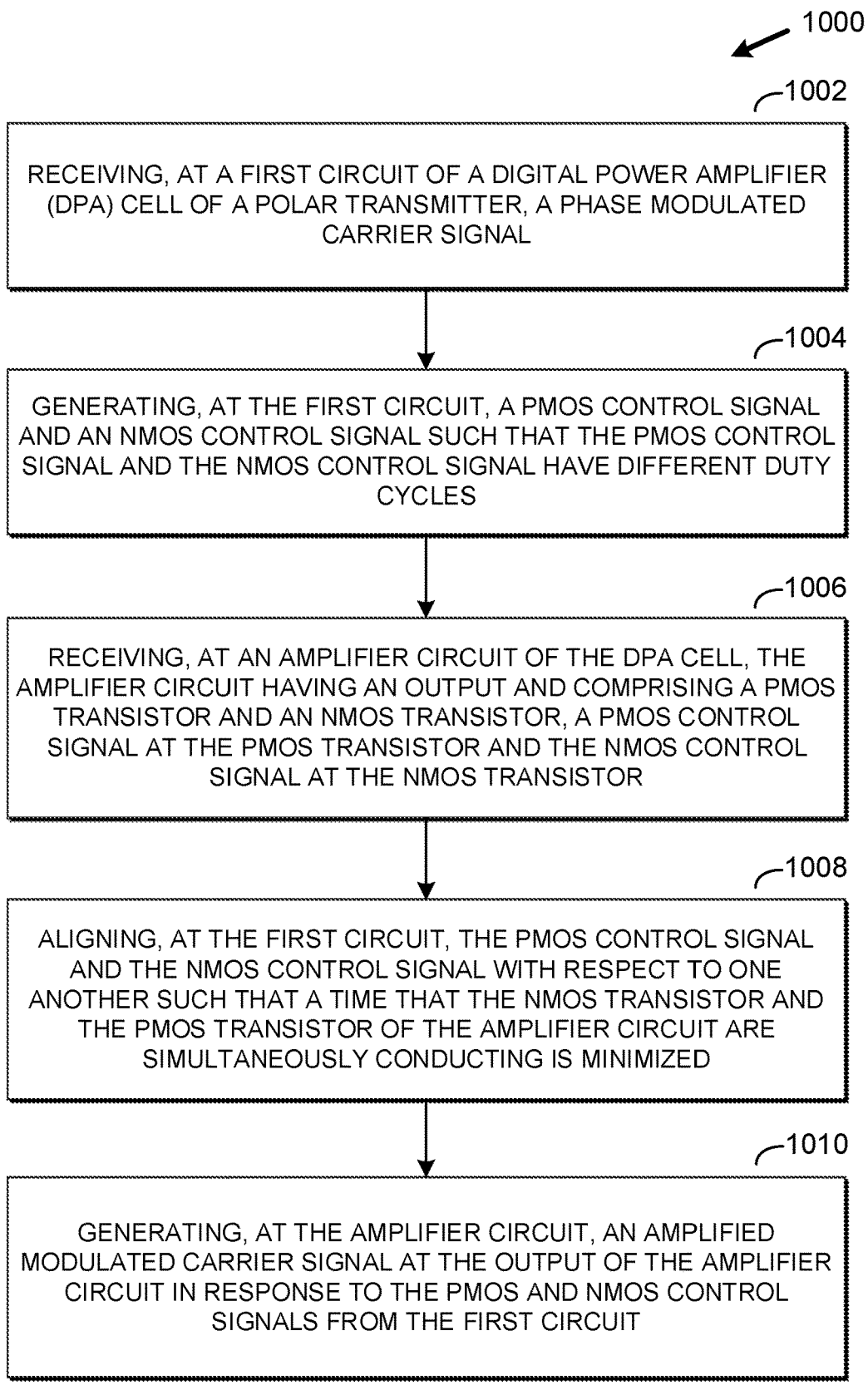
FIG. 10 is a flow diagram illustrating an example method in accordance with some embodiments.

FIG. 10 is a flow diagram illustrating an example method 1000 in accordance with some embodiments. The method includes, at 1002, receiving, at a first circuit of a digital power amplifier (DPA) cell of a polar transmitter, a phase modulated carrier signal. The method further includes, at 1004, generating, at the first circuit, a PMOS control signal and an NMOS control signal such that the PMOS control signal and the NMOS control signal have different duty cycles. The method further includes, at 1006, receiving, at an amplifier circuit of the DPA cell, the amplifier circuit having an output and including a PMOS transistor and an NMOS transistor, a PMOS control signal at the PMOS transistor and the NMOS control signal at the NMOS transistor. The method further includes, at 1008, aligning, at the first circuit, the PMOS control signal and the NMOS control signal with respect to one another such that a time that the NMOS transistor and the PMOS transistor of the amplifier circuit are simultaneously conducting is minimized. The method further includes, at 1010, generating, at the amplifier circuit, an amplified modulated carrier signal at the output of the amplifier circuit in response to the PMOS and NMOS control signals from the first circuit. In some embodiments, the amplified modulated carrier signal has a duty cycle of approximately 50 percent. In some embodiments, the first circuit include a logic circuit and a driver circuit.

Figure 11:
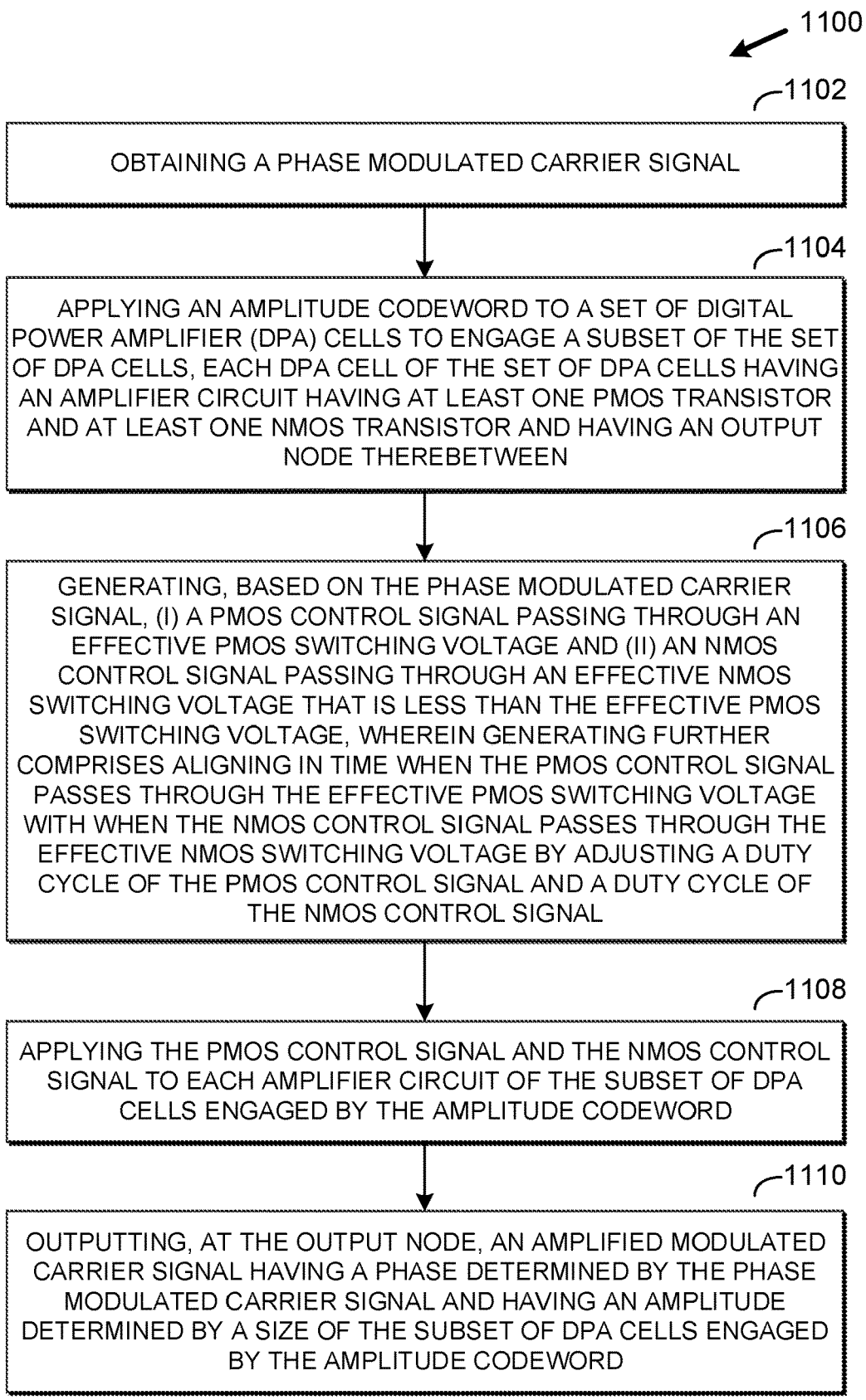
FIG. 11 is a flow diagram illustrating another example method in accordance with some embodiments.

FIG. 11 is a flow diagram illustrating another example method 1100 in accordance with some embodiments. The method includes, at 1102, obtaining a phase modulated carrier signal. The method further includes, at 1104, applying an amplitude codeword to a set of digital power amplifier (DPA) cells to engage a subset of DPA cells of the set of DPA cells, each DPA cell of the set of DPA cells having an amplifier circuit having at least one PMOS transistor and at least one NMOS transistor and having an output node therebetween. The method further includes, at 1106, generating, based on the phase modulated carrier signal, (i) a PMOS control signal passing through an effective PMOS switching voltage and (ii) an NMOS control signal passing through an effective NMOS switching voltage that is less than the effective PMOS switching voltage, wherein generating further comprises aligning in time when the PMOS control signal passes through the effective PMOS switching voltage with when the NMOS control signal passes through the effective NMOS switching voltage by adjusting a duty cycle of the PMOS control signal and a duty cycle of the NMOS control signal. The method further includes, at 1108, applying the PMOS control signal and the NMOS control signal to each amplifier circuit of the subset of DPA cells engaged by the amplitude codeword. The method further includes, at 1110, outputting, at the output node, an amplified modulated carrier signal having a phase determined by the phase modulated carrier signal and having an amplitude determined by a size of the subset of DPA cells engaged by the amplitude codeword. In some embodiments, the duty cycle of the PMOS control signal is greater than 50 percent and the duty cycle of the NMOS control signal is less than 50 percent. In some embodiments, the amplified modulated carrier signal has a duty cycle of approximately 50 percent.

In some embodiments, for example, each DPA cell having an amplifier circuit having at least one PMOS transistor and at least one NMOS transistor and having an output node therebetween, refers to e.g., a DPA cell such as DPA cell 500 of FIG. 5, which includes an amplifier circuit 504. An example implementation of the amplifier circuit 504 is shown in FIG. 6, which shows an amplifier circuit 600 which includes a PMOS transistor 602 and an NMOS transistor 604. According to the example of FIG. 6, between the drains of the PMOS and NMOS transistors 602, 604 and an output node 610 are PMOS and NMOS transistors 606, 608.

In some embodiments, for example, the PMOS control signal passing through an effective PMOS switching voltage includes, e.g., the PMOS control signal $P_{Control}$ of FIGS. 5, 6, and 8 passing through an effective PMOS switching voltage of VDD−($V_{tp}$) for the PMOS transistor 602 of the amplifier circuit 600 of FIG. 6. For example, with reference to FIG. 9C, and assuming VDD=3V and $V_{tp}$=−0.6V, the PMOS control signal $P_{Control}$ passes through a an effective PMOS switching voltage of 2.4V (e.g., VDD−($V_{tp}$)=3V−(−0.6V)).

In some embodiments, for example, the NMOS control signal passing through an effective NMOS switching voltage includes, e.g., the NMOS control signal $N_{Control}$ of FIGS. 5, 6, and 8 passing through an effective NMOS switching voltage of $V_{tn}$−VSS for the NMOS transistor 604 of the amplifier circuit 600 of FIG. 6. For example, with reference to FIG. 9C, and assuming VSS=0V and $V_{tn}$=−0.5V, the NMOS control signal $N_{Control}$ passes through a an effective NMOS switching voltage of 0.5V (e.g., $V_{tn}$−VSS=0.5V−0V).

In some embodiments, for example, aligning in time when the PMOS control signal passes through the effective PMOS switching voltage with when the NMOS control signal passes through the effective NMOS switching voltage by adjusting a duty cycle of the PMOS control signal and a duty cycle of the NMOS control signal includes, e.g., adjusting a duty cycle of the PMOS control signal $P_{Control}$ of FIGS. 5, 6, and 8 and a duty cycle of the NMOS control signal $N_{Control}$ of FIGS. 5, 6, and 8 such the PMOS and NMOS control signals respectively pass through the effective PMOS and NMOS switching voltages at comparable times so that, e.g., the PMOS and NMOS transistors 602, 604 are prevented from conducting simultaneously, or, e.g., conduct together only briefly.

As a first example, on a signal rising transition, when the PMOS control signal $P_{Control}$ is rising, the $P_{Control}$ signal may be configured to reach the "turn off" voltage of the PMOS transistor 602 (a) before the $N_{Control}$ signal rises and reaches the "turn on" voltage of the NMOS transistor 604 (resulting in, e.g., the case that the PMOS transistor 602 and the NMOS transistor 604 are not turned or conducting at the same time); (b) at or close to the same time that the $N_{Control}$ signal rises and reaches the "turn on" voltage of the NMOS transistor 604 (resulting in, e.g., the case that the PMOS and NMOS transistors 602, 604 are never "on" together, but are also not both "off" together); or (c) just after (or very shortly after) the $N_{Control}$ signal rises and reaches the "turn on" voltage of the NMOS transistor 604 (resulting in, e.g., the case that the PMOS and NMOS transistors 602, 604 conduct together only briefly, or for a short time, such that the time that both transistors 602, 604 are on is still minimized (or at least minimal) but not nonexistent).

As another example, on a signal falling transition, when the NMOS control signal $P_{Control}$ is falling, the $N_{Control}$ signal may be configured to reach the "turn off" voltage of the NMOS transistor 604 (a) before the $P_{Control}$ signal falls and reaches the "turn on" voltage of the PMOS transistor 602 (resulting in, e.g., the case that the PMOS transistor 602 and the NMOS transistor 604 are not turned or conducting at the same time); (b) at or close to the same time that the $P_{Control}$ signal falls and reaches the "turn on" voltage of the PMOS transistor 602 (resulting in, e.g., the case that the PMOS and NMOS transistors 602, 604 are never "on" together, but are also not both "off" together); or (c) just after (or very shortly after) the $P_{Control}$ signal falls and reaches the "turn on" voltage of the PMOS transistor 602 (resulting in, e.g., the case that the PMOS and NMOS transistors 602, 604 conduct together only briefly, or for a short time, such that the time that both transistors 602, 604 are on is still minimized (or at least minimal) but not nonexistent).

Example Embodiments

The following are example embodiments, not claims.

A1. A polar transmitter, comprising:
a digital power amplifier (DPA) cell, comprising:
a first circuit configured to receive a phase modulated carrier signal and configured to generate a PMOS control signal and an NMOS control signal such that the PMOS control signal and the NMOS control signal have different duty cycles; and
an amplifier circuit having an output and comprising a PMOS transistor and an NMOS transistor, the amplifier circuit configured to receive the PMOS control signal at the PMOS transistor and the NMOS control signal at the NMOS transistor, wherein the first circuit is configured to align the PMOS control signal and the NMOS control signal with respect to one another such that a time that the NMOS transistor and the PMOS transistor of the amplifier circuit are simultaneously conducting is minimized,
wherein the amplifier circuit is further configured to generate an amplified modulated carrier signal at the output of the amplifier circuit in response to the PMOS and NMOS control signals from the first circuit.

A2. The polar transmitter of A1, wherein the amplified modulated carrier signal has a duty cycle of approximately 50 percent.

A3. The polar transmitter of any of A1-A2, wherein the first circuit is configured to align the PMOS control signal and the NMOS control signal with respect to one another such that the PMOS control signal and the NMOS control signal are operative to prevent the PMOS transistor and the NMOS transistor from conducting at the same time.

A4. The polar transmitter of any of A1-A2, wherein the first circuit is configured to align the PMOS control signal and the NMOS control signal with respect to one another such that when the NMOS transistor is switched on, the PMOS transistor is switched off and when the PMOS transistor is switched on, the NMOS transistor is switched off.

A5. The polar transmitter of any of A1-A2, wherein the DPA cell further comprises a load capacitor connected to the output of the amplifier circuit, and wherein the first circuit is configured to align the PMOS control signal and the NMOS control signal with respect to one another such that a shoot through current from the PMOS transistor to the NMOS transistor is reduced to minimize wasting current not used to either charge or discharge the load capacitor of the amplifier circuit.

A6. The polar transmitter of any of A1-A5, wherein the PMOS control signal has a duty cycle greater than a duty cycle of the NMOS control signal.

A7. The polar transmitter of A6, wherein the PMOS control signal has a duty cycle greater than 50 percent and the NMOS control signal has a duty cycle less than 50 percent.

A8. The polar transmitter of any of A1-A7, wherein the first circuit of the DPA cell comprises:
a logic circuit configured to receive the phase modulated carrier signal and to generate a first logic signal and a second logic signal such that the first logic signal and the second logic signal have different rise and fall times relative to one another.

A9. The polar transmitter of A8, wherein the logic circuit is configured to generate the first logic signal and the second logic signal such that a rise time of the first logic signal exceeds a rise time of the second logic signal and a fall time of the second logic signal exceeds a fall time of the first logic signal.

A10. The polar transmitter of A9, wherein the phase modulated carrier signal comprises a first phase modulated carrier signal and a second phase modulated carrier signal and wherein the logic circuit comprises a first logic PMOS transistor and a first logic NMOS transistor each configured to receive the first phase modulated carrier signal and wherein the logic circuit further comprises a second logic PMOS transistor and a second logic NMOS transistor each configured to receive the second phase modulated carrier signal.

A11. The polar transmitter of A10, wherein the logic circuit is configured such that the first logic PMOS transistor conducts more slowly in response to the first phase modulated carrier signal than the second logic PMOS transistor conducts in response to the second phase modulated carrier signal, causing the rise time of the first logic signal to exceed the rise time of the second logic signal.

A12. The polar transmitter of any of A10-A11, wherein the logic circuit is configured such that the second logic NMOS transistor conducts more slowly in response to the second phase modulated carrier signal than the first logic NMOS transistor conducts in response to the first phase modulated carrier signal, causing the fall time of the second logic signal to exceed the fall time of the first logic signal.

A13. The polar transmitter of any of A8-A12, wherein the logic circuit comprises MOSFET transistors, wherein two or more MOSFET transistors of the MOSFET transistors of the logic circuit have different relative sizes that contribute to the first logic signal and the second logic signal having different rise and fall times relative to one another.

A14. The polar transmitter of any of A8-A13, wherein the logic circuit comprises MOSFET transistors, and wherein at least one MOSFET transistor of the MOSFET transistors is configured to, when conducting, present a series resistance to at least one other MOSFET transistor of the MOSFET transistors of the logic circuit, wherein the series resistance when present contributes to the first logic signal and the second logic signal having different rise and fall times relative to one another.

A15. The polar transmitter of any of A8-A14, wherein the first circuit of the DPA cell further comprises:
a driver circuit coupled to the logic circuit and configured to receive the first logic signal and the second logic signal and configured to generate the PMOS control signal and the NMOS control signal having the different duty cycles, such that a duty cycle of the PMOS control signal exceeds a duty cycle of the NMOS control signal based on the different rise and fall times of the first logic signal and the second logic signal relative to one another.

A16. The polar transmitter of A15, wherein the driver circuit comprises:
a first CMOS inverter configured to receive the first logic signal and configured to generate the PMOS control signal; and
a second CMOS inverter configured to receive the second logic signal and configured to generate the NMOS control signal.

A17. The polar transmitter of any of A1-A16, wherein the amplifier circuit of the DPA cell further comprises a second PMOS transistor and a second NMOS transistor connected together to the output of the amplifier circuit and configured to receive a midpoint supply voltage, wherein the PMOS transistor is connected to the output through the second PMOS transistor and the NMOS transistor is connected to the output through the second NMOS transistor.

A18. The polar transmitter of A17, wherein the amplifier circuit of the DPA cell is further configured such that when the PMOS control signal received at the PMOS transistor is at the midpoint supply voltage, the PMOS transistor is switched on and provides a logic high to the output via the second PMOS transistor and such that when the NMOS control signal received at the NMOS transistor is at the midpoint supply voltage, the NMOS transistor is switched on and provides a logic low to the output via the second NMOS transistor.

A19. The polar transmitter of any of A1-A18, further comprising:
a digital power amplifier (DPA), the DPA comprising:
a plurality of DPA cells configured to receive the phase modulated carrier signal, wherein the plurality of DPA cells comprises the DPA cell.

A20. The polar transmitter of A19, wherein the polar transmitter shares resources with a polar receiver and wherein the plurality of DPA cells are configured to receive an enable signal for the DPA that is operative to (a) activate the DPA on when the polar transmitter is operational and transmitting and to (b) turn the DPA off when the polar receiver is operational and receiving.

A21. The polar transmitter of any of A19-A20, wherein the plurality of DPA cells are configured to receive an amplitude codeword signal that is operative to set a gain of the DPA by selectively engaging various DPA cells of the plurality of DPA cells.

A22. The polar transmitter of any of A19-A20, wherein the plurality of DPA cells, including the DPA cell, are further configured to receive a respective bit of an amplitude codeword signal to selectively engage a subset of DPA cells of the plurality of DPA cells, wherein the selectively engaged subset of DPA cells of the plurality of DPA cells is configured to contribute to a combined amplified modulated carrier signal that comprises, when the DPA cell is engaged by its respective bit of the amplitude codeword signal, the amplified modulated carrier signal generated by the amplifier circuit of the DPA cell.

A23. The polar transmitter of A22, wherein the combined amplified modulated carrier signal has a phase determined by the phase modulated carrier signal and has an amplitude determined by a size of the selectively engaged subset of DPA cells of the plurality of DPA cells.

A24. The polar transmitter of any of A22-A23, wherein the combined amplified modulated carrier signal has a duty cycle of approximately 50 percent.

A25. The polar transmitter of any of A19, wherein the digital power amplifier (DPA) further comprises:
a plurality of parallel DPA cells configured to receive another phase modulated carrier signal, wherein the another phase modulated carrier signal is 180 degrees out of phase with the phase modulated carrier signal.

A26. The polar transmitter of A25, wherein the plurality of DPA cells are configured to generate a combined amplified modulated carrier signal and the plurality of parallel DPA cells are configured to generate a parallel combined amplified modulated carrier signal, and wherein the combined amplified modulated carrier signal has a phase determined by the phase modulated carrier signal and the parallel combined amplified modulated carrier signal has a parallel phase determined by the another phase modulated carrier signal, such that the parallel combined amplified modulated carrier signal is 180 degrees out of phase with the combined amplified modulated carrier signal.

A27. The polar transmitter of A26, further comprising:

a balun coupled to the DPA, the balun comprising an inductive load, the inductive load being configured to receive, and to supply a differential amplified modulated carrier signal output from, (a) the combined amplified modulated carrier signal from the plurality of DPA cells and (b) the parallel combined amplified modulated carrier signal from the plurality of parallel DPA cells.

B1. A digital power amplifier, comprising:

a plurality of digital power amplifier cells, each digital power amplifier cell separately comprising the digital power amplifier cell of any of A1-A18.

C1. A method, comprising:

receiving, at a first circuit of a digital power amplifier (DPA) cell of a polar transmitter, a phase modulated carrier signal;

generating, at the first circuit, a PMOS control signal and an NMOS control signal such that the PMOS control signal and the NMOS control signal have different duty cycles;

receiving, at an amplifier circuit of the DPA cell, the amplifier circuit having an output and comprising a PMOS transistor and an NMOS transistor, a PMOS control signal at the PMOS transistor and the NMOS control signal at the NMOS transistor;

aligning, at the first circuit, the PMOS control signal and the NMOS control signal with respect to one another such that a time that the NMOS transistor and the PMOS transistor of the amplifier circuit are simultaneously conducting is minimized; and generating, at the amplifier circuit, an amplified modulated carrier signal at the output of the amplifier circuit in response to the PMOS and NMOS control signals from the first circuit.

C2. The method of C1, wherein the amplified modulated carrier signal has a duty cycle of approximately 50 percent.

C3. The method of any of C1-C2, wherein the first circuit comprises a logic circuit and a driver circuit.

D1. A digital power amplifier for a polar transmitter, comprising:

a plurality of digital power amplifier cells, each digital power amplifier cell separately configured to perform the method of any of C1-C3.

E1. A method comprising:

obtaining a phase modulated carrier signal;

applying an amplitude codeword to a set of digital power amplifier (DPA) cells to engage a subset of the set of DPA cells, each DPA cell of the set of DPA cells having an amplifier circuit having at least one PMOS transistor and at least one NMOS transistor and having an output node therebetween;

generating, based on the phase modulated carrier signal, (i) a PMOS control signal passing through an effective PMOS switching voltage and (ii) an NMOS control signal passing through an effective NMOS switching voltage that is less than the effective PMOS switching voltage, wherein generating further comprises aligning the effective PMOS switching voltage with the effective NMOS switching voltage by adjusting a duty cycle of the PMOS control signal and a duty cycle of the NMOS control signal;

applying the PMOS control signal and the NMOS control signal to each amplifier circuit of the subset of DPA cells engaged by the amplitude codeword; and outputting, at the output node, an amplified modulated carrier signal having a phase determined by the phase modulated carrier signal and having an amplitude determined by a size of the subset of DPA cells engaged by the amplitude codeword.

E2. The method of E1 wherein the duty cycle of the PMOS control signal is greater than 50 percent and the duty cycle of the NMOS control signal is less than 50 percent.

E3. The method of any of E1-E2, wherein the amplified modulated carrier signal has a duty cycle of approximately 50 percent.

F1. A polar transmitter, comprising:

a digital power amplifier (DPA), the DPA configured to perform the method of any of claims E1-E3.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Accordingly, some embodiments of the present disclosure, or portions thereof, may combine one or more processing devices with one or more software components (e.g., program code, firmware, resident software, micro-code, etc.) stored in a tangible computer-readable memory device, which in combination form a specifically configured apparatus that performs the functions as described herein. These combinations that form specially programmed devices may be generally referred to herein "modules". The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that separate processor devices and/or computing hardware platforms perform the described functions.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A polar transmitter, comprising:
a digital power amplifier (DPA) cell, comprising:
a first circuit configured to receive a phase modulated carrier signal, wherein the phase modulated carrier signal comprises a first phase modulated carrier signal and a second phase modulated carrier signal, and the first circuit is further configured to generate a PMOS control signal and an NMOS control signal such that the PMOS control signal and the NMOS control signal have different duty cycles,
wherein the first circuit of the DPA cell comprises:
a logic circuit configured to receive the phase modulated carrier signal and configured to generate a first logic signal and a second logic signal such that the first logic signal and the second logic signal have different rise and fall times relative to one another and such that a rise time of the first logic signal exceeds a rise time of the second logic signal and a fall time of the second logic signal exceeds a fall time of the first logic signal, and,
wherein the logic circuit comprises a first logic PMOS transistor and a first logic NMOS transistor each configured to receive the first phase modulated carrier signal and wherein the logic circuit further comprises a second logic PMOS transistor and a second logic NMOS transistor each configured to receive the second phase modulated carrier signal;
and
an amplifier circuit having an output and comprising a PMOS transistor and an NMOS transistor, the amplifier circuit configured to receive the PMOS control signal at the PMOS transistor and the NMOS control signal at the NMOS transistor,
wherein the first circuit is configured to align the PMOS control signal and the NMOS control signal with respect to one another such that a time that the NMOS transistor and the PMOS transistor of the amplifier circuit are simultaneously conducting is minimized, and
wherein the amplifier circuit is further configured to generate an amplified modulated carrier signal at the output of the amplifier circuit in response to the PMOS and NMOS control signals from the first circuit.

2. The polar transmitter of claim 1, wherein the amplified modulated carrier signal has a duty cycle of approximately 50 percent.

3. The polar transmitter of claim 1, wherein the first circuit is configured to align the PMOS control signal and the NMOS control signal with respect to one another such that the PMOS control signal and the NMOS control signal are operative to prevent the PMOS transistor and the NMOS transistor from conducting at the same time.

4. The polar transmitter of claim 1, wherein the PMOS control signal has a duty cycle greater than a duty cycle of the NMOS control signal.

5. The polar transmitter of claim 1, wherein the logic circuit is configured such that the first logic PMOS transistor conducts more slowly in response to the first phase modulated carrier signal than the second logic PMOS transistor conducts in response to the second phase modulated carrier signal, causing the rise time of the first logic signal to exceed the rise time of the second logic signal.

6. The polar transmitter of claim 1, wherein the logic circuit is configured such that the second logic NMOS transistor conducts more slowly in response to the second phase modulated carrier signal than the first logic NMOS transistor conducts in response to the first phase modulated carrier signal, causing the fall time of the second logic signal to exceed the fall time of the first logic signal.

7. The polar transmitter of claim 1, wherein the logic circuit comprises MOSFET transistors, and the MOSFET transistors comprise at least the first logic PMOS transistor, the first logic NMOS transistor, the second logic PMOS transistor, and the second logic NMOS transistor, and wherein at least one MOSFET transistor of the MOSFET transistors is configured to, when conducting, present a series resistance to at least one other MOSFET transistor of the MOSFET transistors of the logic circuit, wherein the series resistance when present contributes to the first logic signal and the second logic signal having different rise and fall times relative to one another.

8. The polar transmitter of claim 1, wherein the first circuit of the DPA cell further comprises:
 a driver circuit coupled to the logic circuit and configured to receive the first logic signal and the second logic signal and configured to generate the PMOS control signal and the NMOS control signal having the different duty cycles, such that a duty cycle of the PMOS control signal exceeds a duty cycle of the NMOS control signal based on the different rise and fall times of the first logic signal and the second logic signal relative to one another.

9. The polar transmitter of claim 1, further comprising: a digital power amplifier (DPA), the DPA comprising:
 a plurality of DPA cells configured to receive the phase modulated carrier signal, wherein the plurality of DPA cells comprises the DPA cell.

10. The polar transmitter of claim 9, wherein the polar transmitter shares resources with a polar receiver and wherein the plurality of DPA cells are configured to receive an enable signal for the DPA that is operative to (a) activate the DPA on when the polar transmitter is operational and transmitting and to (b) turn the DPA off when the polar receiver is operational and receiving.

11. The polar transmitter of claim 9, wherein the plurality of DPA cells are configured to receive an amplitude codeword signal that is operative to set a gain of the DPA by selectively engaging various DPA cells of the plurality of DPA cells.

12. The polar transmitter of claim 9, wherein the plurality of DPA cells, including the DPA cell, are further configured to receive a respective bit of an amplitude codeword signal to selectively engage a subset of DPA cells of the plurality of DPA cells,
 wherein the selectively engaged subset of DPA cells of the plurality of DPA cells is configured to contribute to a combined amplified modulated carrier signal that comprises, when the DPA cell is engaged by its respective bit of the amplitude codeword signal, the amplified modulated carrier signal generated by the amplifier circuit of the DPA cell.

13. The polar transmitter of claim 9, wherein the digital power amplifier (DPA) further comprises:
 a plurality of parallel DPA cells configured to receive another phase modulated carrier signal, wherein the another phase modulated carrier signal is 180 degrees out of phase with the phase modulated carrier signal.

14. The polar transmitter of claim 12, wherein the combined amplified modulated carrier signal has a phase determined by the phase modulated carrier signal and has an amplitude determined by a size of the selectively engaged subset of DPA cells of the plurality of DPA cells.

15. The polar transmitter of claim 12, wherein the combined amplified modulated carrier signal has a duty cycle of approximately 50 percent.

16. The polar transmitter of claim 13, wherein the plurality of DPA cells are configured to generate a combined amplified modulated carrier signal and the plurality of parallel DPA cells are configured to generate a parallel combined amplified modulated carrier signal, and
 wherein the combined amplified modulated carrier signal has a phase determined by the phase modulated carrier signal and the parallel combined amplified modulated carrier signal has a parallel phase determined by the another phase modulated carrier signal, such that the parallel combined amplified modulated carrier signal is 180 degrees out of phase with the combined amplified modulated carrier signal.

17. A method, comprising:
 receiving, at a logic circuit of a first circuit of a digital power amplifier (DPA) cell of a polar transmitter, a phase modulated carrier signal, wherein the phase modulated carrier signal comprises a first phase modulated carrier signal and a second phase modulated carrier signal;
 receiving, at a first logic PMOS transistor and a first logic NMOS transistor of the logic circuit, the first phase modulated carrier signal;
 receiving, at a second logic PMOS transistor and a second logic NMOS transistor of the logic circuit, the second phase modulated carrier signal;
 generating, at the logic circuit of the first circuit, a first logic signal and a second logic signal such that the first logic signal and the second logic signal have different rise and fall times relative to one another and such that a rise time of the first logic signal exceeds a rise time of the second logic signal and a fall time of the second logic signal exceeds a fall time of the first logic signal;
 generating, at the first circuit, a PMOS control signal and an NMOS control signal such that the PMOS control signal and the NMOS control signal have different duty cycles;
 receiving, at an amplifier circuit of the DPA cell, the amplifier circuit having an output and comprising a PMOS transistor and an NMOS transistor, a PMOS control signal at the PMOS transistor and the NMOS control signal at the NMOS transistor;
 aligning, at the first circuit, the PMOS control signal and the NMOS control signal with respect to one another such that a time that the NMOS transistor and the PMOS transistor of the amplifier circuit are simultaneously conducting is minimized; and
 generating, at the amplifier circuit, an amplified modulated carrier signal at the output of the amplifier circuit in response to the PMOS and NMOS control signals from the first circuit.

* * * * *